(12) United States Patent  
Iwata et al.

(10) Patent No.: US 7,176,526 B2
(45) Date of Patent: Feb. 13, 2007

(54) SEMICONDUCTOR DEVICE, METHOD FOR PRODUCING THE SAME, AND INFORMATION PROCESSING APPARATUS

(75) Inventors: Hiroshi Iwata, Nara (JP); Akihide Shibata, Nara (JP); Seizo Kakimoto, Nara (JP); Kouichiro Adachi, Tenri (JP); Masayuki Nakano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 169 days.

(21) Appl. No.: 10/899,183

(22) Filed: Jul. 27, 2004

(65) Prior Publication Data

US 2004/0262650 A1    Dec. 30, 2004

Related U.S. Application Data

(62) Division of application No. 10/149,255, filed as application No. PCT/JP00/09447 on Dec. 28, 2000, now Pat. No. 6,825,528.

(30) Foreign Application Priority Data

Jan. 7, 2000    (JP) ................... 2000-1190

(51) Int. Cl.
*H01L 29/78*    (2006.01)
*H01L 21/336*   (2006.01)

(52) U.S. Cl. ............... 257/346; 257/E29.255; 438/300

(58) Field of Classification Search ......... 257/336, 257/408; 438/2, 151, 197, 300
See application file for complete search history.

(56) References Cited

U.S. PATENT DOCUMENTS 5,869,375 A * 2/1999 Choi et al. ............ 438/300
5,902,125 A * 5/1999 Wu .................... 438/300
5,949,105 A   9/1999 Moslehi
6,455,366 B1 * 9/2002 Lee .................... 438/241
6,906,382 B2 * 6/2005 Nakabayashi ........... 257/336

FOREIGN PATENT DOCUMENTS

| EP | 817392 A   | 1/1998 |
|----|------------|--------|
| EP | 820096 A   | 1/1998 |
| EP | 887843 A   | 1/2000 |
| EP | 000969516 A2 | 1/2000 |
| JP | 61-196577 A | 8/1986 |
| JP | 63-179576 A | 7/1988 |
| JP | 3-145343 A | 6/1991 |
| JP | 10-335660 A | 12/1998 |
| WO | 00/01015 A | 1/2000 |

* cited by examiner

Primary Examiner—Stephen W. Smoot
(74) Attorney, Agent, or Firm—Birch, Stewart, Kolasch & Birch, LLP

(57) ABSTRACT

A semiconductor device 1910 comprises a semiconductor substrate 100 including an isolation region 101 and an active region 102, a gate electrode 104 provided on the active region 102 via a gate insulating film 103, part of a side of the gate electrode 104 being covered with a gate electrode side wall insulating film 105, and a source region 106 and a drain region 106 provided on opposite sides of the gate electrode 104 via the gate electrode side wall insulating film 105. At least one of the source region 106 and the drain region 106 has a second surface for contacting a contact conductor. The second surface is tilted with respect to a first surface A–A'. An angle between the second surface and a surface of the isolation region is 80 degrees or less.

15 Claims, 60 Drawing Sheets

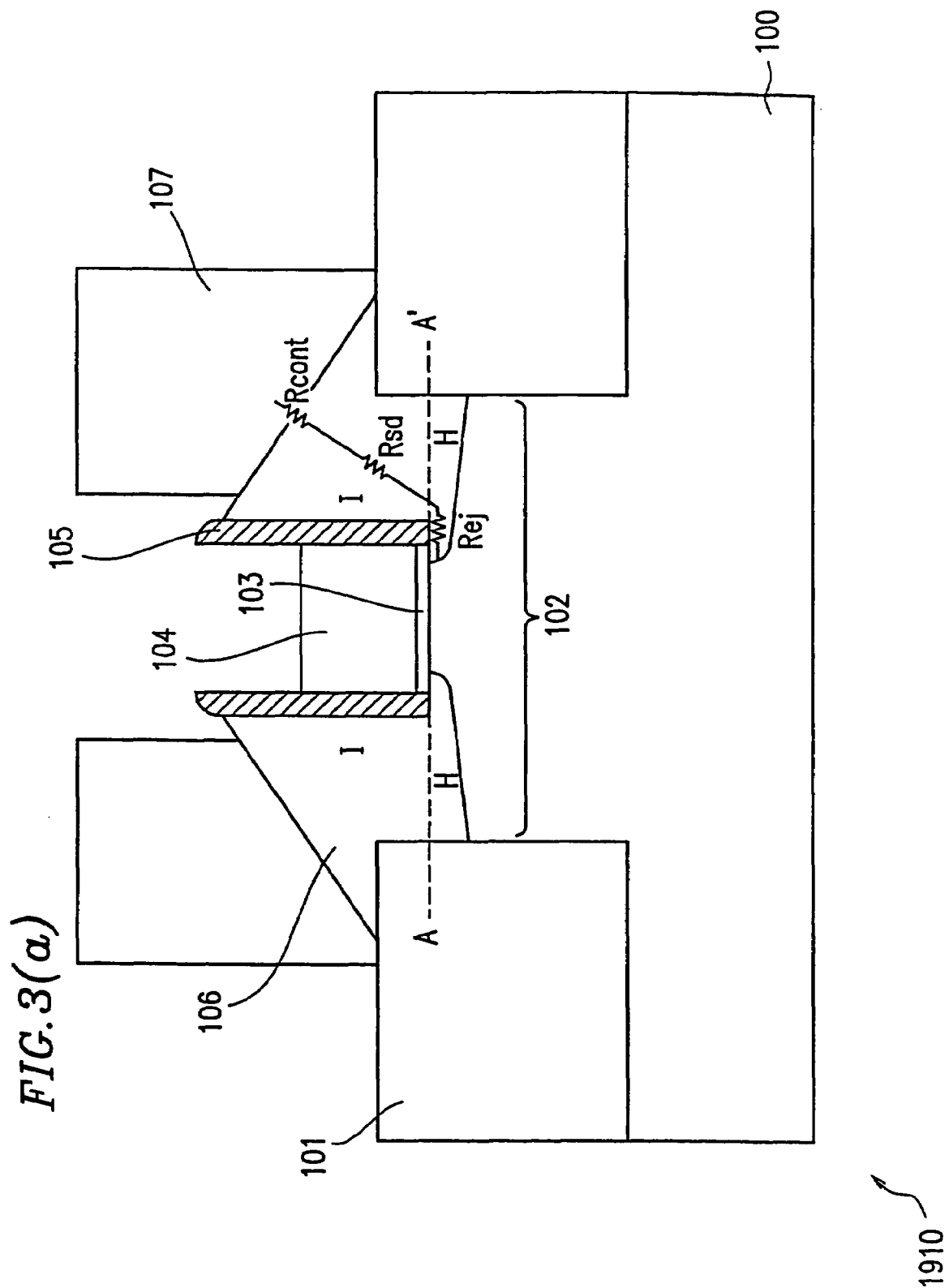

No offset

Example of offset

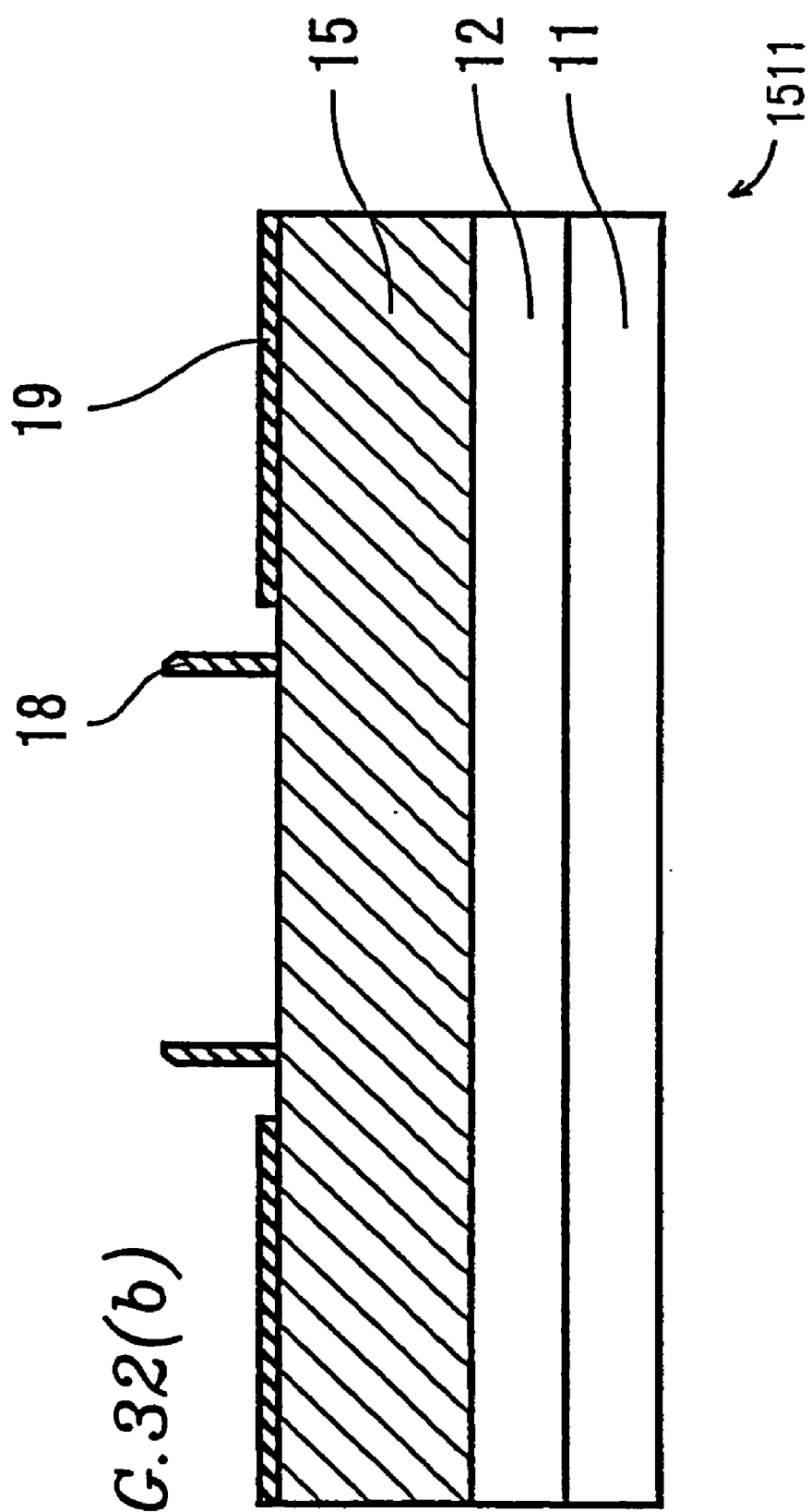

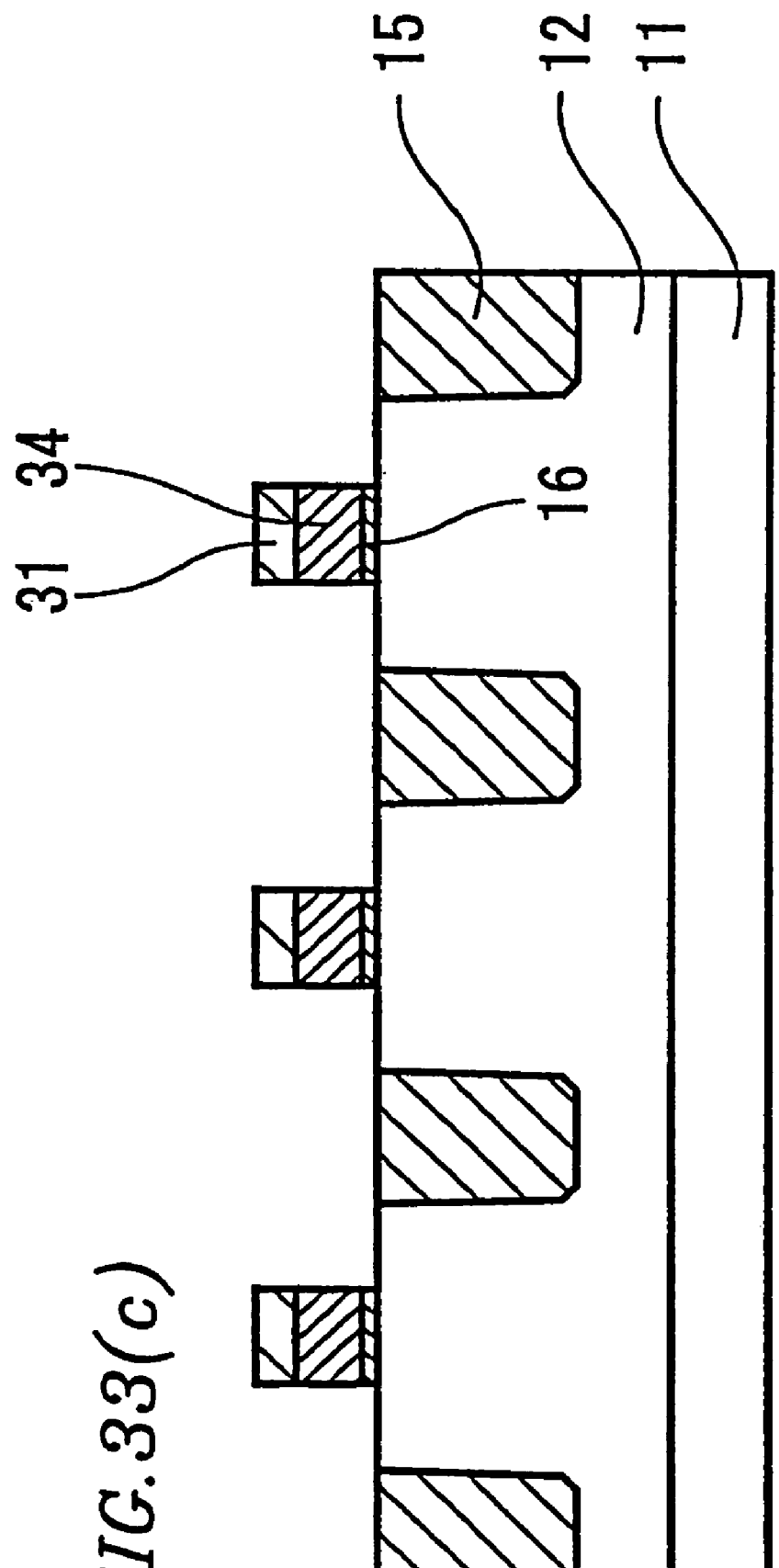

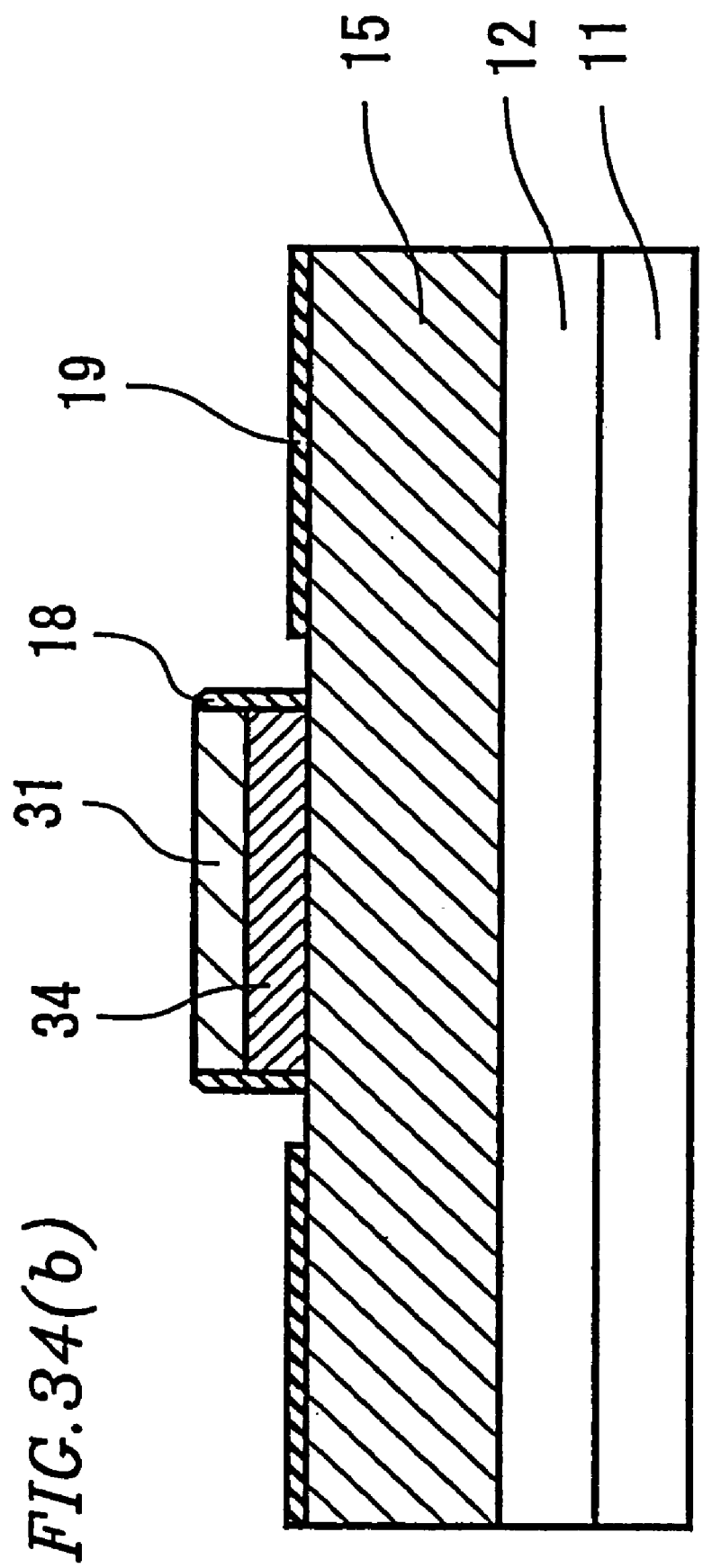

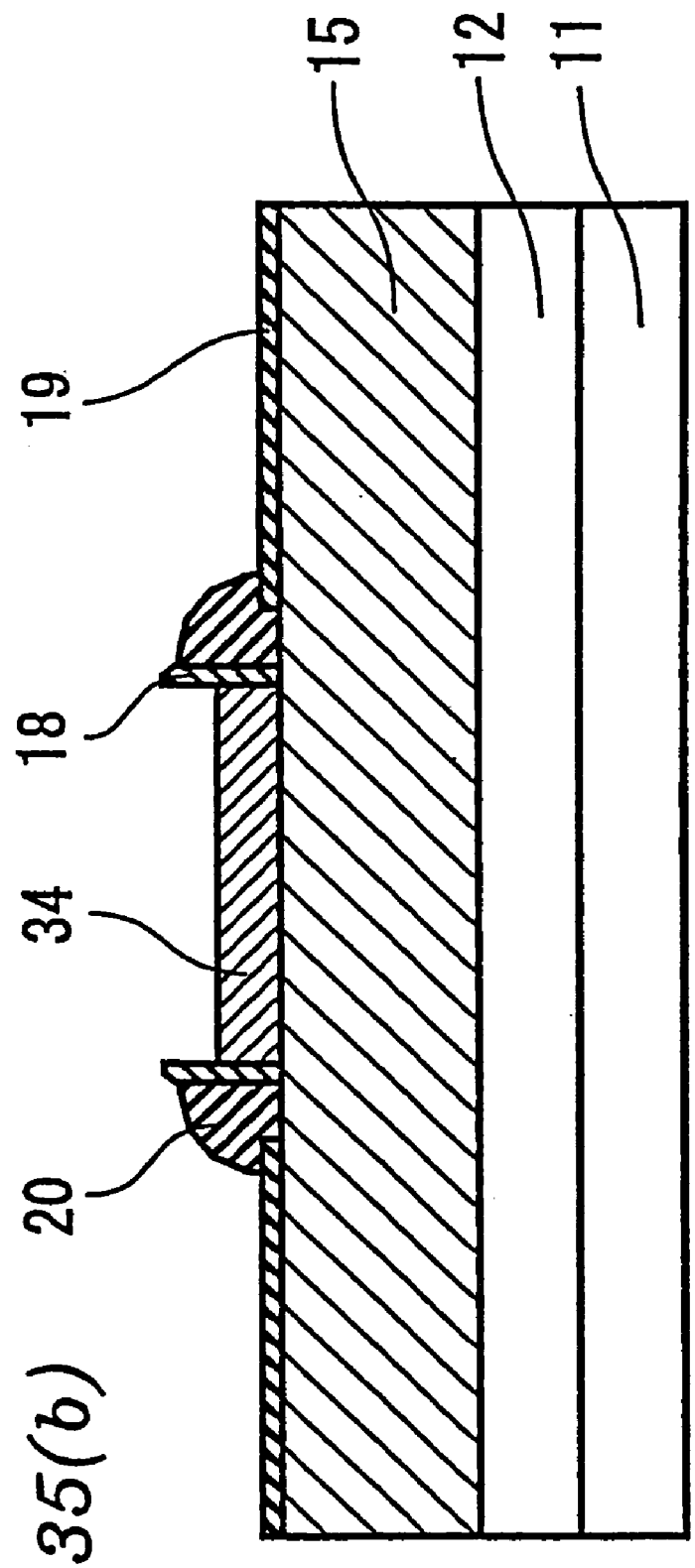

(a)

(b)

(c)

(a)

(a)

(b)

(c)

(d)

(e)

US 7,176,526 B2

SEMICONDUCTOR DEVICE, METHOD FOR PRODUCING THE SAME, AND INFORMATION PROCESSING APPARATUS

This application is a Divisional of application Ser. No. 10/149,255 filed on Aug. 12, 2002 now U.S. Pat. No. 6,825,528 and for which priority is claimed under 35 U.S.C. § 120. application Ser. No. 10/149,255 is the national phase of PCT International Application No. PCT/JP00/09447 filed on Dec. 28, 2000 under 35 U.S.C. § 371. The entire contents of each of the above-identified applications are hereby incorporated by reference. This Application also claims priority of Application Ser. No. 2000-1190 filed in Japan on Jan. 7, 2000 under 35 U.S.C. § 119.

TECHNICAL FIELD

The present invention relates to a semiconductor device, and more particularly, to a semiconductor device including a source/drain region having a reduced area and a reduced parasitic capacitance and parasitic resistance. The present invention also relates to a method for producing the same, and an information processing apparatus.

BACKGROUND ART

Recently, the integration level of a semiconductor device is becoming higher and higher. There is an increasing demand for even smaller elements. In the case of a typical insulated gate type field effect transistor, as the size thereof is made smaller, the following problems become more significant: variations in threshold voltage due to variations in gate length caused upon manufacturing; an increase in off-leakage current due to degradation of sub-threshold characteristics; degradation of transistor characteristics due to a short channel effect such as punch-through.

There are known methods for solving the above-described problems which become evident due to size reduction. In one of the known methods, the junction of the source/drain region adjacent to the channel region of a transistor is formed at a shallow level. The term "source/drain region" means a source or drain region, or source and drain regions. To form the shallow junction, the source/drain regions are provided on opposite sides of a gate electrode via a gate electrode side wall insulating film, and are each accumulated to a level higher than a channel region (i.e., a surface of a semiconductor substrate under the gate electrode where the surface will be reversed by electric field of the gate electrode). Such source/drain regions are referred to as accumulated diffusion layer.

FIGS. 43(a) to (c) are diagrams showing the steps of producing a conventional accumulated diffusion layer. Hereinafter, the steps of producing a conventional accumulated diffusion layer will be described with reference to FIGS. 43(a) to (c).

As shown in FIG. 43(a), a surface of a semiconductor wafer 1001 includes an isolation region 1002 and an active region 1003. A silicon oxide film 1042 is provided in the isolation region 1002. In the active region 1003, the silicon substrate 1001 (semiconductor wafer) is exposed.

In the production steps of a conventional accumulated diffusion layer, initially, a gate electrode 1005 is formed on the active region 1003 via a gate insulating film 1004. The top and the side walls of the gate electrode 1005 are covered with an insulating film 1006.

Thereafter, as shown in FIG. 43(b), a silicon film 1007 is grown by a selective epitaxial growth method only on an exposed region (active region 1003) of the silicon substrate 1001. The silicon film 1007 will become a semiconductor accumulated diffusion layer and serve as a source/drain region. The selective epitaxial growth method is disclosed in Japanese Laid-open Publication No. 61-196577, for example.

Thereafter, as shown in FIG. 43(c), an interlayer insulating film 1008 is provided. A conductor 1010 formed on the interlayer insulating film 1008 is connected to the silicon film 1007 (source/drain region) via a contact conductor 1009. The silicon film 1007 is made of epitaxial silicon, polycrystalline silicon, or the like.

In the conventional technique described with reference to FIGS. 43(a) to (c), after the silicon film 1007 has been provided to a level higher than the channel region, impurity ions are implanted into the silicon film 1007 in the vicinity of the channel region to form a source/drain region.

The impurity ions are implanted into the silicon film 1007 which has been accumulated to a level higher than the channel region, so that the junction depth of the impurity diffused layer of the source/drain region can be made shallow. Thereby, the short channel effect can be effectively prevented.

As shown in FIG. 43(c), a contact hole for the contact conductor 1009 is provided in the silicon film 1007 (source/drain region) which is positioned between the gate electrode 1005 and the isolation region 1002. A length Ld along the gate length direction (perpendicular to the longitudinal direction of the gate electrode) of the source/drain regions 1007 cannot be less than (an alignment margin between the gate electrode and the contact)+(a width along the gate length direction of the contact hole)+(an alignment margin between the contact and the source/drain region).

Therefore, there is a problem with the semiconductor device of FIG. 43(c) in that it is difficult to reduce the planer size of the source/drain region.

Japanese Laid-open publication No. 10-335660 discloses a method which provides a solution to the above-described problem.

FIG. 44 is a diagram showing an insulating gate type field effect transistor disclosed in Japanese Laid-open publication No. 10-335660.

In the insulating gate type field effect transistor, isolation insulating regions 2002 are disposed below a gate electrode 2005 in a semiconductor substrate 2001. A region between the isolation insulating regions 2002 is called a device region. A distance between a side of the gate electrode 2005 and a point of one of the isolation insulating regions 2002 contacting a portion of the device region in which two diffusion layers 2012 and 2013 are provided is less than or equal to the height of the gate electrode 2005. A distance between an edge at the gate electrode side and an edge at the isolation insulating region side of the upper diffusion layer 2012 is greater than or equal to the height of the gate electrode 2005. The edge at the isolation insulating region side of the upper diffusion layer 2012 is disposed on the isolation insulating region 2002.

FIGS. 45(a) to (e) are diagrams showing a production process of the insulating gate type field effect transistor disclosed in Japanese Laid-open publication No. 10-335660.

FIG. 45(a) shows a structure resulting from the following steps in the production process of the insulating gate type field effect transistor provided in a semiconductor device. An isolation insulating region 3002 is formed in a first conductivity semiconductor substrate 3001, providing a device region surrounded by the region 3002. In this case, a distance between a side of a gate electrode 3005 which will be provided in the device region and a point of the isolation insulating region 3002 contacting a portion of the device region in which two diffusion layers will be provided is less than or equal to the height of the gate electrode 3005. A well region 3014 is formed in the device region. A gate insulating film 3003 is formed on the device region. The gate electrode 3005 is formed on the gate insulating film 3003. Second conductivity impurities are implanted into the device region by an ion implantation method using the gate electrode 3005 as a mask, the second conductivity being different from the first conductivity. Thereby, a shallow diffusion layer 3013 (lower diffusion layer) is provided in the vicinity of a surface of the device region.

FIG. 45(b) shows a structure resulting from the following steps. An oxide film is deposited on the gate insulating film 3003 by a chemical vapor growth method. Unwanted portions of the oxide film and the gate insulating film 3003 are removed by anisotropic etching. An insulating gate sidewall 3007 is formed at a side of the gate electrode 3005 in a self alignment way.

FIG. 45(c) shows a structure resulting from the following steps. A polycrystalline silicon film 3015 is deposited to the same height as that of the gate electrode 3005.

FIG. 45(d) shows a structure resulting from the following steps. An upper diffusion layer 3012 is provided. In this case, a distance between an edge at the gate electrode side and an edge at the isolation insulating region side of the upper diffusion layer 3012 is greater than or equal to the height of the gate electrode 3005. The edge at the isolation insulating region side of the upper diffusion layer 3012 is disposed on the isolation insulating region 3002.

FIG. 45(e) shows a structure resulting from the following steps. An insulating film 3009 is deposited and provided as an interlayer film. A contact hole is formed in the interlayer film. An electrode metal 3010 is provided in the contact hole so that at least a portion of an end of the electrode metal 3010 is connected to the upper diffusion layer 3012.

In the technique disclosed in Japanese Laid-open Publication No. 10-335660, the distance between a side of the gate electrode 2005 and a point of the isolation insulating region 2002 contacting a portion of the device region in which two diffusion layers 2012 and 2013 (FIG. 44) are provided is less than or equal to the height of the gate electrode 2005. The minimum of such a distance is determined by an alignment margin between the isolation region and the gate electrode, and the thickness of the gate electrode side wall insulating film. The height of the gate electrode is designed to be greater than or equal to the distance.

The distance between a side of the gate electrode 2005 and a point of the isolation insulating region 2002 contacting a portion of the device region, in which two diffusion layers 2012 and 2013 are provided, greatly depends on the processing accuracy of an apparatus used for manufacture. In an embodiment of the conventional technique disclosed in Japanese Laid-open Publication No. 10-335660, the gate electrode is processed into a width of 100 nm. In general, the width of the gate electrode (gate length) is designed to be equal to the minimum processable size. Accordingly, it is believed that a semiconductor device according to the embodiment of this conventional technique is produced using a apparatus performance of 100 nm rule. A typical photolithography apparatus has an alignment accuracy which is one third of the minimum processable size. Therefore, an alignment margin for the isolation region requires 33 nm or more. Further, in the embodiment of this conventional technique, the thickness of the gate electrode side wall insulating film is 50 nm. A margin having a total of 83 nm is required. The distance between a side of the gate electrode 2005 and a point of the isolation insulating region 2002 contacting a portion of the device region in which two diffusion layers 2012 and 2013 are provided is about 75 nm in a state in which the alignment of the gate electrode to the isolation insulating region is perfect, as described in the embodiment of the conventional technique. However, when the alignment includes a deviation of 33 nm, the distance falls within the range of 42 nm to 108 nm. In view of this, a margin of alignment is secured in the specific values in the embodiment of this conventional technique. It is thus believed that 350 nm and 150 nm values are valid values for the distance between the isolation regions and the height of the gate, respectively.

As described in Japanese Laid-open Publication No. 10-335660, there is a known method in which introduction of impurities into the gate electrode made of a polycrystalline silicon film, and introduction of impurities into the source/drain region by ion implantation are simultaneously conducted for the purpose of simplifying the process. When a voltage is applied to the gate electrode, if the difference in work function between the gate electrode and an electrode (in this case, the semiconductor substrate) opposing the gate electrode via the gate oxide film causes the energy band to be bent in a region where the gate electrode contacts the gate oxide film (i.e., depletion occurs in the gate electrode), the gate insulating film capacitance is connected in series to the gate electrode depletion layer capacitance. In this case, the voltage applied to the gate electrode is divided and applied to the gate insulating film capacitance and the gate electrode depletion layer capacitance. Thus, the performance of the transistor is reduced. To avoid the depletion in the gate electrode, impurities need to be introduced into the gate electrode along the height direction thereof so as to obtain a high concentration of at least $1\times10^{20}/cm^3$ or more. Therefore, a sufficient thermal processing is generally required after implantation of the impurity ions having such a high concentration. In the process of the thermal processing, the impurities implanted into the source/drain region are diffused, as is the impurities implanted into the gate electrode.

When the gate height is great, if the impurities are implanted in a high concentration into the gate electrode so as not to cause depletion, the impurities implanted into the source/drain region are diffused into the semiconductor substrate in the process of the thermal processing, thereby forming an adversely deep diffusion layer having a high concentration of the impurities. Such a problem is not described in Japanese Laid-open Publication No. 10-335660.

As described in FIG. 44, Japanese Laid-open Publication No. 10-335660 also discloses a technique in which a vertical step portion is provided in a region where the source/drain region (upper diffusion layer 2012) contacts the isolation insulating region 2002. The contact hole is provided on the step. When etching is used to provide the contact hole, the selectivity of the interlayer insulating film to the etching stop film (etching selectivity ratio) is lowered. When the etching selectivity ratio is lowered in the formation of the contact hole in the interlayer insulating film, the polycrystalline silicon film which will be the source/drain region is dug or the isolation region is dug. Thereby, a contact resistance between the electrode metal 2010 and the source/drain region (upper diffusion layer 2012) are adversely increased.

Such a problem is not described in Japanese Laid-open Publication No. 10-335660.

The present invention is provided to solve the above-described problems. An objective of the present invention is to provide a semiconductor device having a small planer size of a source/drain region, and a production method thereof. Further, another object of the present invention is to provide a semiconductor device in which a high integration level is obtained by reducing a margin between each gate electrode. Furthermore, a yet still another object of the present invention is to provide an information processing apparatus having a small level of power consumption.

DISCLOSURE OF THE INVENTION

A semiconductor device according to the present invention comprises: a semiconductor substrate comprising an isolation region and an active region; a gate electrode provided on the active region via a gate insulating film, at least part of a side of the gate being covered with a gate electrode side wall insulating film; and a source region and a drain region provided on respective sides of the gate electrode via the gate electrode sidewall insulating film. The source region includes a first source region provided above a first surface where the active region contacts with the gate insulating film, and a second source region provided below the first surface. The drain region includes a first drain region provided above the first surface, and a second drain region provided below the first surface. At least one of the source and drain regions has a second surface for contacting a contact conductor, the second surface being tilted with respect to the first surface. At least part of the first source region is provided on the isolation region. At least part of the first drain region is provided on the isolation region. An angle between the second surface and a surface of the isolation region is 80 degrees or less. Thereby, the above-described objective is achieved.

In a cross-sectional view along a gate length direction, the second surface may be in a convex shape, and a height of the second surface from the first surface may be monotonically decreased in a direction leaving from the gate electrode.

In a cross-sectional view along a gate length direction, the second surface may be in a concave shape, and a height of the second surface from the first surface may be monotonically decreased in a direction leaving the gate electrode.

The second surface may be rough.

In a cross-sectional view along a gate length direction: a depth of a junction between the second source region and the semiconductor substrate from the first surface may be monotonically increased in a direction leaving the gate electrode; and a depth of a junction between the second drain region and the semiconductor substrate from the first surface may be monotonically increased in a direction leaving the gate electrode.

In a cross-sectional view along a gate length direction, at least one of a width of the first source region in the gate length direction and a width of the first drain region in the gate length direction may be greater than or equal to the sum of a width of the gate electrode side wall insulating film in the gate length direction and a width of the gate electrode in the gate length direction.

The surface of the isolation region may be above the first surface.

In a cross-sectional view along a gate length direction, a shortest distance between an edge of the gate electrode side wall insulating film and the isolation region may be smaller than a width of the gate electrode in the gate length direction.

In a cross-sectional view along a gate length direction, a shortest distance between an edge of the gate electrode and the isolation region may be greater than a height of the gate electrode.

In a cross-sectional view along a gate length direction, a shortest distance between an edge of the gate electrode side wall insulating film and the isolation region may be smaller than a height of the gate electrode side wall insulating film.

In a cross-sectional view along a gate length direction, a distance between the first surface and an upper surface of the gate electrode is smaller than at least one of a distance between the first surface and a point where a surface of the first source region contacts the gate electrode side wall insulating film and a distance between the first surface and a point where a surface of the first drain region contacts the gate electrode side wall insulating film.

In a cross-sectional view along a gate length direction: a depth of a junction between the second source region and the semiconductor substrate from the first surface may be 0.8 to 2 times a width of the gate electrode side wall insulating film in the gate length direction; and a depth of a junction between the second drain region and the semiconductor substrate from the first surface may be 0.8 to 2 times a width of the gate electrode sidewall insulating film in the gate length direction.

The first drain region may include an impurity for determining a conductivity of the first drain region, an impurity concentration of at least part of the first drain region being more than $1\times10^{20}/cm^3$. The second drain region may include an impurity for determining a conductivity of the second drain region, an impurity concentration of at least part of the second drain region being more than $1\times10^{20}/cm^3$. The first source region may include an impurity for determining a conductivity of the first source region, an impurity concentration of at least part of the first source region being more than $1\times10^{20}/cm^3$. The second source region may include an impurity for determining a conductivity of the second source region, an impurity concentration of at least part of the second source region being more than $1\times10^{20}/cm^3$.

At least part of the first source region may be made of a polycrystalline silicon film. At least part of the first drain region is made of a polycrystalline silicon film.

At least part of the first source region may be made of a silicon-germanium film. At least part of the first drain region may be made of a silicon-germanium film.

In a cross-sectional view along a gate length direction, a grain size of the polycrystalline silicon film may be smaller than a shortest distance between an edge of the gate electrode side wall insulating film and the isolation region.

In a cross-sectional view along a gate length direction, a grain size of the silicon-germanium film may be smaller than a shortest distance between an edge of the gate electrode side wall insulating film and the isolation region.

At least one of the second source region and the second drain region may be produced by the steps of: implanting an impurity into a layer to be the first source region or the first drain region, the impurity causing the layer to have conductivity opposite to the conductivity of the active region; and diffusing the impurity from the layer to be the first source region or the first drain region, into the active region.

A diffusion coefficient of at least one of the layer to be the first source region and the layer to be the first drain region may be greater than a diffusion coefficient of the semiconductor substrate.

Another semiconductor device according to the present invention comprises a semiconductor substrate and a plurality of field effect transistors provided on the semiconductor substrate. Each of the plurality of field effect transistors includes: a gate electrode provided on the semiconductor substrate; a gate electrode side wall insulating film provided at a side of the gate electrode; and a conductive film to be a source region or a drain region, provided at a side of the gate electrode via the gate electrode side wall insulating film; the gate electrode of each of the plurality of field effect transistor is produced by the step of dividing a first non-insulating film into a plurality of regions; and the conductive film of each of the plurality of field effect transistor is produced by the step of dividing a second non-insulating film into a plurality of regions. Thereby, the above-described objective is achieved.

Another semiconductor device according to the present invention comprises a semiconductor substrate and a plurality of field effect transistors provided on the semiconductor substrate. Each of the plurality of field effect transistors includes: a well region provided on the semiconductor substrate; agate electrode provided on the well region via a gate insulating film; a gate electrode side wall insulating film provided at a side of the gate electrode; and a conductive film to be a source region or a drain region, provided at a side of the gate electrode via the gate electrode side wall insulating film. The gate electrode of each of the plurality of field effect transistor is produced by the step of dividing a first non-insulating film into a plurality of regions. The conductive film of each of the plurality of field effect transistor is produced by the step of dividing a second non-insulating film into a plurality of regions. Thereby, the above-described objective is achieved.

At least one of the plurality of field effect transistors may further comprise a terminal provided on the well region for setting the potential of the well region. The semiconductor device may further comprise a voltage generation circuit connected to the terminal; and the voltage generator circuit changes the potential of the well region depending on whether the at least one of the plurality of field effect transistors is in an active state or a standby state.

Another semiconductor device according to the present invention comprises a semiconductor substrate and a plurality of field effect transistors provided on the semiconductor substrate. Each of the plurality of field effect transistors includes: an isolation region; a deep well region of a first conductivity; a shallow well region of a second conductivity provided in the deep well region, the second conductivity being opposite to the first conductivity; a gate electrode provided on the shallow well region via a gate insulating film; a gate electrode side wall insulating film provided at a side of the gate electrode; and a conductive film to be a source region or a drain region, provided at a side of the gate electrode via the gate electrode side wall insulating film. The gate electrode of each of the plurality of field effect transistor is produced by the step of dividing a first non-insulating film into a plurality of regions. The conductive film of each of the plurality of field effect transistor is produced by the step of dividing a second non-insulating film into a plurality of regions. At least one of the plurality of field effect transistors is a dynamic threshold transistor in which the shallow well region of the second conductivity is electrically connected to the gate electrode. The shallow well region of the dynamic threshold transistor is electrically isolated from the shallow well regions of the other field effect transistors via the isolation region and the deep well region. Thereby, the above-described objective is achieved.

A method for producing a semiconductor device according to the present invention, comprises the steps of: forming a first non-insulating film pattern by patterning a first non-insulating film to a desired pattern on a semiconductor substrate; forming a side wall insulting film at a side of the first non-insulting film pattern; depositing a second non-insulating film; forming a sidewall consisting of the second non-insulating film at a side of the first non-insulting film via the side wall insulating film by an isotropic etching until the second non-insulating film is removed from an upper portion of the first non-insulating film pattern; and forming a layer to be a gate electrode, a layer to be a source region, and a layer to be a drain region by patterning the first non-insulating film pattern and the sidewall by selectively etching with respect to the side wall insulating film.

The method may further comprise the step of simultaneously implanting a donor or an acceptor into the layer to be a gate electrode, the layer to be a source region, and the layer to be a drain region.

The selective etching with respect to the side wall insulating film may be an anisotropic etching including an isotropic component.

In the selective etching with respect to the side wall insulating film, an isotropic etching may be conducted after an anisotropic etching.

A diffusion coefficient of at least one of the layer to be a source region and the layer to be a drain region may be greater than a diffusion coefficient of the semiconductor substrate.

Another method for producing a semiconductor device according to the present invention, comprises the steps of: attaching a first insulating film on a first non-insulating film provided on a semiconductor substrate; forming a first non-insulating film pattern and a first insulating film pattern by patterning a first non-insulating film and the first insulating film to a desired pattern; forming a side wall insulting film at a side of the first insulting film pattern; depositing a second non-insulating film; forming a side wall consisting of the second non-insulating film at the sides of the first non-insulting film pattern and the first insulating film pattern by an isotropic etching until the second non-insulating film is removed from an upper portion of the first non-insulating film pattern; exposing a surface of the first non-insulating film pattern by selectively removing the first insulting film pattern; forming a layer to be a gate electrode, a layer to be a source region, and a layer to be a drain region by patterning the first non-insulating film pattern and the side wall by selectively etching with respect to the side wall insulating film.

The method may further comprise the step of simultaneously implanting a donor or an acceptor into the layer to be a gate electrode, the layer to be a source region, and the layer to be a drain region.

The selective etching with respect to the side wall insulating film may be an anisotropic etching including an isotropic component.

In the selective etching with respect to the side wall insulating film, an isotropic etching may be conducted after an anisotropic etching.

A diffusion coefficient of at least one of the layer to be a source region and the layer to be a drain region may be greater than a diffusion coefficient of the semiconductor substrate.

An information processing apparatus comprises a display device and an operation device for controlling the display device, the apparatus being able to be driven by a battery. The operation device comprises a circuit including the semiconductor device of the present invention. Thereby, the above-described objective is achieved.

BRIEF DESCRIPTION OF THE DRAWINGS

FIG. 22(*b*) is a top plan view showing a semiconductor substrate of a semiconductor device according to Example 3 of the present invention.

BEST MODE FOR CARRYING OUT THE INVENTION

Hereinafter, embodiments of the present invention will be described with reference to the accompanying drawings. The term "first conductivity" herein means P-type or N-type. The term "second conductivity" herein means N-type when the first conductivity is P-type, or P-type when the first conductivity is N-type. A semiconductor substrate available for the semiconductor apparatus of the present invention is not particularly limited, and is preferably a silicon substrate. Further, the semiconductor substrate may be either of a P-type or N-type conductivity.

Example 1

Figure 1:
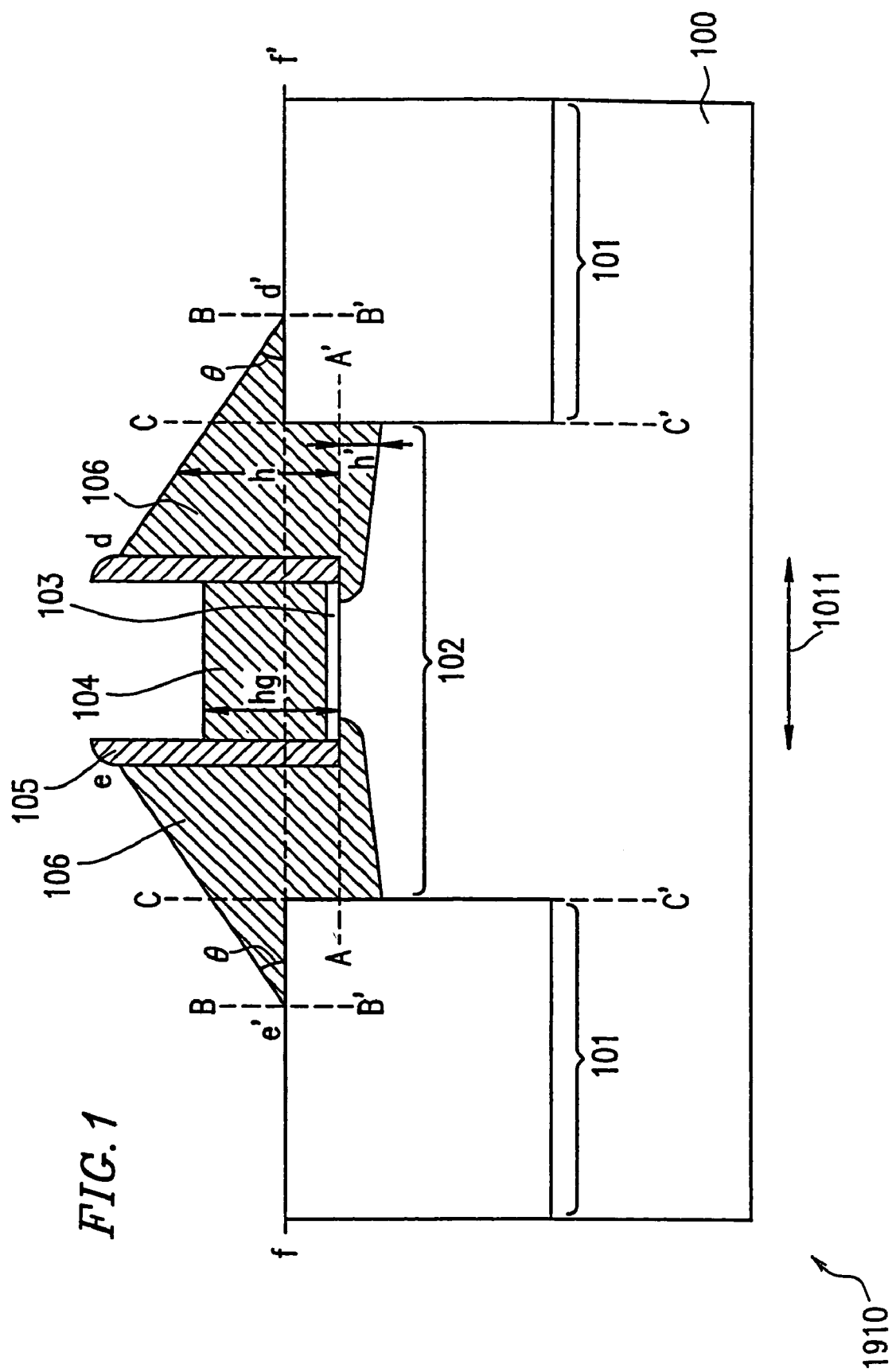
FIG. 1 is a vertical cross-sectional view of a semiconductor device 1910 according to Example 1 of the present invention, taken along a gate length direction.

FIG. 1 is a cross-sectional view of a semiconductor device 1910 according to Example 1 of the present invention, taken along a vertical plane along a gate length direction. A gate length direction of a gate electrode 104 is indicated by an double-headed arrow 1011 in FIG. 1.

A semiconductor substrate 100 of the semiconductor device 1910 includes an isolation region 101 and an active region 102 surrounded by the isolation region 101. The semiconductor device 1910 is an MIS type semiconductor device provided on the active region 102. The semiconductor device 1910 includes the isolation region 101, the active region 102, a gate oxide film 103 (gate insulating film), a gate electrode 104, a gate electrode side wall insulating film 105, and a source/drain region 106.

The source/drain region 106 is adjacent to the gate electrode side wall insulating film 105. Most of the source/drain region 106 is above an active region surface A–A' which is an interface between the gate oxide film 103 and the active region 102.

Specifically, the shape of the source/drain region 106 is such that the height h of a surface of the source/drain region 106 from the active region surface A–A' is increased from the isolation region 101 toward the gate electrode 104 in the cross-section of the semiconductor device 1910, taken along a longitudinal direction of the gate electrode 104. Further, a boundary (c–c') between the active region 102 and the isolation region 101 is present between a side of the gate electrode 104 and an edge (indicated by line B–B') of the source/drain region 106. As shown in FIG. 1, the three regions (i.e., the gate electrode 104 electrically insulated from the active region 102 and two source/drain regions) cover part of the isolation region 101, and the active region 102 so as to bury the step between the isolation region 101 and the active region 102. Further, the angles between the surfaces of the source/drain region 106 (indicated by lines d–d' and e–e') and a surface (indicated by line f–f') of the isolation region 101 are each 80 degrees or less.

In such a structure, no vertical steps occur between the gate electrode 104 and the source/drain region 106 provided on opposite sides of the gate electrode 104. Therefore, a reduction in yield due to contact resistance is prevented. Preferably, if an angle between the surface (d–d' and e–e') of the source/drain region 106 and the surface f–f' of the isolation region 101 is 60 degrees or less, the yield is further improved against the contact resistance.

Further, the surface f–f' of the isolation region 101 may be provided above the first surface where the active region contacts the gate oxide film, i.e., the active region surface (indicated by line A–A' in FIG. 1). In this case, in a cross-sectional view in a gate length direction, the angle (contact angle $\theta$) between the surface of the source/drain region 106 and the surface of the isolation region 101 can be further reduced. The contact angle $\theta$ is preferably 70 degrees or less, and more preferably 60 degrees or less.

If a contact angle $\theta$ is small, the semiconductor device 1910 has a considerably smooth surface. Therefore, various problems caused by a step occurring upon manufacture of the semiconductor device can be solved. For example, in the semiconductor device 1910, it is easy to obtain an interlayer insulating film (not shown) having an even surface. Further, the step between the isolation region 101 and the active layer 102 is buried with the source/drain region 106, thereby preventing light reflection by the step. This favors lithography. Furthermore, the active region 102 is not exposed after the source/drain region 106 has been formed. Therefore, no damage occurs in the active region 102 upon etching or ion implantation.

The height of the exposed surface (d–d') of the source/drain region 106 from the surface (A–A') of the active region 102 is increased toward the gate electrode 104. Therefore, the depth h' (junction depth) of the source/drain region 106 below the surface (A–A') of the active region 102, which is formed by doping impurities into the source/drain region 106 using ion implantation, is monotonically increased in a direction leaving the gate electrode 104. The depth h' is defined as a depth from the surface (A–A') of the active region 102 to the junction between the semiconductor substrate 100 (a well region having a conductivity opposite to that of the source/drain region 106 in the case of a typical CMOS) and the source/drain region 106.

As described above, the structure of the semiconductor device 1910 is such that the junction depth is shallow in the vicinity of the edge of the gate electrode having a direct influence on the short channel effect while being deep in the vicinity of the isolation region not having a direct influence on the short channel effect. Therefore, the parasitic resistance of the source/drain region can be reduced while the short channel effect is suppressed.

The diffusion rate (diffusion coefficient) of impurities in a material forming the source/drain region 106 above surface (A–A') of the active region 102 is different from the diffusion rate (diffusion coefficient) of the impurities in the semiconductor substrate below surface (A–A') of the active region 102. Therefore, the surface (d–d' and e–e') of the source/drain region 106 each have a different shape from the boundary surface of the junction. However, the junction depth is dependent on the shape of the surface (d–d' and e–e') of the source/drain region 106. Therefore, the junction depth h' is shallower toward the gate electrode 104.

Suppression of the short channel effect of a transistor requires a sufficient shallow depth of a junction between the source/drain region and the semiconductor device in the vicinity of the channel region, from the surface (A–A') of the active region 102. To this end, the height of an upper portion of the gate electrode 104 from the surface (A–A') of the active region 102 is preferably lower than the height h of the surface of the source/drain region 106 at a position adjacent to the gate electrode side wall insulating film 105. The reason will be described below.

For example, a polycrystalline silicon film (or alternatively, a multi-layer film including a polycrystalline silicon film, a refractory metal film and/or a refractory metal silicide film or the like) is used as a material for the gate electrode 104, the impurity implantation of the gate electrode 104 is simultaneously conducted along with the impurity implantation of the source/drain region 106. The gate electrode 104 needs to have an impurity concentration of $1 \times 10^{20}/cm^3$ or more at its region contacting the gate oxide film 103 in order to avoid depletion from occurring in the gate electrode 104. After such a high concentration of impurity ions have been implanted, a thermal processing is sufficiently performed. In the thermal processing, the impurities implanted in the source/drain region 106 as well as the impurities implanted in the gate electrode 104 are diffused.

When the height hg of the upper portion of the gate electrode 104 from the surface (A–A') of the active region 102 is lower than the height h of the source/drain region 106 from the surface (A–A') of the active region 102 at a position adjacent to the gate electrode sidewall insulating film 105, the junction depth h' of the source/drain region 106 is not deep even if the impurities are implanted so as to sufficiently increase the impurity concentration of the gate electrode 104 at a region adjacent to the gate oxide film 103. Therefore, the junction depth of a source or drain can be sufficiently shallow compared with the depth of the transistor channel region in the vicinity of the gate electrode 104, whereby the short channel effect due to miniaturization can thus be suppressed.

Figure 2:
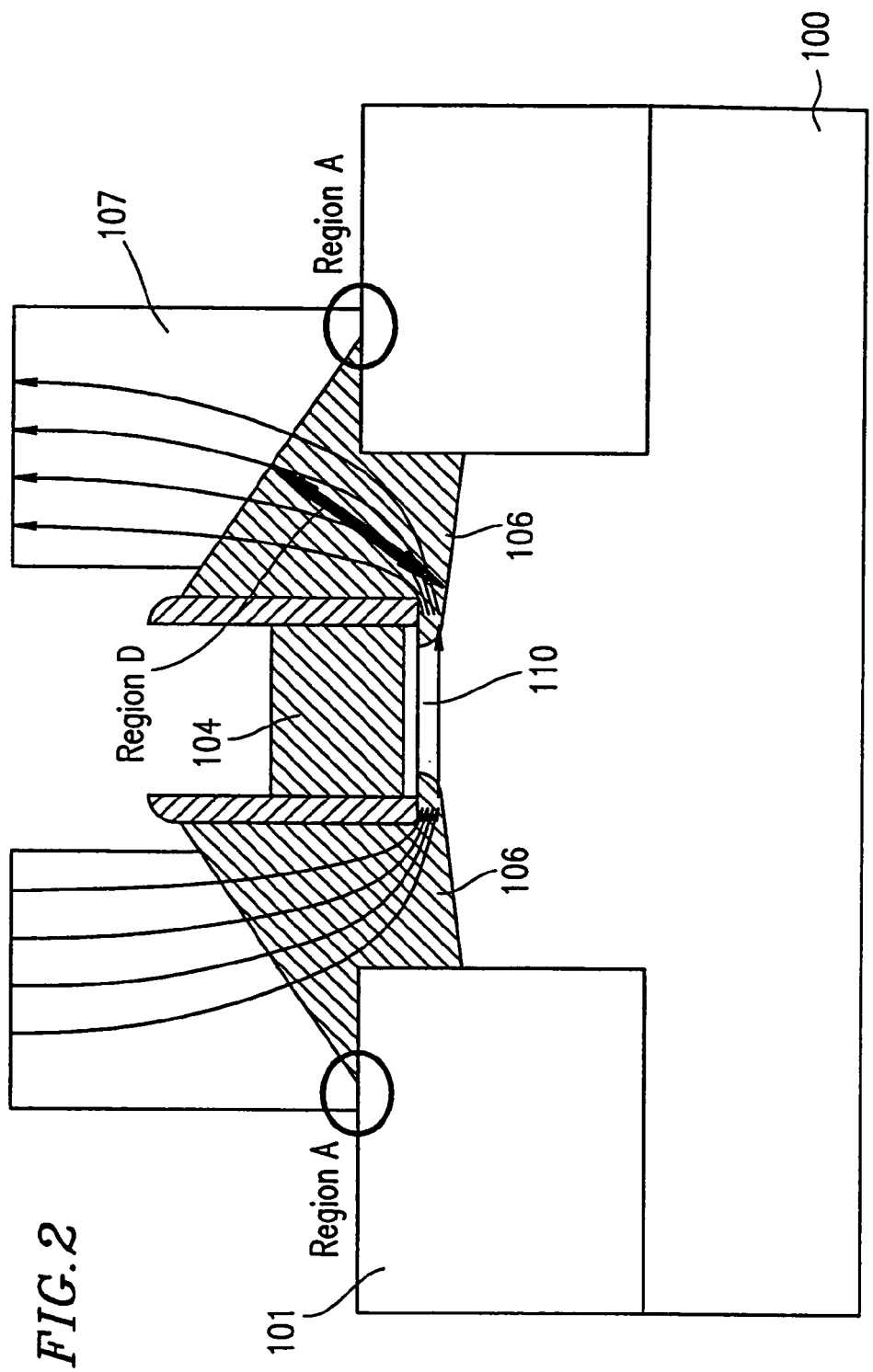
FIG. 2 is a diagram showing a flow of an electric current in a semiconductor device 1910.

FIG. 2 shows a flow of an electric current in the semiconductor device 1910. Similar to FIG. 1, FIG. 2 is a cross-sectional view of the semiconductor device 1910 taken along a vertical plane along a gate length direction. As shown in FIG. 2, part of a contact hole 107 is provided on the source/drain region 106. The contact hole 107 is filled with a part of an upper conductor (contact conductor).

In the semiconductor device 1910, a surface area of the source/drain region 106 is greater than an area (hereinafter referred to as an occupied area) of the surface (A–A') of the active region 102 (FIG. 1) occupied by the source/drain region 106. Therefore, the contact resistance between the source/drain region 106 and the upper conductor can be lowered in the semiconductor device 1910 as compared to the conventional semiconductor device (FIG. 43(c)). In other words, even if the contact hole 107 has the same diameter as that of the conventional semiconductor device, the contact resistance between the source/drain region 106 and the upper conductor can be lowered in the semiconductor device 1910. Conversely, if the contact resistance of the semiconductor device 1910 is designed to be substantially as much as the contact resistance of the conventional semiconductor device, the occupied area of the semiconductor device 1910 (particularly, the occupied area of the source/drain region 106) can be small, compared with the area of the conventional semiconductor device. In the semiconductor device 1910, the junction area between the source/drain region 106 and the semiconductor substrate 100 can be reduced without sacrificing the contact resistance. Therefore, the junction capacitance can be effectively reduced.

As described above, in the semiconductor device 1910, the occupied area, the parasitic capacitance (junction capacitance), and the parasitic resistance can be reduced without sacrificing the contact resistance. Therefore, a considerably great transconductance can be obtained. A reduced capacitance allows a time required for charging to be decreased, thereby enhancing the speed of a circuit including the semiconductor device of the present invention.

As described above, in the semiconductor device 1910, the angle (contact angle θ) between the surface (a second surface contacting the contact conductor) of the source/drain region 106 and the surface (f–f' in FIG. 1) of the isolation region 101 is 80 degree or less. Therefore, no vertical step occurs in a portion (region A in FIG. 2) of the contact conductor contacting both the source/drain region and the isolation region. Thereby, a reduction in yield due to the contact resistance can be considerably suppressed.

Figure 44:
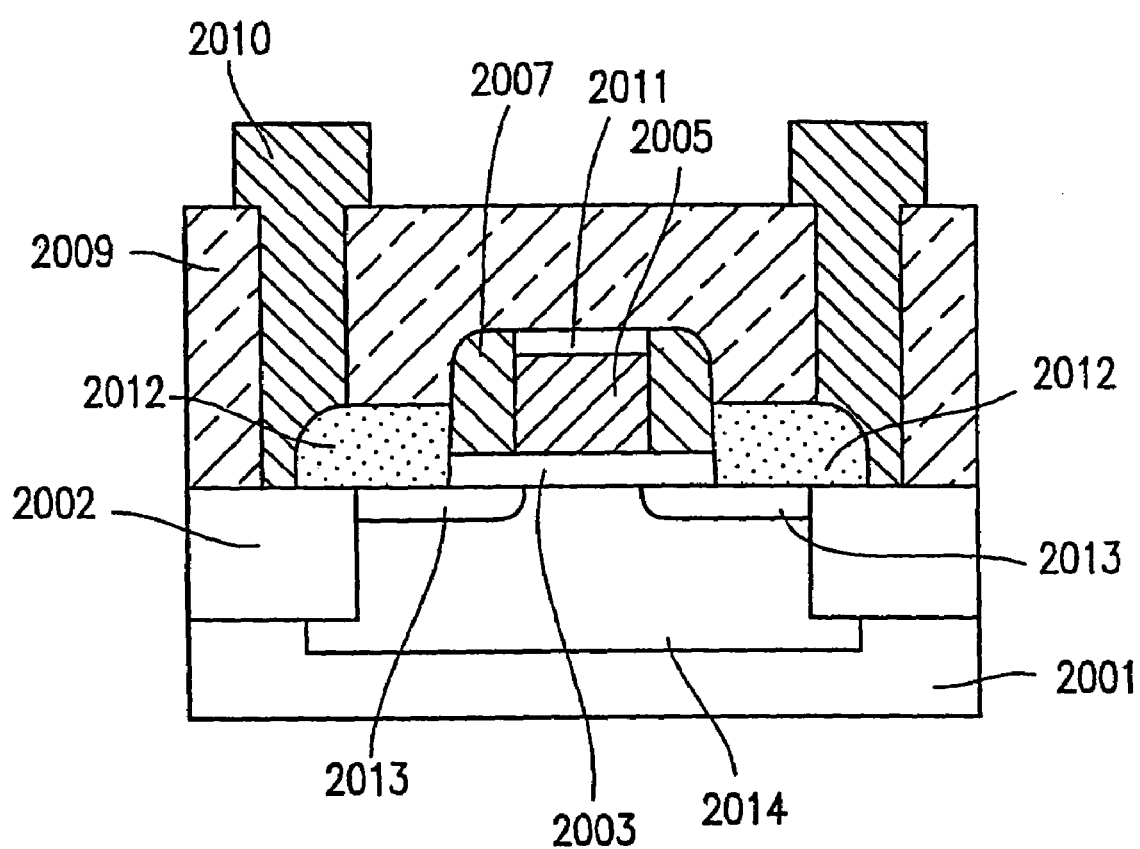
FIG. 44 is a diagram showing an insulating gate field effect transistor disclosed in Japanese Laid-open Publication No. 10-335660.

The inside of the contact hole 107 is typically buried with a contact conductor, such as a metal plug. When a vertical step as shown in FIG. 44 is present inside the contact hole 107 (i.e., the contact angle θ is about 90 degrees), the connection between the contact conductor and the source/drain region is incomplete. This leads to a considerable reduction in yield due to the contact resistance. In contrast, if the contact angle θ is 80 degrees or less, the connection between the contact conductor and the source/drain region can be improved, thereby suppressing the reduction in yield due to the contact resistance. If the contact angle θ is 60 degrees or less, yield can be further improved. Such an improved yield was consistently obtained.

The contact angle θ of 80 degrees or less is beneficial to the formation of the contact hole 107. Specifically, in the semiconductor device 1910, there is no vertical step occurring in the region A of FIG. 2, thereby solving a problem that upon etching such as self-aligned contact, an etching rate for an etching stop layer at a vertical step portion is increased, so that an etching selectivity relative to the etching stop layer is lowered. The etching is facilitated, thereby improving a reduction in yield due to contact resistance.

Further, taking saliside (self-aligned silicide) into account, an area having a silicide is increased for an occupied area, low resistance can be achieved. A problematic thin line effect upon silicide reaction (a problem is such that a thin line hinders the reaction and the silicide formation of the thin line is prevented) can be relaxed.

Note that FIG. 1 shows two source/drain regions 106. One of the two serves as a source region, while the other serves as a drain region.

Hereinafter, a flow of an electric current in the semiconductor device 1910 will be described.

FIG. 2 shows a region D (an impurity diffusion region) in a current path which is a region having a high resistance compared with a metal electrode. In the semiconductor device 1910, the distance between the channel region 110 and the contact hole 107 is considerably short, so that a distance in the current path occupied by the region D is significantly small. Therefore, the parasitic resistance of the source/drain region 106 is reduced as compared with the conventional semiconductor device. Further, since the region D'has a high impurity concentration of $1 \times 10^{20}/cm^3$ or more up to the vicinity of the channel region 110, the region D has a considerably low resistance for a semiconductor layer. Further, the current flow in the source/drain region 106 is spread out from the vicinity of the channel region 110 toward the contact conductor. This leads to a significant reduction in parasitic resistance. These features allow an enhancement in current driving performance of the semiconductor device 1910, thereby improving the transconductance.

Figure 3B:
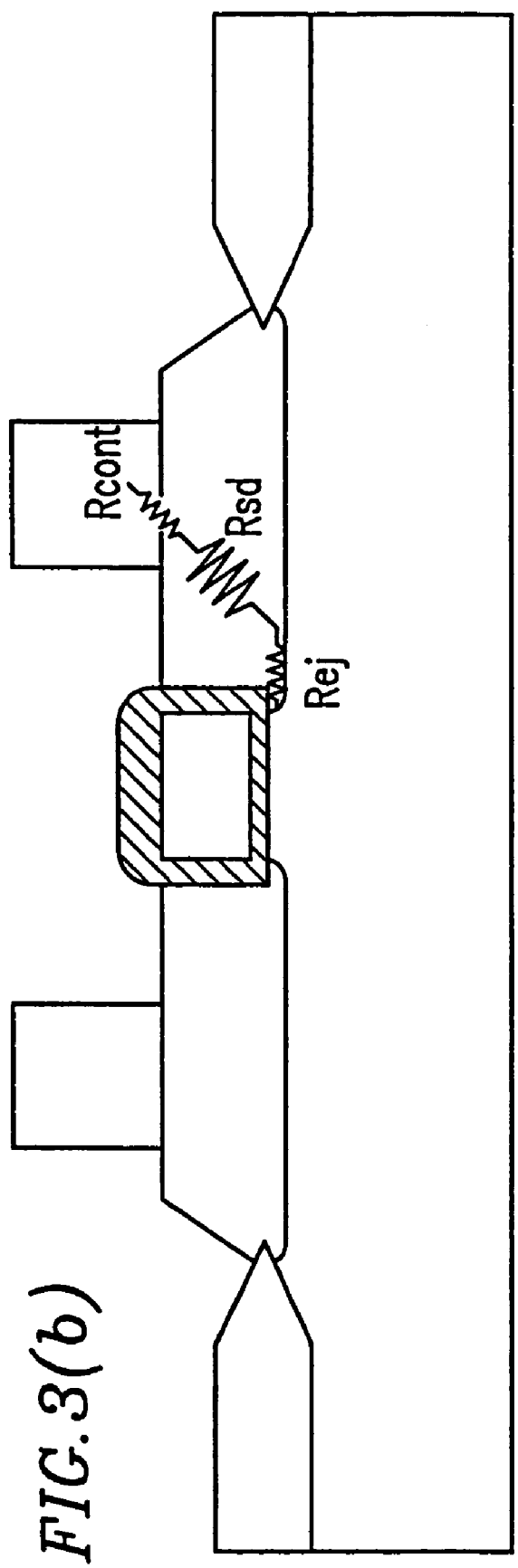
FIGS. 3(*a*) and 3(*b*) are diagrams schematically showing the parasitic resistance of a semiconductor device.

FIGS. 3(a) and 3(b) are schematic diagrams showing the parasitic resistance of the semiconductor device 1910.

FIG. 3(a) schematically shows the parasitic resistance of the semiconductor device 1910 of the present invention. FIG. 3(b) schematically shows the parasitic resistance of a conventional semiconductor device.

In FIGS. 3(a) and 3(b), Rcont indicates a contact resistance, Rsd indicates a source/drain resistance, and Rej indicates a spreading resistance of a junction.

In the semiconductor device 1910 of the present invention, the distance between the channel and a portion where the contact conductor contact the source/drain region 106 is considerably small, compared with the conventional semiconductor device 1041. Therefore, the source/drain resistance Rsd of the semiconductor device 1910 is low, compared with the source/drain resistance Rsd of the conventional semiconductor device 1041.

To further reduce the parasitic resistance of the semiconductor device 1910 (FIG. 3(*a*)), a portion I (first source/drain region) of the source/drain region 106 above the surface (A–A') where the active region 102 contacts the gate oxide film 103, and a portion H (second source/drain region) of the source/drain region 106 blow the surface (A–A'), both preferably have an impurity concentration of $1 \times 10^{20}/cm^3$ or more. The impurity concentration is the concentration of donors or acceptors which determine conductivity. More specifically, the regions I and H have almost the same impurity concentration, preferably more than $1 \times 10^{20}/cm^3$, at an interface between the region I and part of the region H. In this case, a portion of the source/drain region 106 below the gate electrode side wall insulating film 105 has a higher concentration compared with the impurity concentration $1 \times 10^{18}/cm^3$ to $1 \times 10^{20}/cm^3$ of a portion of a source/drain region below a gate electrode side wall insulating film of a typical MOS transistor. The impurity concentration of the source/drain region 106 is high up to the vicinity of the channel, so that the resistance of the source/drain region 106 is significantly low up to the vicinity of the channel. Therefore, in the semiconductor device 1910, although the junction between the source/drain region 106 below the surface (A–A') and the semiconductor substrate 100 is considerably shallow, the value of the resistance Rej can be greatly reduced. This leads to a great increase in a driving current in the transistor.

Example 2

Figure 4:
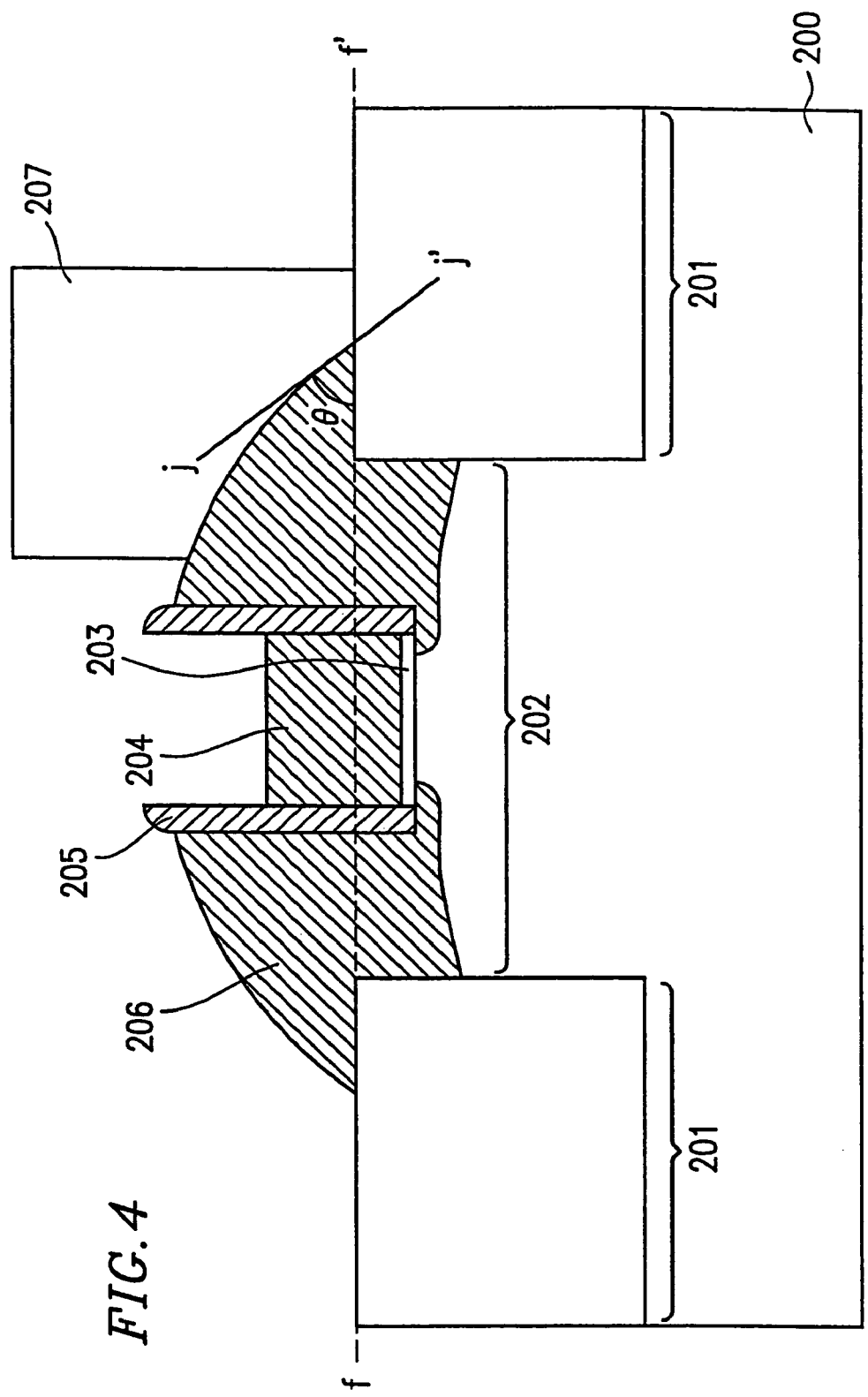
FIG. 4 is a diagram showing a semiconductor device 1920 according to Example 2 of the present invention.

FIG. 4 is a cross-sectional view showing a semiconductor device 1920 according to Example 2 of the present invention, taken along a plane along a gate length direction (a plane perpendicular to a longitudinal direction of a gate electrode 204) of the semiconductor device 1920.

The semiconductor device 1920 includes an isolation region 201, an active region 202, a gate oxide film 203, a gate electrode 204, a gate electrode side wall insulating film 205, a source/drain region 206, and a contact hole 207 which are provided on a semiconductor substrate 200. As shown in FIG. 4, a surface of the source/drain region 206 is in the shape of a convex curve in a cross-section of the semiconductor device 1920 taken along the gate length direction of the gate electrode 204. Therefore, as compared with the semiconductor device 1910 of Example 1, an area of the semiconductor device 1920 contacting a contact conductor can be increased, assuming the source/drain region 206 in the semiconductor device 1920 has the same occupied area as that of the source/drain region 106 in the semiconductor device 1910.

In the semiconductor device 1920 of FIG. 4, a surface of the source/drain region 206 is monotonically increased toward the gate electrode 204, and is in the shape of an upward convex. The surface of the source/drain region 206 meets a surface of the isolation region 201 at an contact angle θ.

The source/drain region 206 has the curved surface in a convex shape. The curved surface of the source/drain region 206 has a larger area as compared with a flat surface. That is, the surface area of the source/drain region 206 can be effectively increased with respect to the occupied region on the semiconductor substrate 200.

Note that a method for producing the semiconductor device 1920 will be described in Example 3 and Example 5.

Figure 5:
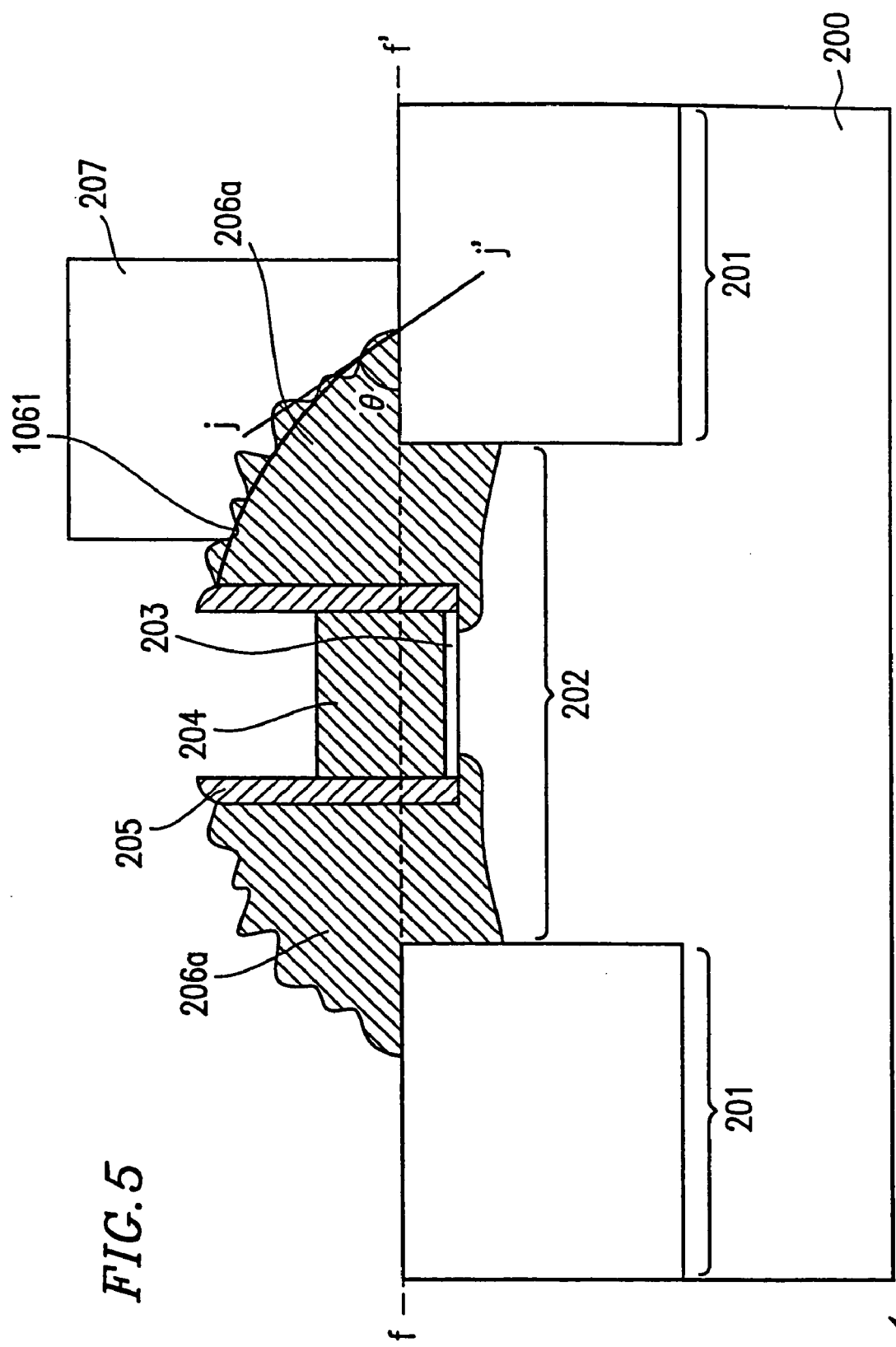
FIG. 5 is a diagram showing a semiconductor device 1930 according to Example 2 of the present invention where a source/drain region 206*a* is obtained by etching back a polycrystalline silicon.

FIG. 5 is a diagram showing a semiconductor device 1930 according to Example 2 of the present invention where a source/drain region 206*a* is obtained by etching back the polycrystalline silicon. As shown in FIG. 5, the polycrystalline silicon is etched back so as to produce the source/drain region 206*a*, a surface of which is rough due to grains contained in the polycrystalline silicon film. In the semiconductor device 1930, the rough surface of the source/drain region 206*a* allows an increase in surface area the source/drain region 206*a*.

Reference numeral 1061 in FIG. 5 indicates an assumed surface by smoothing the rough surface of the source/drain region 206*a*. The surface 1061 is in an upward convex shape.

In the semiconductor device 1930 of FIG. 5, a height of the surface of the source/drain region 206*a* is monotonically increased toward the gate electrode 204, and the surface is in an upward convex shape. Since the source/drain region 206*a* has the rough surface, the height of the source/drain region 206*a* is defined as the height of the surface 1061 assumed to be obtained by smoothing the rough surface of the source/drain region 206*a*. The upward convex surface of the source/drain region 206*a* means that the surface 1061 obtained by smoothing the rough surface of the source/drain region 206*a* is in an upward convex shape.

The surface of the source/drain region 206*a* meets a surface of the isolation region 201 at an contact angle θ. Since the source/drain region 206*a* has the rough surface, the angle between the surface of the source/drain region 206*a* and the surface of the isolation region 201 is defined as the angle between the surface 1061 and the surface of the source/drain region 206*a*.

The surface of the source/drain region 206*a* is macroscopically in an upward convex shape, and microscopically rough. Therefore, the surface area of the source/drain region 206*a* can be effectively increased with respect to the occupied area of the source/drain region 206*a* on a semiconductor substrate.

Figure 6:
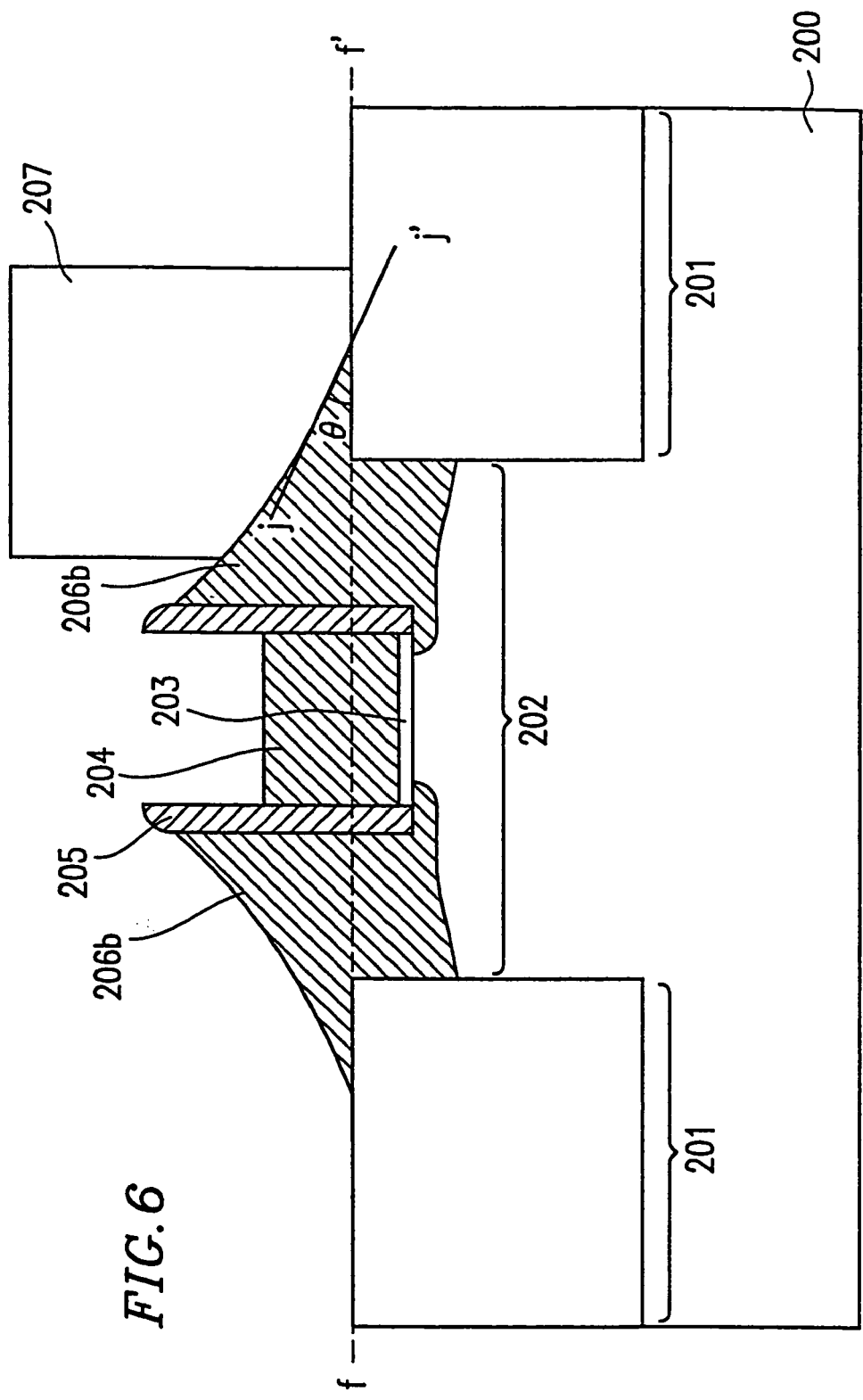
FIG. 6 is a diagram showing a semiconductor device 1940 according to Example 2 of the present invention.

FIG. 6 is a diagram showing a semiconductor device 1940 according to Example 2 of the present invention. In the semiconductor device 1940, a surface of the source/drain region 206*b* is monotonically increased toward a gate electrode 204, and is in a concave shape. The surface of the source/drain region 206*b* meets a surface of an isolation region 201 at a contact angle θ. In this case, the height of the source/drain region 206*b* is measured from a surface (first surface) where an active region 202 contacts a gate oxide film 203.

Thus, the source/drain region 206*b* has a concave surface. A curved surface has a large area as compared with a flat surface. Therefore, the surface area of the source/drain region 206*b* can be effectively increased with respect to the occupied area of the source/drain region 206*b* on a semiconductor substrate.

Figure 7:
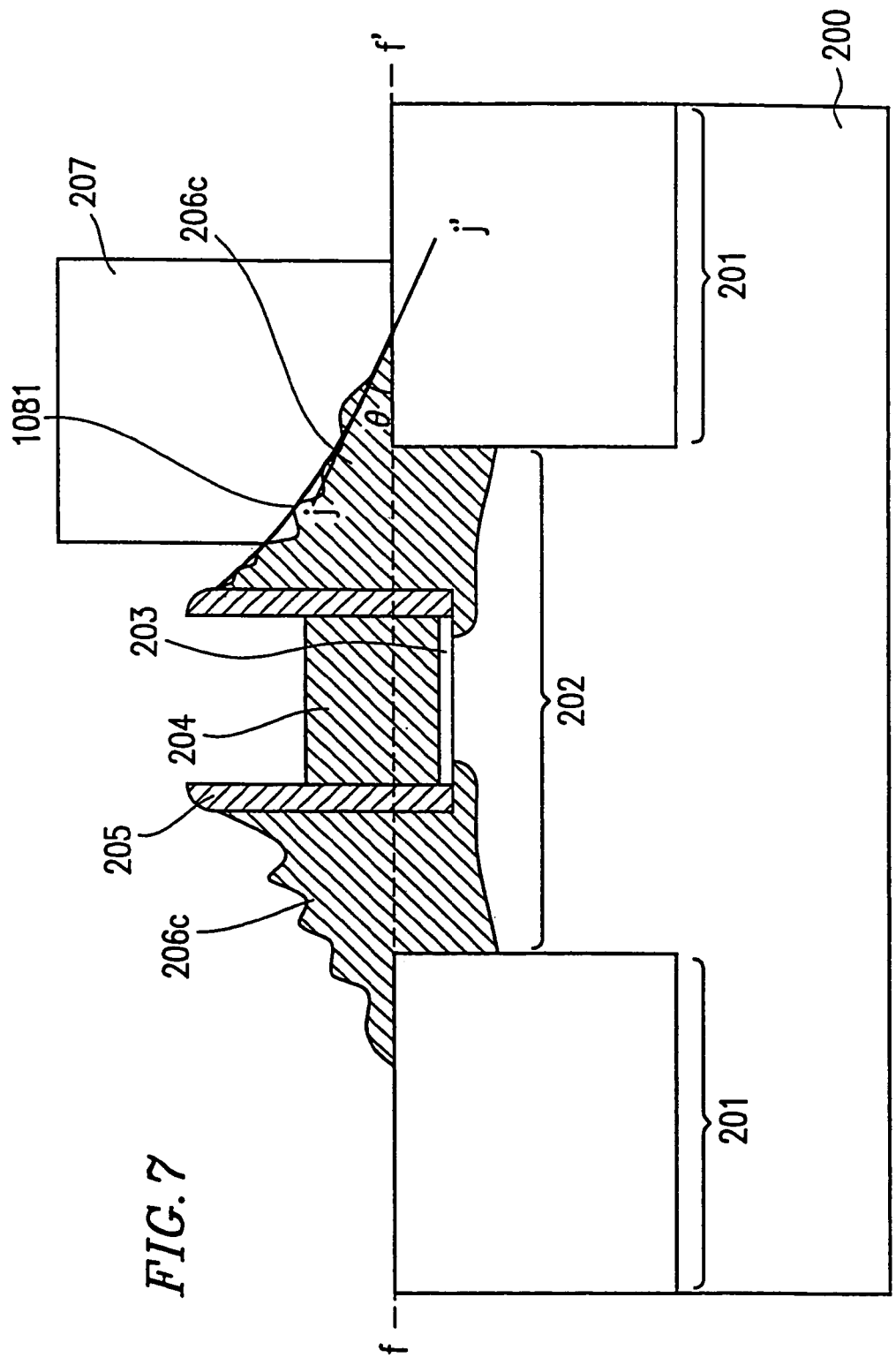
FIG. 7 is a diagram showing a semiconductor device 1950 according to Example 2 of the present invention.

FIG. 7 is a diagram showing a semiconductor device 1950 according to Example 2 of the present invention. In the semiconductor device 1950, the source/drain region 206*c* has a rough surface. A height of the surface of the source/drain region 206*c* is monotonically increased toward a gate electrode 204, and is in a concave shape. Since the source/drain region 206*c* has the rough surface, the height of the source/drain region 206*c* is defined as the height of a surface 1081 assumed to be obtained by smoothing the rough surface of the source/drain region 206*c*. The concave surface of the source/drain region 206*c* means that the surface 1081 obtained by smoothing the rough surface of the source/drain region 206*c* is in a concave shape.

The surface of the source/drain region 206c meets a surface of an isolation region 201 at an contact angle θ. Since the source/drain region 206c has the rough surface, the angle between the surface of the source/drain region 206c and a surface of the isolation region 201 is defined as an angle between the surface 1081 and the surface of the source/drain region 206c.

The surface of the source/drain region 206c is macroscopically in a concave shape, and microscopically rough. Therefore, the surface area of the source/drain region 206c can be effectively increased with respect to the occupied area of the source/drain region 206c on a semiconductor substrate.

The semiconductor devices 1920 (FIG. 4), 1930 (FIG. 5), 1940 (FIG. 6), and 1950 (FIG. 7) have in common a feature in which the surface area of the source/drain region is increased with respect to the occupied area of the source/drain region and the contact angle θ is 80 degrees or less.

The contact angle θ is defined as an angle between a tangential plane (j–j') of the source/drain region and a surface (f–f') of the isolation region. The contact angle θ of 80 degrees or less allows the above-described effects of Example 1 and a further increase in the surface area of the source/drain region than the semiconductor device 1910 of Example 1. In the semiconductor devices 1920, 1930, 1940, and 1950, the contact resistance can be further decreased, thereby suppressing a reduction in yield due to the contact resistance. As described above, if the contact angle θ is 60 degrees or less, the yield can be increased against the contact resistance.

Example 3

Hereinafter, a method for producing a semiconductor device according to Example 3 of the present invention will be described with reference to FIGS. 8 through 16.

Figure 8:
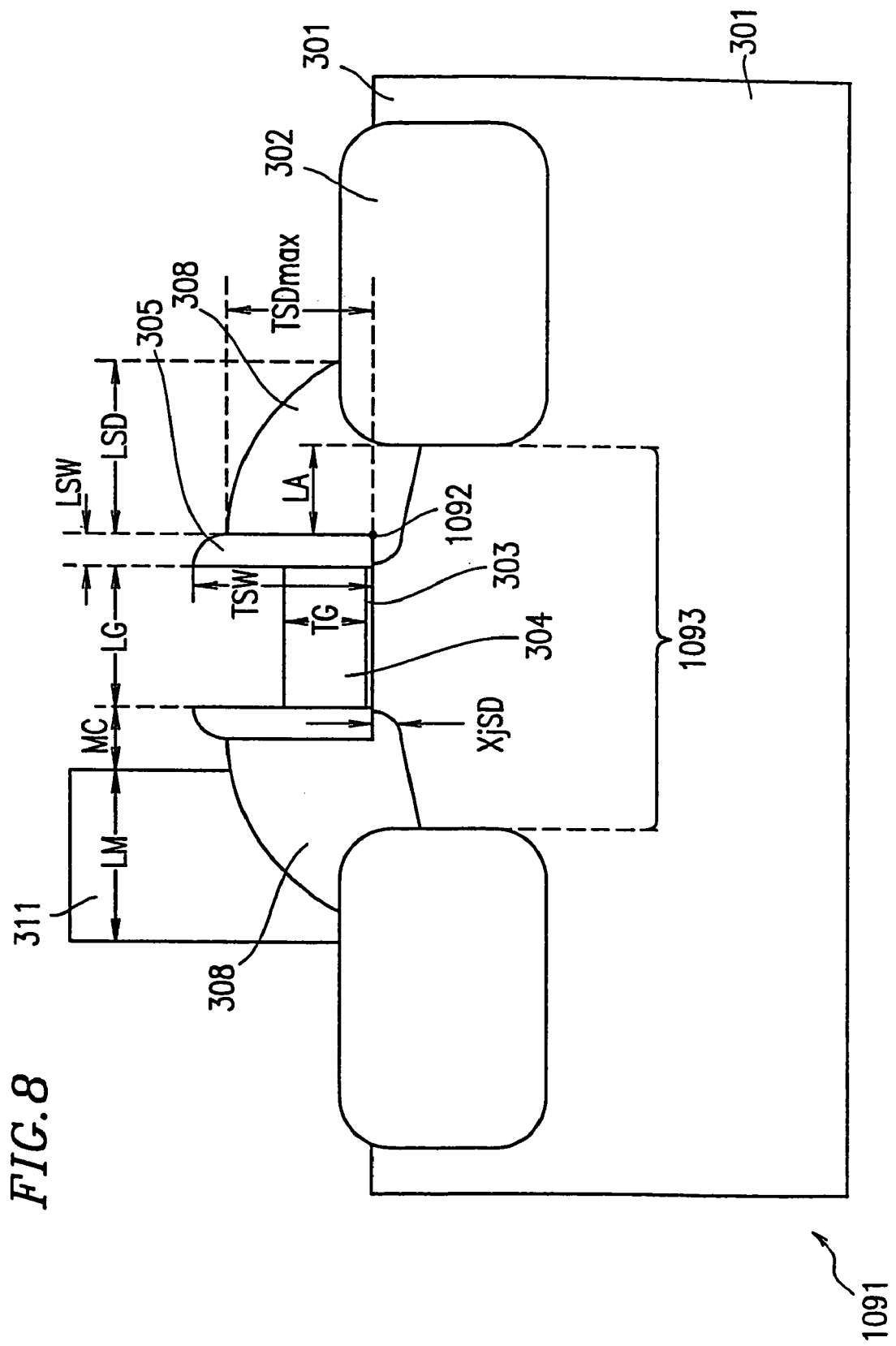
FIG. 8 is a diagram showing a state of a semiconductor device 1091 of Example 3 in a certain step of a production procedure.

FIG. 8 is a diagram showing a state of a semiconductor device 1091 of Example 3 in a certain step of a production process. The semiconductor device 1091 includes a semiconductor substrate 301, an isolation region 302, a gate oxide film 303, a gate electrode 304, a gate electrode side wall insulating film 305, and a polycrystalline silicon film which serves as a source/drain region 308.

A contact hole 311 for the polycrystalline silicon film (source/drain region 308) is provided so as not to cause a short circuit with the gate electrode 304. To this end, there is a margin MC between the gate electrode 304 and the contact hole 311. FIG. 8 only shows the contact hole 311 for the source/drain region 308 on the left side of the gate electrode 304. The contact hole 311 maybe provided on either of the source/drain regions 308 on the opposite sides of the gate electrode 304.

In this case, dimensions of the semiconductor device 1091 are defined as follows;

TG: the height of the gate electrode 304;

TSW: the height of the gate electrode side wall insulating film 305;

TSDmax: the height of the source/drain region 308 where the source/drain region 308 contacts the gate electrode side wall insulating film 305;

XjSD: the junction depth of the source/drain region 308 in the vicinity of a channel region;

LG: the width of the gate electrode 304 (gate length)

LSW: the width of the gate electrode sidewall insulating film 305;

LSD: the width of the source/drain region 308 (the distance from its one end contacting the gate electrode side wall insulating film 305 to its other end on the isolation region 302);

LA: the distance between the gate electrode side wall insulating film 305 and the isolation region 302;

LM: the diameter of the contact hole 311; and

MC: the margin between the gate electrode 304 and the contact hole 311.

A minimum processable size upon manufacture of the semiconductor device 1091 is referred to as "F". The width LG of agate electrode (gate length) is typically set to the minimum processable size. This is because the short gate length leads to an improvement in the driving performance of a transistor. An alignment margin for an underlying pattern is dependent on the performance of an apparatus for producing the semiconductor device 1091. A typically required alignment margin is about ⅓×F. LA needs to be set to the alignment margin or more. Preferably, when the alignment margin is about ⅓×F, LA is set to ⅔×F or more.

A small LSW leads to a short circuit between the gate electrode 304 and the source/drain region 308, or an increase in parasitic capacitance between the gate electrode 304 and the source/drain region 308. Conversely, a large LSW leads to a large XjSD requirement so as not to offset the source/drain region 308 with respect to a channel. In this case, the short channel effect is deteriorated. When LSW is large, if impurities are diffused toward the channel, the impurities are inevitably diffused downward, so that the junction depth (XjSD) is rendered to be deep. Preferably, LSW and XjSD immediately under an edge (point 1092 in FIG. 8) at an isolation region 302 side of the gate electrode side wall insulating film 305 substantially satisfy 0.8×LSW≦XjSD≦2×LSW. Therefore, the source/drain region 308 is not offset from the channel region, and the junction between the source/drain region 308 and the semiconductor substrate 301 extending downward from the first surface is considerably shallow. This leads to an increase in the driving current and the suppression of the short channel effect.

It is more preferable that LSW=XjSD.

As described above, LSW needs to be set to an appropriate value in order to obtain both the suppression of the short channel effect and the improvement in yield against parasitic capacitance. Preferably, LSW is set so as to substantially satisfy ⅛×F≦LSW≦⅓×F. Taking into account a balance between performance and yield, LSW is set so as to substantially satisfy ⅙×F≦LSW≦¼×F.

Taking yield into account, LA needs to be greater than or equal to the alignment margin (⅓×F). However, LA is preferably as small as possible. This is because a parasitic capacitance between the semiconductor substrate 301 (typically a well region provided on the semiconductor substrate) and the source/drain region 308 is reduced. Taking into account the above-described ⅛×F≦LSW≦⅓×F, it is preferable for the margin between the gate electrode 304 and the isolation region 302 (LSW+LA) to substantially satisfy ⅔×F≦LSW+LA≦⅘×F. It is more preferable to substantially satisfy ⅔×F≦LSW+LA≦F. Taking into account an alignment margin (referred to as "X") between the isolation region 302 and the gate electrode 304, it is preferable to substantially satisfy X+LA≦LSW+LA. Under such conditions, the parasitic capacitance between the semiconductor substrate 301 (typically a well region provided on the semiconductor substrate) and the source/drain region 308 can be considerably reduced, without a reduction in yield. Typically, LSW is set so as to be substantially equal to ⅓×F and LG=F. It is preferable to substantially satisfy LA+LSW≦LG in order to reduce source/drain region parasitic capacitance. It is also preferable to satisfy LA<LG.

In the cross section along the gate length direction, a distance between an edge of the gate electrode 304 and a portion of the isolation region 302 closest to the edge of the gate electrode 304 is defined as a distance between the gate electrode 304 and the isolation region 302. Taking into account the alignment margin and the thickness of the gate electrode side wall insulating film 305, the distance between the gate electrode 304 and the isolation region 302 is at least about 2F/3. When the distance between the gate electrode 304 and the isolation region 302 is set to 2F/3, if the gate electrode 304 is deviated by F/3 from the isolation region 302, the distance between the gate electrode 304 and the isolation region 302 becomes F in an actually produced device. Therefore, LSD+LSW>F needs to be established in order for part of the source/drain region 308 to be provided on the isolation region 302.

The inventors have found that LSD>F−LSW, much less LSD>F, is not a sufficient margin, due to variations upon manufacture, in terms of the yield subject to contact resistance. The inventors have found that LSD≧F+LSW leads to a considerable improvement in the yield upon manufacture.

The reason for LSD≧F+LSW leading to a considerable improvement in the yield upon manufacture will be described below. In the structure of the present invention in which the source/drain region 308 is provided in the shape of a side wall against the gate electrode 304, the contact bottom area (the area of a region where a contact conductor provided on the source/drain region 308 contacts the source/drain region 308) is considerably small. For example, when an alignment margin is secured so as not to cause a short circuit between the gate electrode 304 and the contact conductor, and the contact hole 311 is provided on the source/drain region 308, the contact hole 311 needs to be provided at least a distance of F/3 from the gate electrode. Even when the margin between the contact conductor and the gate electrode 304 is designed to be the least margin F/3, if the contact hole 311 is deviated by F/3 in a direction opposite to the gate electrode 304, the distance between the gate electrode 304 and the contact hole 311 is 2F/3.

The source/drain region 308 ranges from LSW from the edge of the gate electrode 304 to LSW+LSD therefrom. We have found that even when the distance between the gate electrode 304 and the contact hole 311 is 2F/3, if LSW+LSD>2F/3+F is established where LSW is about F/3, the contact hole 311 can be produced with a sufficient yield. Further, we have found that when the minimum processable size upon manufacture is F, if LSW is set to F/3, the best balance between yield and characteristics of a transistor can be obtained. When LSW is much smaller than F/3, a short circuit is likely to occur between the gate electrode 304 and the source/drain region 308 or the parasitic capacitance between the gate electrode 304 and the source/drain region 308 is likely to be increased. Conversely, when LSW is much greater than F/3, the junction depth of the source/drain region 308 needs to be greater so as not to offset the source/drain region 308 with respect to the channel region, and deterioration of the short channel effect may occur.

As described above, when LSD≧F/3+F=LG+LSW, the yield is considerably improved. When LSD≧LG+2×LSW, the yield is further improved.

At least part of an opening of the contact hole 311 may be provided on the source/drain region 308. The diameter of the opening of the contact hole 311 may be greater than the distance between the edge of the gate electrode 304 and the isolation region 302. Further, a larger contact hole 311 can be provided without increasing the occupied area of the source/drain region 308. Therefore, both the easy formation of the contact hole 311 and a reduction in junction capacitance dependent on the source/drain junction area can be obtained.

It is a necessary condition that LSD is greater than LSW+LA. Taking into account the formation of the contact hole 311 for the source/drain region 308, LSD needs to be much greater than LSW+LA. The contact hole 311 needs to be provided a distance of an alignment margin upon formation of the contact hole 311 from the gate electrode 304 in order to prevent a short circuit with the gate electrode 304. Taking into account variations upon processing and an improvement in the yield, a greater margin is required. Specifically, it is preferable to substantially satisfy ⅓× F≦MC≦⅔×F. When the contact hole 311 is deviated a distance of ⅓×F in a direction leaving from the gate electrode 304 upon manufacture where ⅓×F≦MC≦⅔×F is satisfied, an actual margin between the gate electrode 304 and the contact hole 311 satisfies ⅔×F≦MC≦F. To achieve a high yield of the contact hole 311 even in such a situation, the width (LSD+LSW−MC) of a region where the contact conductor contacts the source/drain region 308 needs to be greater than about ⅔×F. Ideally, LSD+LSW−MC=LM. According to an experiment conducted by the inventors, when F=LG and LSD≧LG+LSW, a considerably high yield was obtained.

As described above, LSD≧LG+LSW is satisfied in the semiconductor device of the present invention. A portion of the source/drain region 308 above a surface (first surface) where the active region 1093 contacts the gate oxide film 303 is defined as a first source/drain region. In this case, LSD is equal to a width in a gate length direction of the first source/drain region. Therefore, in the semiconductor device of the present invention, the gate length direction width (LSD) of the first source/drain region in its cross section along the gate length direction is greater than or equal to the sum of the gate length direction width (LSW) of the gate electrode side wall insulating film 305 in the cross section and the gate length direction width (LG) of the gate electrode 304 in the cross section.

As described above, it is preferable to satisfy TSDmax>TG in order to suppress the short channel effect. Under such a condition, when a silicide film (not shown in FIG. 8) is provided concurrently on the source/drain region 308 and the gate electrode 304, for example, by self-aligned silicide (salicide) reaction, TSW>TG needs to be satisfied so as not to cause a short circuit between the gate electrode 304 and the source/drain region 308. In a suitable method described later, the source/drain region 308 is provided by etching back a polycrystalline silicon film. Therefore, TSW, TSDmax, and LSD are closely related to each other. In the method described later, in order to obtain a high yield of the semiconductor device 1091, LSD (LSD≧LG+LSW) may be determined depending on LSW, LA, and MC which are dependent on the limits of processable sizes of a processing machine, and TSDmax and TSW may be designed depending on LSD. Since LSD>LSW+LA needs to be satisfied, it is preferable to satisfy TSW>LA. In this case, if TG is designed so as to satisfy LSW+LA>TG, it is possible to obtain both performance (suppression of depletion of the gate electrode and suppression of the short channel effect) and facilitation of manufacture (yield). This fact has been confirmed according to an experiment by the inventors.

As described above, in the semiconductor device 1091, a distance (LSW+LA) between an edge of the gate electrode 304 and a point of the isolation region 302 nearest the edge of the gate electrode 304in the cross-section along the gate length direction is greater than the height (TG) of the gate electrode 304 in the cross section. The height TG of the gate electrode 304 may be much lower, without depending on the value of LSW+LA. When the gate electrode 304 is made of a polycrystalline silicon film, typically, the impurity implantation of the gate electrode 304 is simultaneously conducted along with the impurity implantation of the source/drain region 308. If the thickness of the gate electrode 304 is sufficiently small, it is possible to obtain a sufficient impurity concentration of the gate electrode 304 in the vicinity of the gate oxide film 303, thereby making it possible to suppress the depletion of the gate electrode 304.

Further, in the semiconductor device 1091, a distance (LA) between an edge of the gate electrode side wall insulating film 305 and a point of the isolation region 302 nearest the edge of the gate electrode side wall insulating film 305 in the cross section along the gate length direction is smaller than the height (TSW) of the gate electrode side wall insulating film 305 in the cross section. With this structure, the height of the gate electrode 304 can be sufficiently lowered, and the source/drain region 308 in the shape of a side wall can be provided on the isolation region 302.

The inventors produced a semiconductor device using a processing machine having a minimum processable size of F=0.25 micron, where TG=150 nm, TSW=300 nm, TSD-max=250 nm, XjSD=60 nm, LG=250 nm, LSW=60 nm, LSD=300 nm, LA=180 nm, LM=300 nm, and MC=120 nm. These set values are dependent on the performance of the processing machine used by the inventors, and are not intended to limit the scope of the invention. The set values are determined by the inventors varying each value within an available range in accordance with an F=0.24 µm rule. For example, each value may be changed in the case of a smaller F=0.1 µm rule. Even in the case of the F=0.24 µm rule, each value may be changed within a range which satisfies the above-described relationship.

FIGS. 9(a) through 9(g) are diagrams showing the steps of producing the semiconductor device 1091 of Example 3. Each step of producing the semiconductor device 1091 of Example 3 will be described.

Figure 9A:
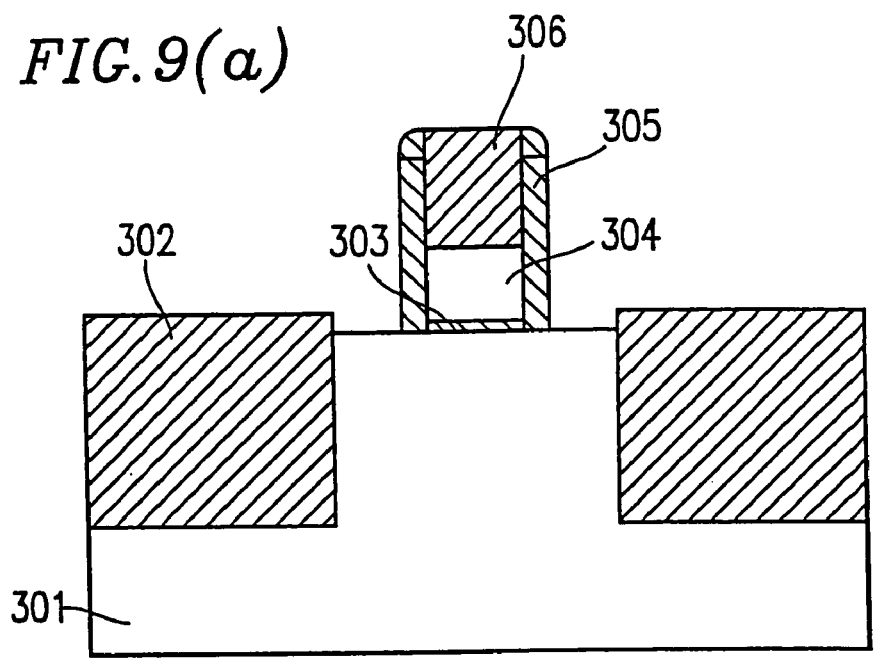
FIGS. 9(*a*) through 9(*g*) are diagrams showing the steps of producing the semiconductor device 1091 of Example 3.

As shown in FIG. 9(a), an isolation region 302, a gate oxide film 303, a gate electrode 304, and a gate electrode side wall insulating film 305 are formed on a semiconductor substrate 301 (or a well region provided on the semiconductor substrate 301), using a well-known method. In this case, a silicon oxide film 306 is provided on the gate electrode 304 made of a polycrystalline silicon film. The gate electrode side wall insulating film 305 is made of a silicon oxide film and a silicon nitride film. The gate electrode side wall insulating film 305 may be a single layer.

Figure 9B:
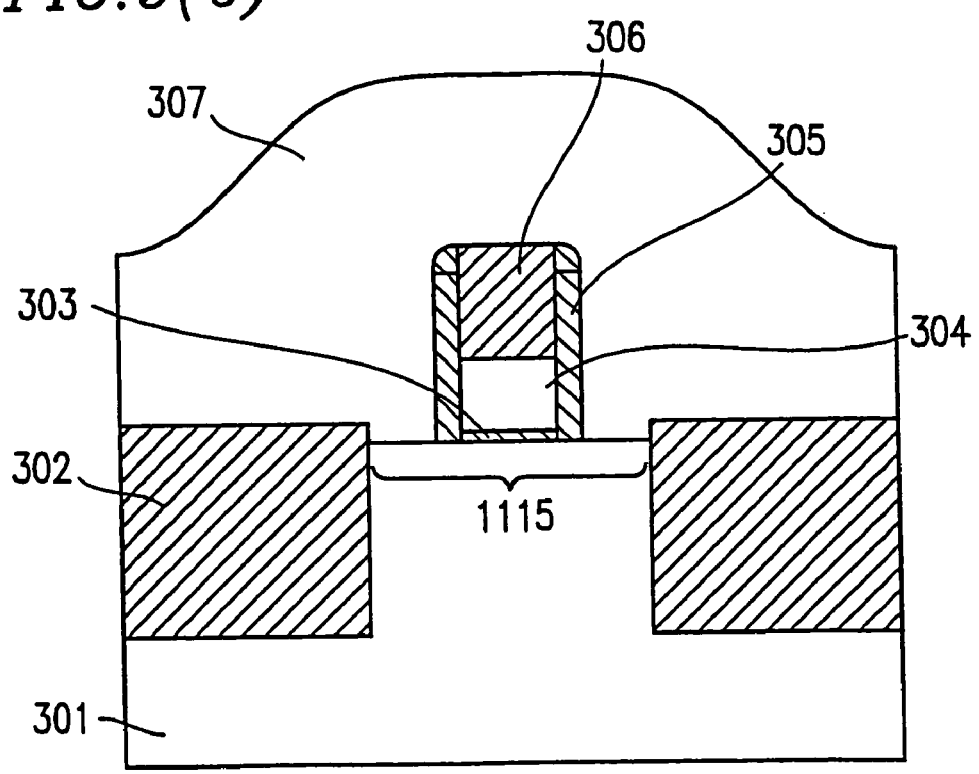

Thereafter, as shown in FIG. 9(b), a polycrystalline silicon film 307 is deposited using a chemical vapor deposition (CVD). Upon the deposition of the polycrystalline silicon film 307, the polycrystalline silicon film 307 needs to be formed on a surface of an active region of the semiconductor substrate 301 in such a manner as to minimize occurrence of a spontaneous oxide film therebetween. Impurities (donors or acceptors) are implanted into the polycrystalline silicon film 307, and thereafter the impurities in the polycrystalline silicon film 307 are diffused into the semiconductor substrate 301. In this step, if an oxide film is present at an interface between a surface of an active region 1115 of the semiconductor substrate 301 and the polycrystalline silicon film 307, the oxide film serves as a diffusion barrier which hinders uniform impurity diffusion. If the uniform impurity diffusion is hindered, the source/drain junction depth does not become uniform, leading to variations in transistor characteristics.

To minimize the spontaneous oxide film formation at the interface between the active region 1115 and the polycrystalline silicon film 307, the polycrystalline silicon film 307 may be deposited on the semiconductor device 1091 of FIG. 9(a) in the following method.

In Example 3, the polycrystalline silicon film 307 is deposited on the surface of the active region 1115 of the semiconductor substrate 301, using a low pressure CVD (LPCVD) apparatus including a pre-exhaust chamber, a nitrogen purge chamber in which the dew point is maintained at −100° C., and a deposition furnace, without causing spontaneous formation of an oxide film at the interface.

Specifically, the polycrystalline silicon film 307 is formed in the following manner. The semiconductor substrate 301 (a state shown in FIG. 9(a)) is washed with a hydrogen fluoride-based solution immediately before the polycrystalline silicon film 307 is deposited, thereby removing the spontaneous oxide film. Then, the semiconductor substrate 301 is transported to the pre-vacuum exhaust chamber. In this chamber, the atmosphere at the time of transportation is once exhausted to realize a vacuum state, and the interior atmosphere of the chamber is substituted with a nitrogen atmosphere. The semiconductor substrate 301 is then transported to the nitrogen purge chamber in which the dew point is maintained at −100° C.

The nitrogen purge chamber is used to completely remove water molecules adsorbed by the semiconductor substrate 301 (wafer) surface. Water molecules adsorbed by the wafer surface cannot be removed in the vacuum. The experiments performed by the present inventors have shown that the water molecules adsorbed by the wafer surface can be completely removed by a nitrogen purge.

With a conventional LPCVD apparatus, the wafer is transported to the high-temperature deposition furnace while the water molecules are still being adsorbed by the wafer surface. Deposition of a polycrystalline silicon film is usually performed at a temperature of about 550° C. to 700° C. Therefore, when the wafer is transported to the high-temperature deposition furnace, an oxygen component of the adsorbed water reacts with silicon in the wafer. As a result, a spontaneous oxide film is formed on the silicon wafer surface before the polycrystalline silicon film is deposited. Thus, the active region surface and the polycrystalline silicon film sandwich the spontaneous oxide film at an interface therebetween.

However, in the LPCVD apparatus in this example, the adsorbed water molecules are completely removed in the nitrogen purge chamber in which the dew point is maintained at −100° C. and then the semiconductor substrate 301 is transported to the deposition furnace. Therefore, the polycrystalline silicon film 307 can be formed without causing the formation of a spontaneous oxide film. A preferable thickness of the polycrystalline silicon film 307 will be described later with reference to FIG. 10.

Figure 9C:
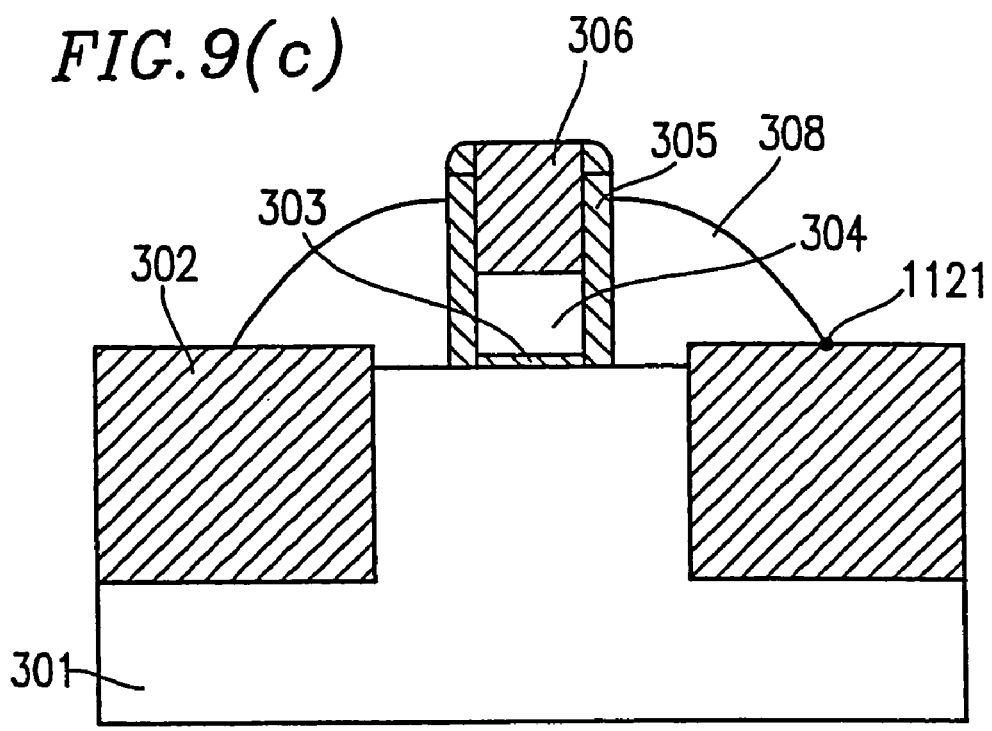
Figure 9D:
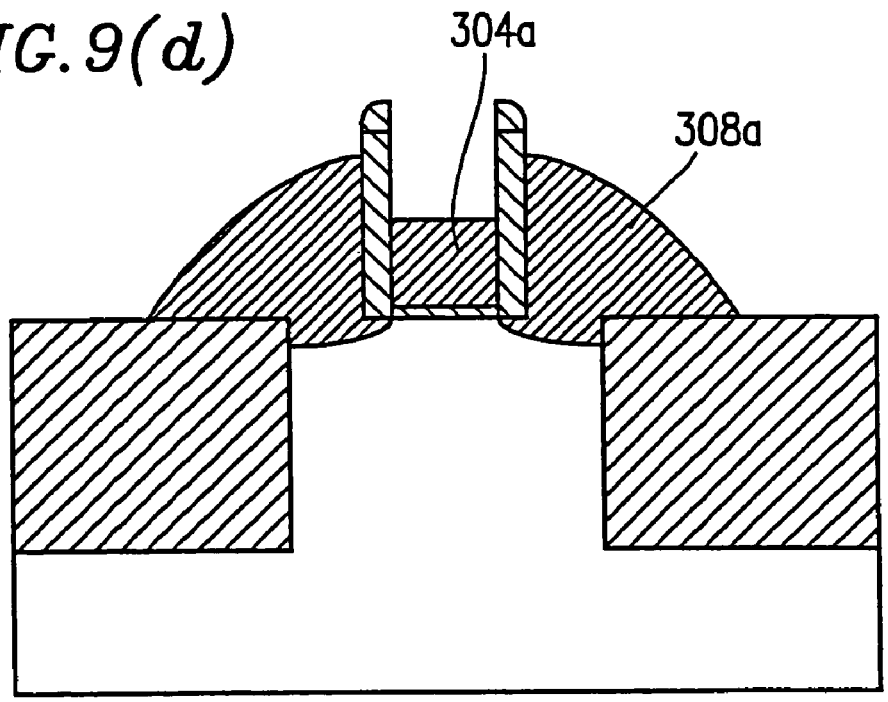

After the deposition, the polycrystalline silicon film 307 is etched back. As a result, a polycrystalline silicon film 308 remains on opposite sides of the gate electrode side wall insulating film 305 as shown in FIG. 9(c). The polycrystalline silicon film 308 is in the shape of a side wall. An edge 1121 of the sidewall needs to be provided on the isolation region 302.

Etching back of the polycrystalline silicon film 308 is performed with a mixture gas of chlorine and oxygen at a pressure of 0.3 Pa using a helicon type RIE apparatus. An end point detector (EPD) is used to perform over-etching by 10% to 30% with respect to the polycrystalline silicon film 307.

After the etching back, a cutting process is performed. The cutting process will be described later with reference to FIGS. 11 through 14.

Thereafter, a silicon oxide film 306 on a polycrystalline silicon film 304 which will be agate electrode is removed by etching, and impurity ions are implanted (doped) to produce source/drain regions (FIG. 9(*d*)). Reference numeral 304*a* shown in FIG. 9(*d*) indicates a gate electrode after the impurity ion implantation, and reference numeral 308*a* indicates a source/drain region after the impurity implantation. In this example, the gate electrode 304 and the source/drain region 308 are simultaneously doped.

Exemplary conditions of the ion implantation in this example will be described below.

The polycrystalline silicon film 304 (FIG. 9(*c*)) which will be a gate electrode has a thickness f of 120 nm to 170 nm (150 nm in this example). The accumulated layer 308 (FIG. 9(*c*)) has a maximum height LSDmax of 200 nm to 300 nm in the vicinity of the gate electrode 304. In the case of an N-channel transistor, phosphorous ions or arsenic ions having a dose of about $1 \times 10^{15}$ to about $5 \times 10^{16}$/cm$^2$ and an energy of about 20 KeV to about 150 KeV are implanted. In the case of an P-channel transistor, boron ions having a dose of about $1 \times 10^{15}$ to about $5 \times 10^{16}$/cm$^2$ and an energy of about 10 KeV to about 40 KeV are implanted.

In the ion implantation, a dose of about $5 \times 10^{14}$ to about $5 \times 10^{15}$/cm$^2$ of silicon ions are implanted before implantation of impurity ions to render the polycrystalline silicon film to be amorphous for the purposes of prevention of penetration of the gate oxide film due to channeling and control of diffusion in the polycrystalline silicon film. In this case, the grain boundary in polycrystalline silicon is somehow broken. In production of a CMOS, it is necessary to select a condition for obtaining amorphous silicon which is suitable for the impurity ion used.

After the impurity ion implantation, the semiconductor substrate including the implanted impurity ions is heated at a temperature of about 800° C. to about 950° C. for about 10 to about 120 minutes. Alternatively, the semiconductor substrate including the implanted impurity ions is subjected to a rapid thermal processing at a temperature of about 950° C. to about 1100° C. for about 10 to about 60 seconds. In this case, the implanted impurities are activated and diffused to the silicon substrate. The thermal diffusion needs to be such that the source/drain region is not offset with respect to the gate electrode. Specifically, impurities needs to be diffused horizontally by a thickness of the gate electrode side wall insulating film 305 (FIG. 9(*c*)). To improve the performance of the transistor (the short channel effect is unlikely to occur and a driving current is large), such a shallow junction as possible is required and the source/drain region should not be offset with respect to the gate electrode.

The thermal diffusion of impurities will be described with reference to FIGS. 15 through 17.

As described above, a method for producing the semiconductor device of this example includes the steps of: implanting impurities having a conductivity opposite to a conductivity of an active region into a portion of the layer 308 which will be a source/drain region above a first surface where the active region contacts the gate oxide film; and diffusing the impurities from the layer 308 to the active region due to thermal diffusion, so that a source/drain region is provided below the first surface. The impurities are donors or acceptors. With such steps, the conductivity of the active region is reversed at a surface where the layer 308 (which will be a source/drain region) contacts the active region.

Therefore, introducing impurities (donor or acceptor) into a region in an active region (semiconductor substrate) which will be a source/drain region is not required before providing a source/drain region above the first surface where the active region contacts a gate oxide film.

Figure 45:
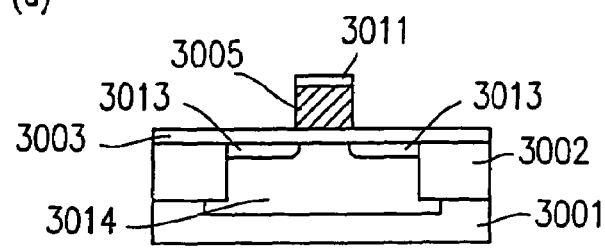
FIGS. 45(*a*) through (*e*) are diagrams showing the steps of producing the insulating gate field effect transistor disclosed in Japanese Laid-open Publication No. 10-335660.
Figure 45:
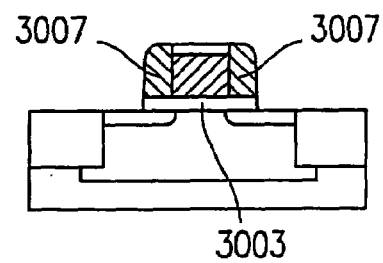
Figure 45:
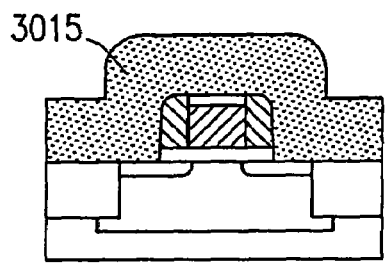
Figure 45:
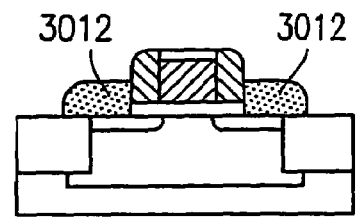
Figure 45:
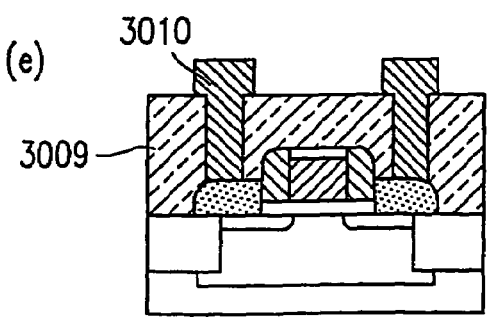

For example, Japanese Laid-open Publication No. 10-335660 discloses the following technology. A gate electrode is used as a mask and ions are implanted directly to a semiconductor substrate so that part of a source/drain region is provided (a lower diffusion layer 3013 shown in FIG. 45(*a*)), before providing a diffusion layer disposed at a gate electrode side wall (the diffusion layer corresponds to a layer of the present invention which will be a source and/or drain region and is provided above the first surface where the active region contacts the gate oxide film). In this case, an ion implantation process is additionally required (at least two steps of donor implantation and acceptor implantation in the case of a CMOS). When a CMOS is produced, a separate mask is required each for providing an N channel and a P channel. Therefore, two photolithography steps are additionally required, resulting in a considerable increase in cost.

Further, when an ion implantation process is used to introduce impurities directly into a semiconductor substrate, the accelerated ions are implanted in accordance with the principle of ion implantation. Therefore, the implanted ions are distributed in the semiconductor substrate in accordance with a Gaussian distribution having the projected range as a center value of the distribution. Some impurity ions exist deep in the semiconductor substrate in accordance with the Gaussian distribution, leading to difficulty in providing a shallow source/drain junction. Variations in acceleration power of an implantation apparatus leads to variations in an impurity ion distribution in a semiconductor substrate. Therefore, junction depth varies, resulting in variations in the short channel effect. As a result, the yield is lowered.

As described above, the technology, in which ions are implanted directly to a semiconductor substrate so that part of a source/drain region is provided, has difficulty in providing a shallow junction between the source/drain region and the semiconductor substrate. Therefore, it is difficult to prevent the short channel effect.

In this example, these problems are solved. In this example, impurities used for providing a source/drain region need not be implanted directly to a semiconductor substrate, resulting in simplification of the process. Therefore, cost is reduced and a shallow junction can be easily produced. Further, variations in the junction depth can be suppressed, whereby the short channel effect is effectively suppressed. These effects are due to a method in which a layer above the first surface where an active region contacts a gate oxide film is doped to produce a source/drain region, and doped ions are further diffused into a solid-phase region below the first layer by solid-phase diffusion so that the region becomes part of the source/drain region.

In solid-phase diffusion, a size of a region into which impurities are diffused can be uniquely determined in accordance with an impurity concentration, a coefficient of diffusion (a diffusion coefficient of impurities in a silicon film), temperature, and a thermal processing time. There are few variations in a size of a region into which impurities are diffused. Further, the diffusion can be easily controlled. Therefore, it is possible to provide a source/drain region, which is shallow and has a high impurity concentration up to the vicinity of a channel, as intended.

Figure 9E:
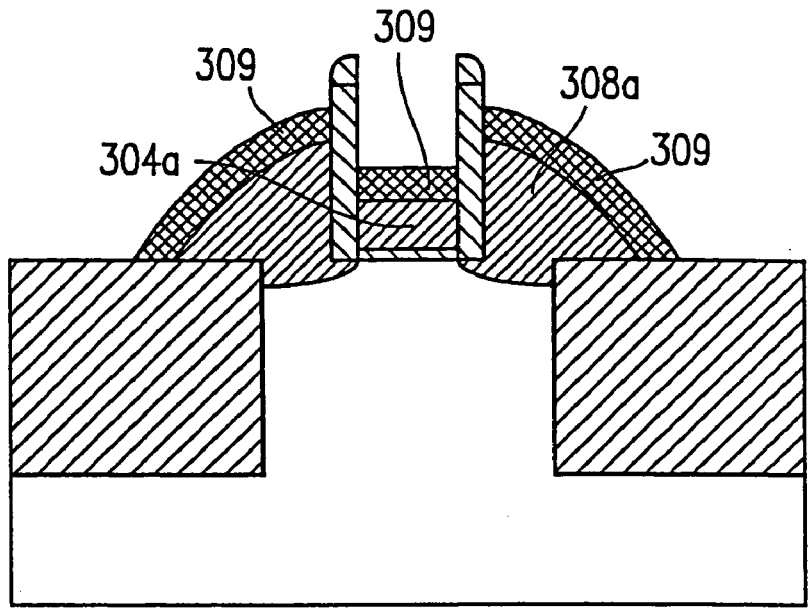

Referring to FIG. 9(e), after the gate electrode and the source/drain region have been doped, a refractory metal silicide film 309 (refractory metal film) is selectively provided on the source/drain region 308a and the gate electrode 304a using a well-known method of producing salicide. In this example, titanium is used as a material for the refractory metal film 309, but a material for the refractory metal film 309 is not limited to titanium. Examples of a material for the refractory metal film 309 include cobalt, nickel, and platinum. In this example, all the upper portions of the source/drain region 308a and the gate electrode 304a are converted to salicide.

Figure 9F:
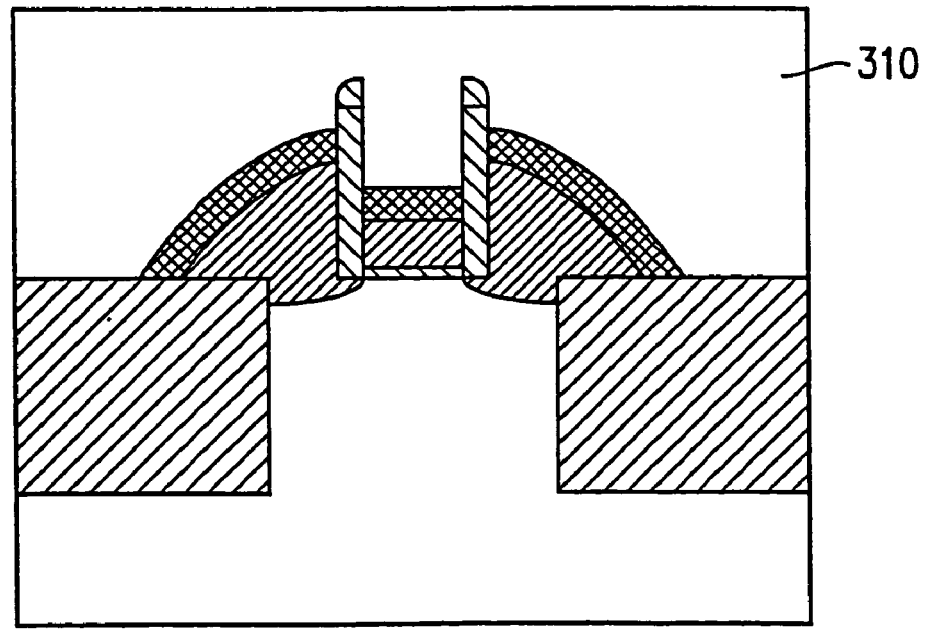

Referring to FIG. 9(f), after all the upper portions of the source/drain region 308a and the gate electrode 304a have been converted to salicide, an interlayer insulating film 310 is provided using a well-known method.

Figure 9G:
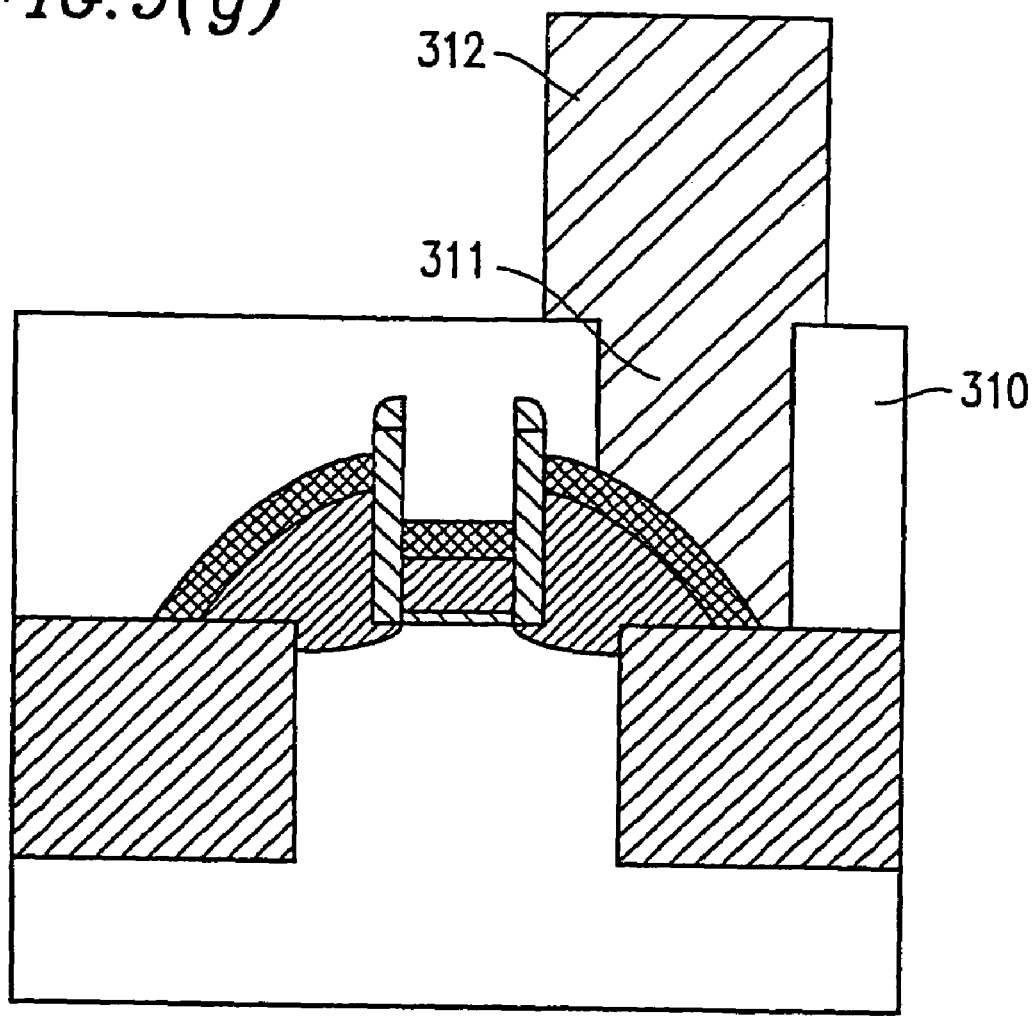

Referring to FIG. 9(g), after the formation of the interlayer insulating film 310, the interlayer insulating film 310 is bored to provide a contact hole 311 at a desired position. Thereafter, an upper conductor 312 is provided.

In this example, the source/drain region having a surface area larger than an occupied area is provided above the channel region. Therefore, if only part of the contact hole 311 overlaps the source/drain region, the contact area between the source/drain region and the contact hole can be large. Therefore, even if the occupied area of the source/drain region is reduced, the contact resistance can be prevented from being increased. With such a structure, the occupied areas of elements can be considerably reduced in the semiconductor device 1091.

Figure 10:
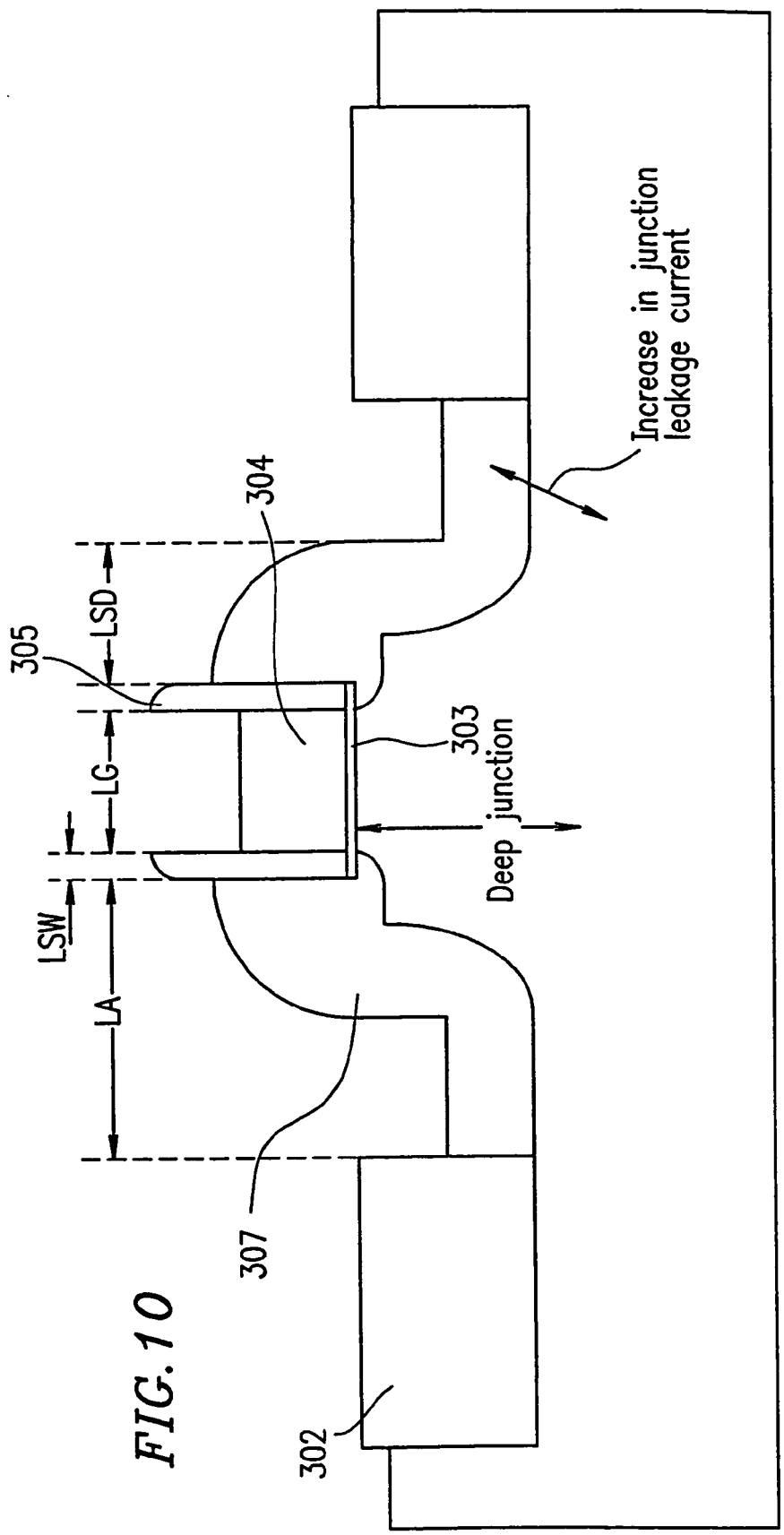
FIG. 10 is a diagram showing a case where a distance LA and a side wall width LSW are inappropriate in a semiconductor device.

FIG. 10 shows a case where the distance LA and the sidewall width LSD are inappropriate in a semiconductor device. As shown in FIG. 10, when the distance LA is greater than the side wall width LSD, a silicon substrate 301 is dug by anisotropic etching back. Due to this, the silicon substrate 301 is damaged, so that a junction leakage current is increased and a junction is deep. As a result, the short channel effect is deteriorated.

The side wall width LSD is determined depending on a level difference of a gate electrode (the sum of a height of a polycrystalline silicon film 304 and a height of a silicon oxide film 306 (FIG. 9(b))) and a thickness of a polycrystalline silicon film 307. The side wall width LSD needs to satisfy LSD>LA+X where X is an alignment margin between the gate electrode 304 and an isolation region 302 (a positioning deviation between the gate electrode 304 and the isolation region 302). In this example, it is assumed that LA is about 0.18 µm, X is ±0.08 µm, and the side wall width LSD is 0.3 µm. Further, it is assumed that the level difference due to the gate electrode 304 and the silicon oxide film 306 is 300 nm to 400 nm, and a deposition thickness of the polycrystalline silicon film 307 is 400 nm to 600 nm.

As described in Example 1, the angle θ between a surface of the isolation region 302 and a surface of the source/drain region 308 (FIG. 9(c)) is 80 degree or less, and more preferably 60 degrees or less. The smaller the angle θ, the more the yield. An experiment conducted by the inventors has demonstrated that when the angle θ is 60 degrees or less, the yield can be considerably increased. To provide the angle θ of 60 degrees or less, it is important for the thickness of the polycrystalline silicon film to be much greater than the desired LSD. In this case, TP>LSD is required where TP is a thickness of the deposited polycrystalline silicon film. Preferably, TP≧1.25×LSD is satisfied. The level difference due to the gate electrode 304 and the oxide film 306 thereon needs to be greater than a predetermined value in order to satisfy such a relationship. In this example, TG=150 nm, and the thickness of the oxide film 306 is between 150 nm and 250 nm.

In this example, an amount of etching is designed so that the polycrystalline silicon film is removed from the gate electrode. Thereby, the accumulated source/drain region of the present invention can be easily obtained. Since the polycrystalline silicon film deposited has a thickness greater than the distance between the gate electrode and the isolation region (the width of the source/drain region), the silicon substrate is not exposed, i.e., the silicon substrate is not damaged by anisotropic etching back. An edge of the accumulated layer at the side of the gate electrode is provided on the isolation region made of a material resistant to silicon etching.

The above-described TP value and thickness of the oxide film 306 are exemplary ones in accordance with F=0.24 µm rule. The present invention is not limited to those values. TG, LSD, TSDmax, TSW, TP, and the thickness of the oxide film 306 are preferably designed as described above in accordance with LG, LSW, LA, and MC which are determined depending on the limits of processable sizes of a processing machine.

Further, to minimize a side wall capacitance between the source/drain region and the gate electrode, both the level difference due to the gate electrode 304 and the oxide film 306 thereon and the thickness TP of the polycrystalline silicon film 307 deposited are preferably small as far as a relationship LSD>LA is satisfied (more preferably, as far as a relationship LSD≧LG+LSW is satisfied).

Figure 11:
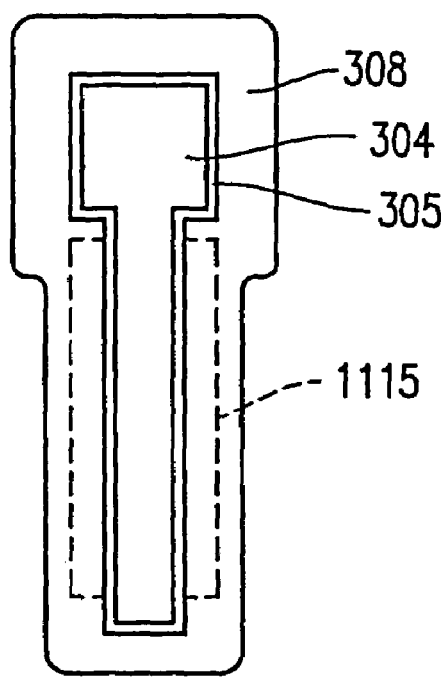
FIG. 11 is a diagram showing that a polycrystalline silicon film 308 remains around a gate electrode 304 via a gate electrode side wall insulating film 305.

FIG. 11 shows that a polycrystalline silicon film 308 remains around the gate electrode 304 via the gate electrode side wall insulating film 305. As shown in FIG. 11, if the polycrystalline silicon film 307 (FIG. 9(b)) is simply etched back, the polycrystalline silicon film 308 remains around the gate electrode 304 via the gate electrode side wall insulating film 305.

Figure 12:
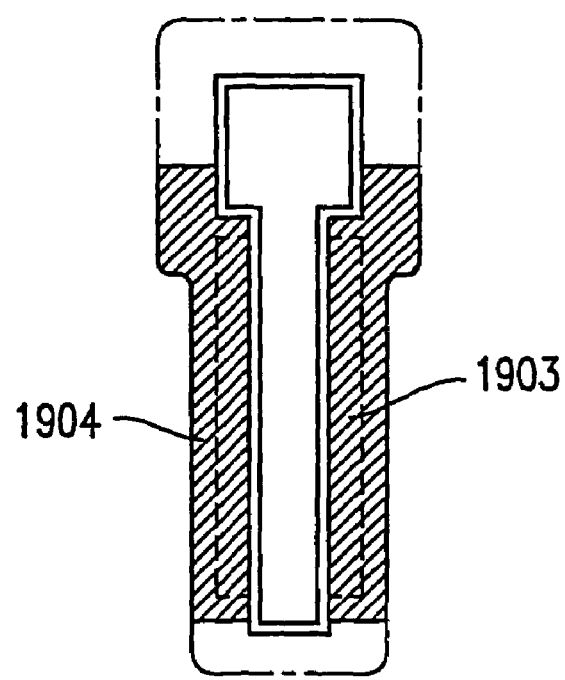
FIG. 12 is a diagram showing separate source and drain regions.

As shown in FIG. 12, the polycrystalline silicon film 308 needs to be divided into regions 1904 and 1903 in order to use the polycrystalline silicon film 308 as a source/drain region. In the semiconductor device 1091 (FIG. 9(g)), one of the regions 1904 and 1903 functions as a source electrode, while the other functions as a drain electrode.

In this example, part of the polycrystalline silicon film 308 which will be the regions 1904 and 1903 are covered with a resist mask and then dry etching is conducted, thereby obtaining separate source and drain regions.

The dry etching is conducted in such a manner that side etching somehow occurs. In other words, anisotropic etching including an isotropic component is conducted. Thereby, the source and drain regions are reliably separated from each other, even when the gate electrode side wall is not perpendicular to the substrate surface. When etching is conducted without side etching, if an upper portion of a gate portion is larger than a lower portion of the gate portion, the gate portion works as a mask so that the polycrystalline silicon film 308 which is intended to be removed from around the gate electrode is unlikely to be sufficiently removed.

The anisotropic etching including an isotropic component is, for example, conducted under an atmosphere which is a mixture gas of hydrogen bromide and oxygen having a pressure of 0.4 pa, using a helicon RIE apparatus. Alternatively, after anisotropic etching, isotropic etching may be additionally conducted so that the remainder of the polycrystalline silicon film 308 which is intended to be removed is removed.

With anisotropic etching including an isotropic component, a portion which it is difficult to remove by anisotropic etching can be etched. This leads to the prevention of a short circuit between the adjacent gate electrodes or between the adjacent source/drain regions due to the etching remainder of the polycrystalline silicon film 308.

Hereinafter, a relationship between an etching step of separating the source and drain regions and a specific gate cluster pattern will be described with reference to FIGS. 13 and 14.

A pad portion on which a contact is provided is required for a gate electrode. In general, a width of the pad portion needs to be greater than a width of agate electrode (gate length). In some circuit patterns, when a first gate electrode and a second gate electrode adjacent thereto are provided on a semiconductor substrate, a distance between a pad portion of the first gate electrode and a pad portion of the second gate electrode and widths of the pad portions determine a pitch between each gate electrode. An example of such a circuit pattern includes a gate array pattern having a regular gate pattern.

Figure 13:
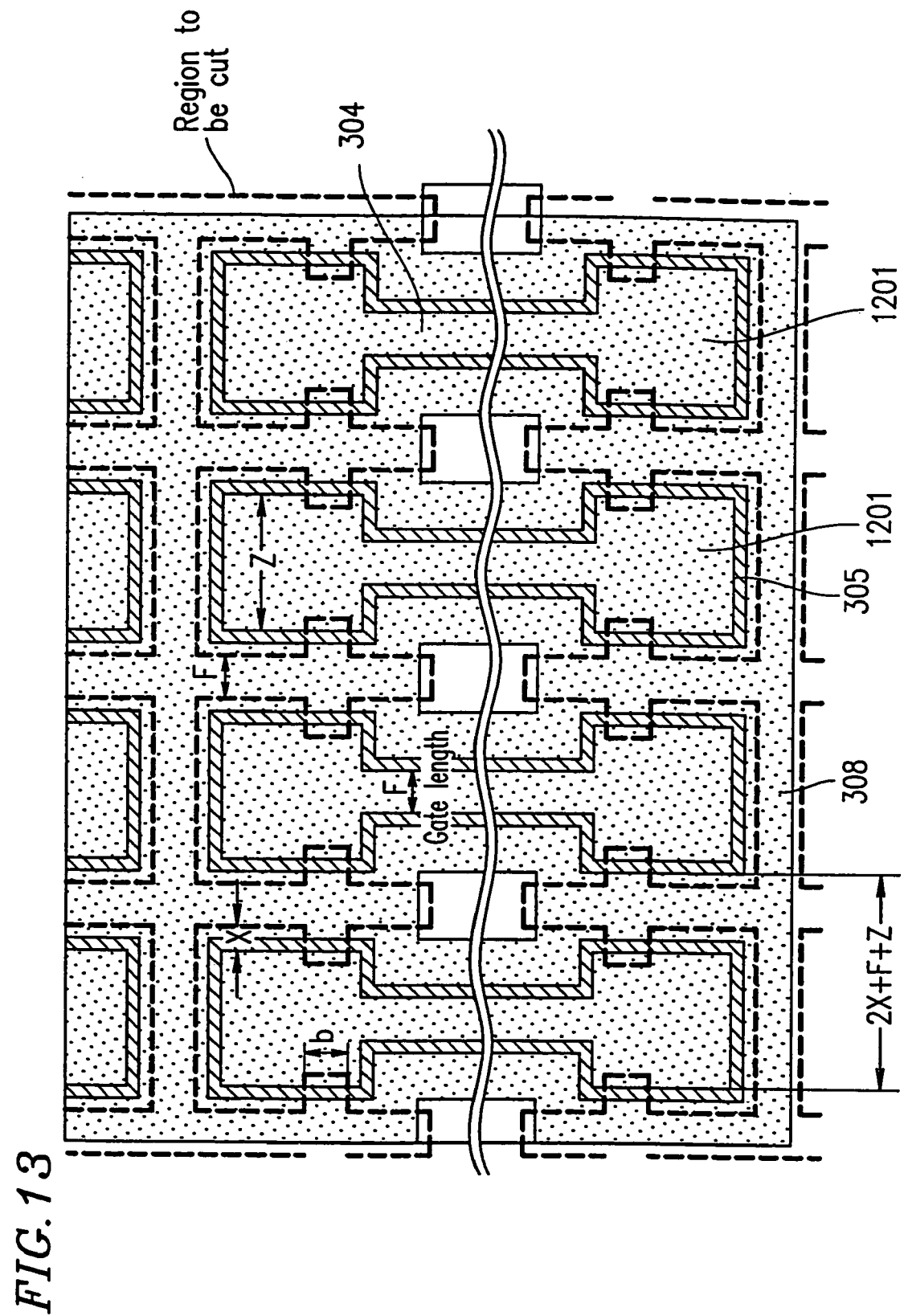
FIG. 13 is a diagram showing that a polycrystalline silicon film 308 remains around gate electrodes 304, which are arranged in arrays, via a gate electrode side wall insulating film 305.

FIG. 13 shows that a polycrystalline silicon film 308 remains around gate electrodes 304, which are arranged in arrays, via a gate electrode side wall insulating film 305. As shown in FIG. 13, when the polycrystalline silicon film 308 (source/drain region) in the shape of a side wall is provided at sides of the gate electrodes 304 by anisotropic etching back using the level difference of the gate electrode 304, the polycrystalline silicon film 308 remains around the gate electrodes 304 via the gate electrode side wall insulating film 305. Therefore, if a gap between each gate electrode pad portion 1201 is small, the polycrystalline silicon film 308 remains in the gap. Therefore, an etching step of separating a source region from a drain region in each transistor in an electrical term. In this step, the polycrystalline silicon film 308 in the shape of a side wall provided at the side of the gate electrode is divided into source and drain regions. Note that in a portion where transistors are connected in serial, adjacent source or drain regions need not be separated. An etching step of dividing the polycrystalline silicon film 308 in the shape of a side wall is not required for such a portion.

When the polycrystalline silicon film 308 is divided, at least part (region b in FIG. 13) of the polycrystalline silicon film 308 remaining between each gate electrode pad portion 1201 needs to be removed so that the source and drain regions which should be separated are not electrically connected. In this case, in the region b, the polycrystalline silicon film 308 which will be the source/drain regions and the polycrystalline silicon film 304 which will be agate electrode are removed from opposite sides of the gate side wall insulating film 305. The gate side wall insulating film 305 is considerably thin. Therefore, the distance b should be close to the minimum processable size in order to prevent the gate side wall insulating film 305 from falling down.

A step of dividing the polycrystalline silicon film 308 is referred to as a cutting step. In a photolithography step for providing a mask for the cutting step (a step of masking a region other than a region to be cut), the mask is aligned with respect to an underlying gate electrode. In this case, an alignment margin is assumed to be X. As shown in FIG. 13, when a cutting width is set to the minimum processable size F, a distance between the pad portion of the first gate electrode and the pad portion of the second gate electrode needs to be at least 2X+F. When etching in the cutting step has no selectivity with respect to the gate electrode, if etching is conducted without the margin X, even the gate electrode is etched due to poor alignment. As a result, only the gate electrode side wall insulating film remains. The gate electrode side wall insulating film is considerably thin and is therefore likely to easily fall down. Therefore, when only this film remains, a particle is likely to occur, thereby reducing the yield.

Therefore, to lay out the gate electrodes in a high density, a pitch between each gate electrode is equal to 2X+F+Z where Z is a width of the pad of the gate electrode.

Note that in the cutting step, a photolithography step is conducted in such a manner that part of the gate electrode is etched such that the gate electrode side wall insulating film does not fall down.

Figure 14:
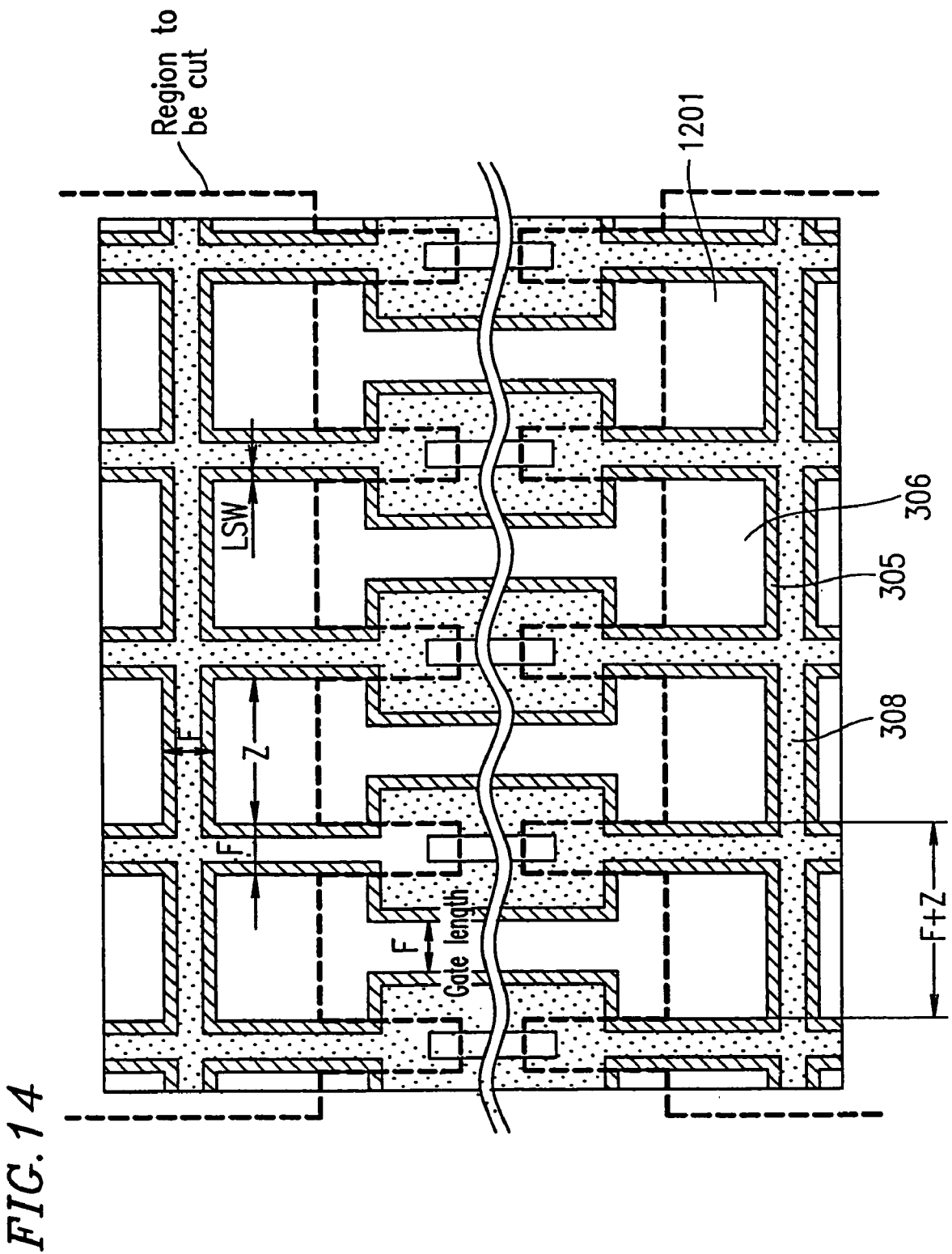
FIG. 14 is a diagram showing that a polycrystalline silicon film 308 remains around gate electrodes 304, which are arranged in arrays, via a gate electrode side wall insulating film 305.

FIG. 14 shows that a polycrystalline silicon film 308 remains around the gate electrodes 304 provided in arrays, via a gate electrode sidewall insulating film 305. In this example, before a cutting step is conducted, an upper portion of the gate electrode 305 is covered with a protection film (e.g., an oxide film 306) having a selectivity with respect to etching in the cutting step (etching for a polycrystalline silicon film). According to this technique, even when the distance between adjacent gate electrode pad portions is set to the minimum processable size F as shown in FIG. 14, the gate electrode is not etched in the cutting step. Therefore, a pitch between each gate electrode can be F+Z which leads to arrangement of the gate electrodes in a highest level of density.

Hereinafter, thermal diffusion of impurities will be described with reference to FIGS. 15 through 17.

Figure 15:
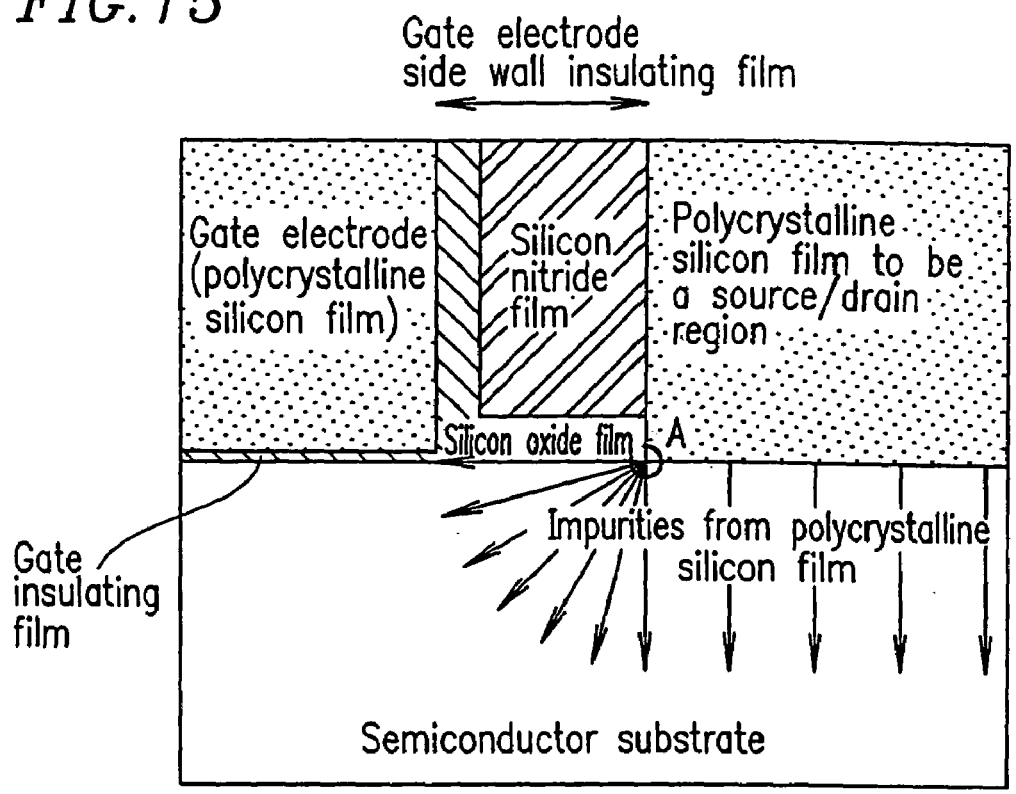
FIG. 15 is a diagram showing directions in which impurities are diffused from an impurity-implanted polycrystalline silicon film which will be the source and drain regions.

FIG. 15 shows directions in which impurities are diffused from an impurity-implanted polycrystalline silicon film which will be source and drain regions. Impurities are diffused not only downward but also horizontally. Impurities are diffused leftward from point A with respect to the drawing paper.

Figure 16:
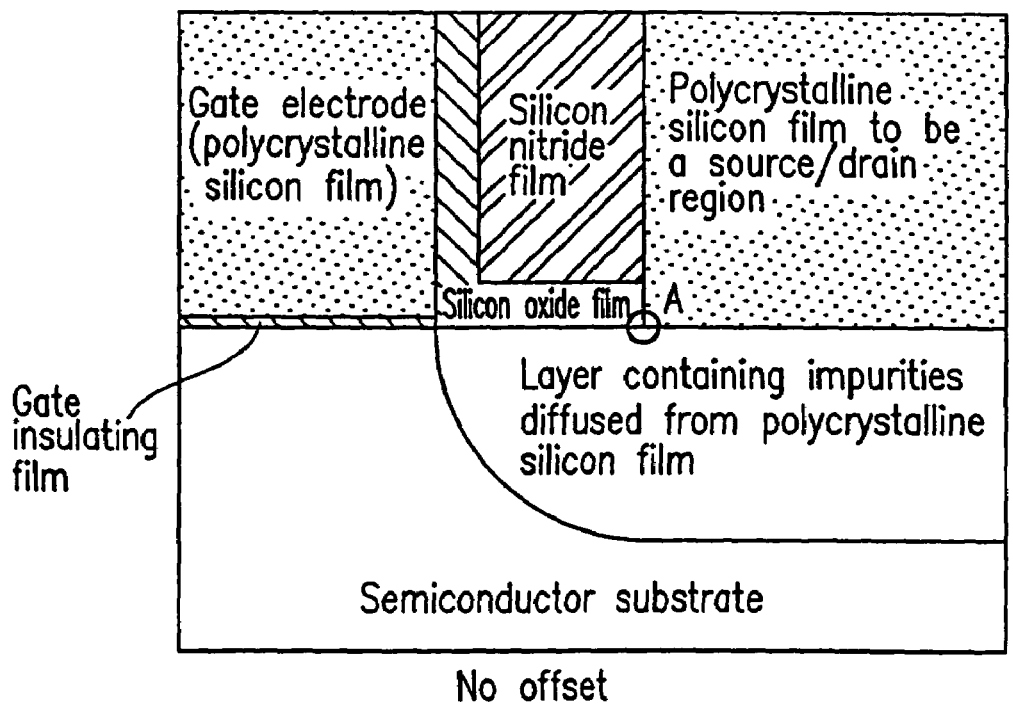
FIG. 16 is a diagram showing an example where impurities are diffused as much as an offset does not occur in a horizontal direction.

FIG. 16 shows an example where impurities are diffused as much as an offset does not occur in a horizontal direction. When impurities are thermally diffused, it is preferable to diffuse impurities as much as an offset does not occur as shown in FIG. 16. Specifically, junction depth is preferably in the range of 0.8 times a thickness of a gate electrode side wall insulating film to two times at the deepest region (in the vicinity of an isolation region).

Figure 17:
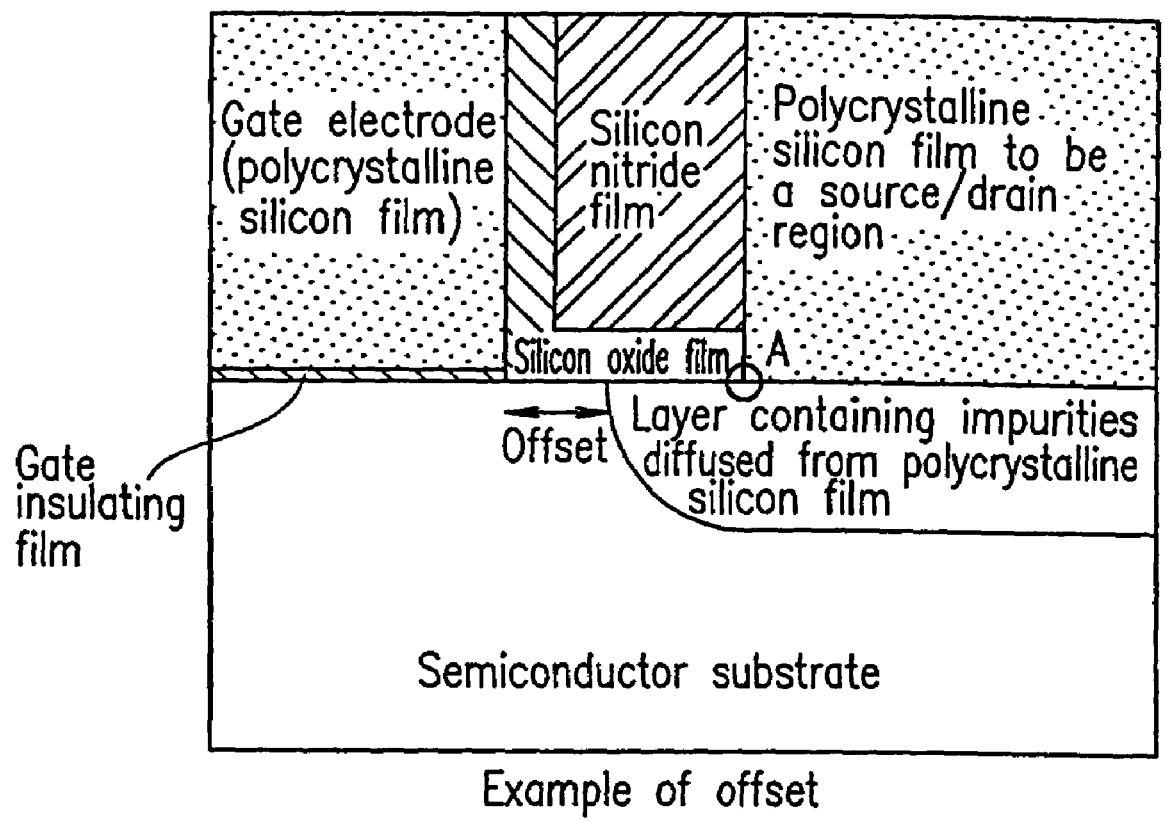
FIG. 17 is a diagram showing an impurity-diffused layer where an offset occurs.

FIG. 17 shows an impurity-diffused layer where an offset occurs. When an offset as shown in FIG. 17 occurs, a driving current in an element is significantly reduced. This is not preferable.

Hereinafter, an exemplary condition under which an offset does not occur or an offset is reduced will be described.

When impurities are diffused as much as a horizontal offset does not occur, a diffusion depth in a downward direction is uniquely determined. Therefore, to improve the performance of a transistor, a gate electrode side wall insulating film needs to be as thin as possible within the range where an increase in a capacitance of the gate electrode side wall does not lead to a significant increase in an entire load capacitance. In this example, a thickness of the gate electrode side wall insulating film is set to 0.05 μm as described above.

A specific relationship between the short channel effect and the thermal processing in this example will be described with reference to FIGS. 18 through 21.

Figure 18:
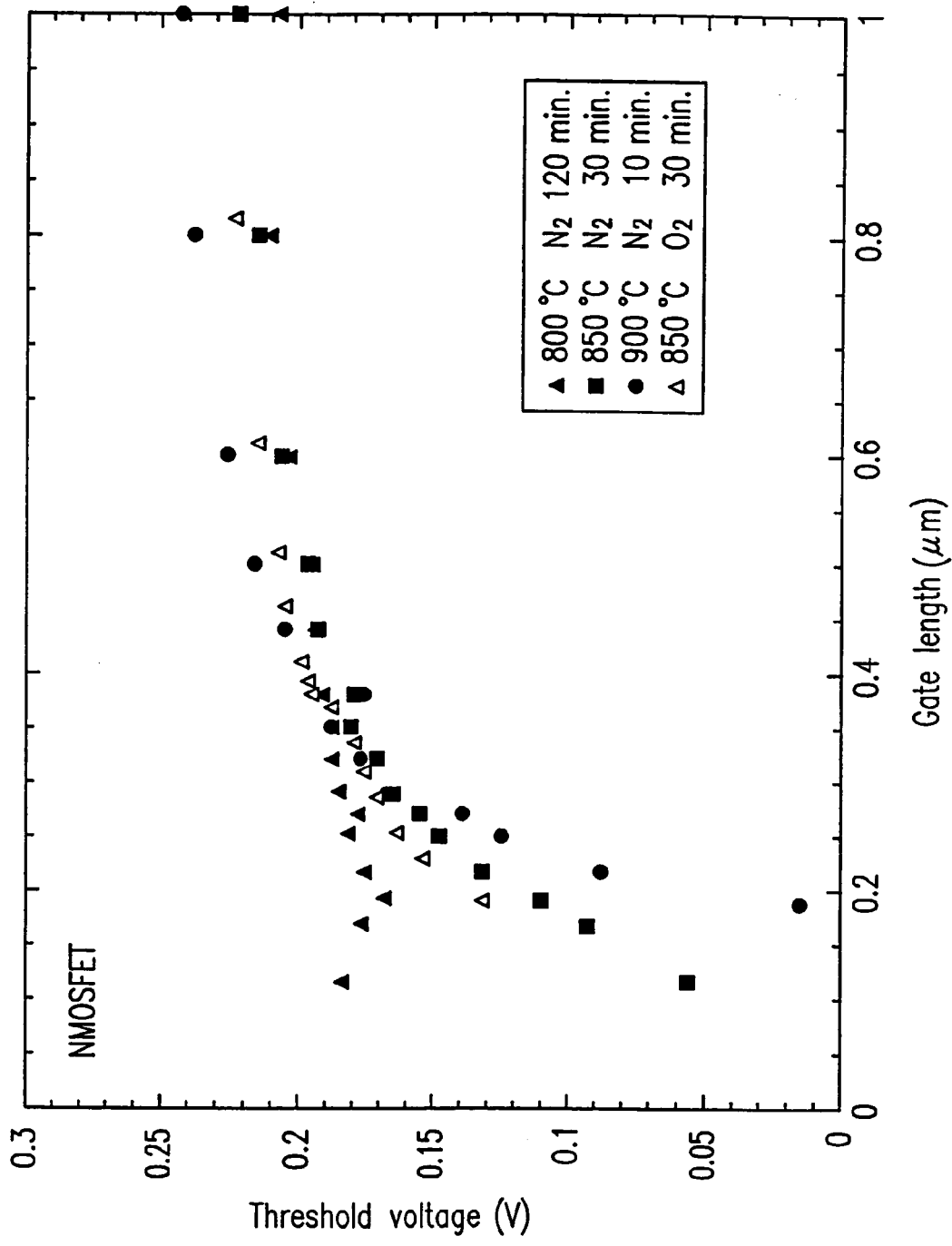
FIG. 18 is a diagram showing a relationship between a gate length and a threshold voltage of an N-channel transistor.

FIG. 18 shows a relationship between a gate length and a threshold voltage of an N-channel transistor. In an example shown in FIG. 18, phosphorous ions for providing source and drain regions are implanted at an implantation energy of 50 KeV at a dose of $5 \times 10^{15}/cm^2$. Thermal processings are conducted under respective conditions, i.e., in an atmosphere of nitrogen gas at a temperature of 800° C. for 120 minutes, in an atmosphere of nitrogen gas at a temperature of 850° C. for 30 minutes, in an atmosphere of nitrogen gas at a temperature of 900° C. for 10 minutes, and in an atmosphere of oxygen gas at a temperature of 850° C. for 30 minutes.

As can be seen from a result shown in FIG. 18, regarding a transistor where the gate electrode side wall insulating film is about 0.05 μm thick and the gate length is about 0.24 μm, when phosphorous ions are implanted at an implantation energy of 50 KeV at a dose of $5\times10^{15}/cm^2$, optimal conditions for a thermal processing are as follows: an atmosphere is nitrogen gas, a temperature is 850° C., and a time is 30 minutes; an atmosphere is oxygen gas, a temperature is 850° C., and a time is 30 minutes; or an atmosphere is nitrogen gas, a temperature is 900° C., and a time is 10 minutes. A thermal processing under conditions where an atmosphere is nitrogen gas, a temperature is 800° C., and a time is 120 minutes is insufficient, thereby producing an undesirable offset transistor.

Figure 19:
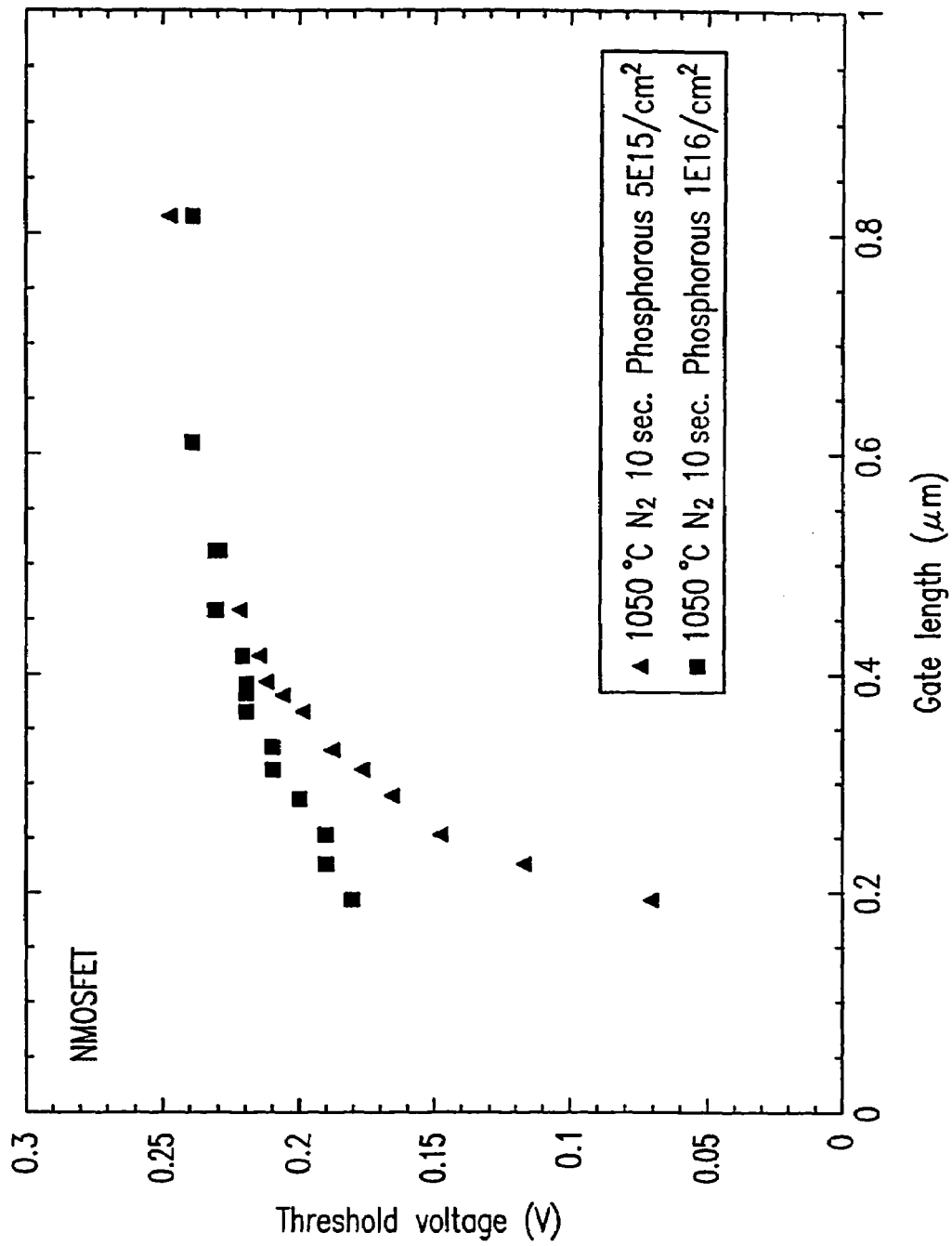
FIG. 19 is a diagram showing a relationship between agate length and a threshold voltage of an N-channel transistor.

FIG. 19 shows a relationship between a gate length and a threshold voltage of an N-channel transistor. In an example shown in FIG. 19, phosphorous ions for providing source and drain regions are implanted at an implantation energy of 50 KeV at a dose of $5\times10^{15}/cm^2$ and $1\times10^{16}/cm^2$, respectively. A rapid thermal processing is conducted in an atmosphere of nitrogen gas at a temperature of 1050° C. for 10 seconds.

As can be seen from a result shown in FIG. 19, when the dose is changed from $5\times10^{15}/cm^2$ to $1\times10^{16}/cm^2$, a satisfactory result can be obtained in the thermal processing conducted in an atmosphere of nitrogen gas at a temperature of 1050° C. for 10 seconds, due to an influence of enhanced diffusion of high-concentration impurities. When the dose is $5\times10^{15}/cm^2$, diffusion is insufficient in the thermal processing conducted in an atmosphere of nitrogen gas at a temperature of 1050° C. for 10 seconds, and thus an undesirable offset transistor is obtained.

Figure 20:
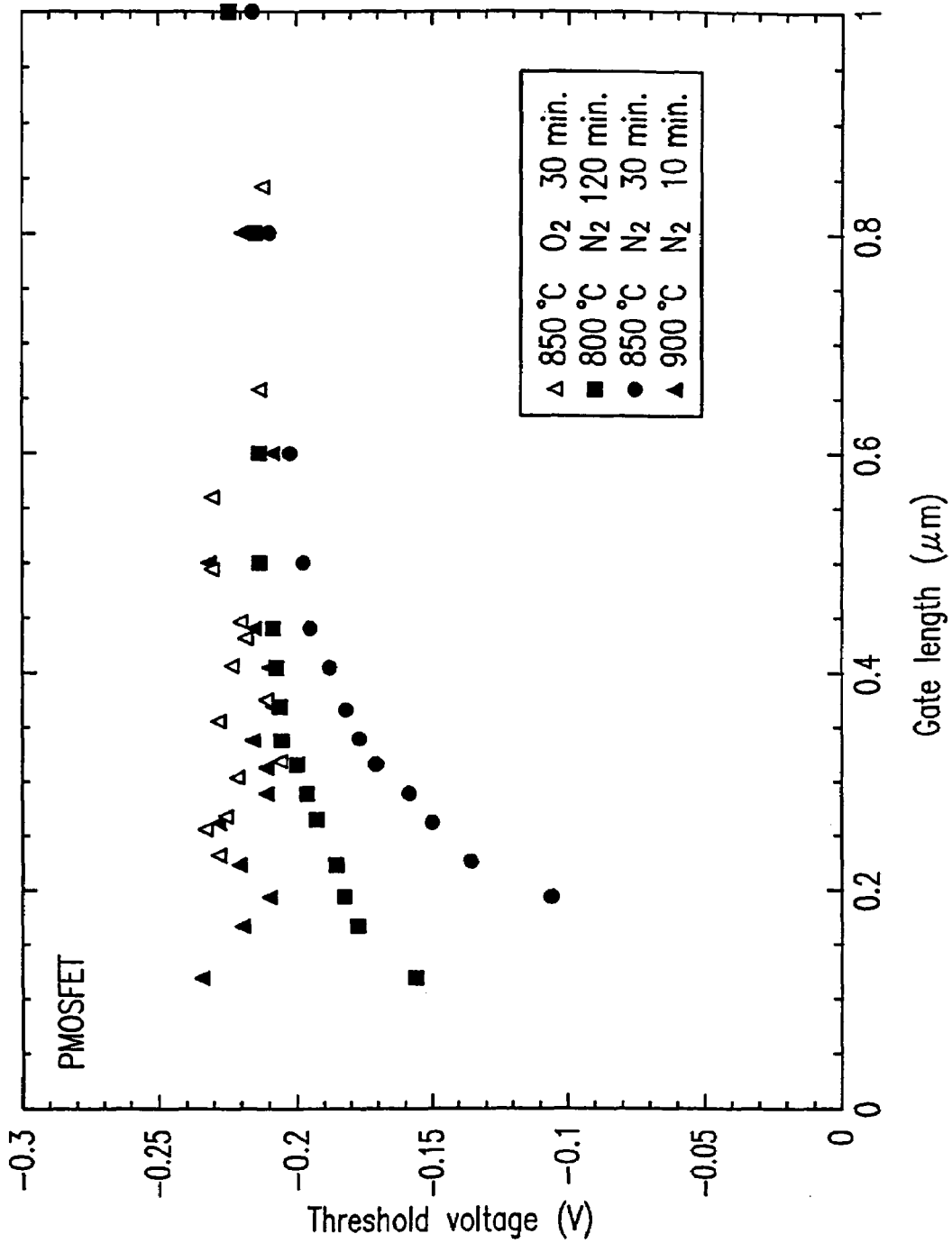
FIG. 20 is a diagram showing a relationship between a gate length and a threshold voltage of a P-channel transistor.

FIG. 20 shows a relationship between a gate length and a threshold voltage of a P-channel transistor. In an example shown in FIG. 20, boron ions for providing the source and drain regions are implanted at an implantation energy of 15 KeV at a dose of $5\times10^{15}/cm^2$. Thermal processings are conducted under respective conditions, i.e., in an atmosphere of nitrogen gas at a temperature of 800° C. for 120 minutes, in an atmosphere of nitrogen gas at a temperature of 850° C. for 30 minutes, in an atmosphere of nitrogen gas at a temperature of 900° C. for 10 minutes, and in an atmosphere of oxygen gas at a temperature of 850° C. for 30 minutes.

As can be seen from a result shown in FIG. 20, in a P-channel transistor, when boron ions are implanted at an implantation energy of 15 KeV at a dose of $5\times10^{15}/cm^2$, optimal conditions for the thermal processing are as follows: an atmosphere is nitrogen gas, a temperature is 850° C., and a time is 30 minutes; or an atmosphere is nitrogen gas, a temperature is 900° C., and a time is 10 minutes. A thermal processing under conditions where: an atmosphere is nitrogen gas, a temperature is 800° C., and a time is 120 minutes; or an atmosphere is oxygen gas, a temperature is 850° C., and a time is 30 minutes is insufficient, thereby producing an undesirable offset transistor.

Figure 21:
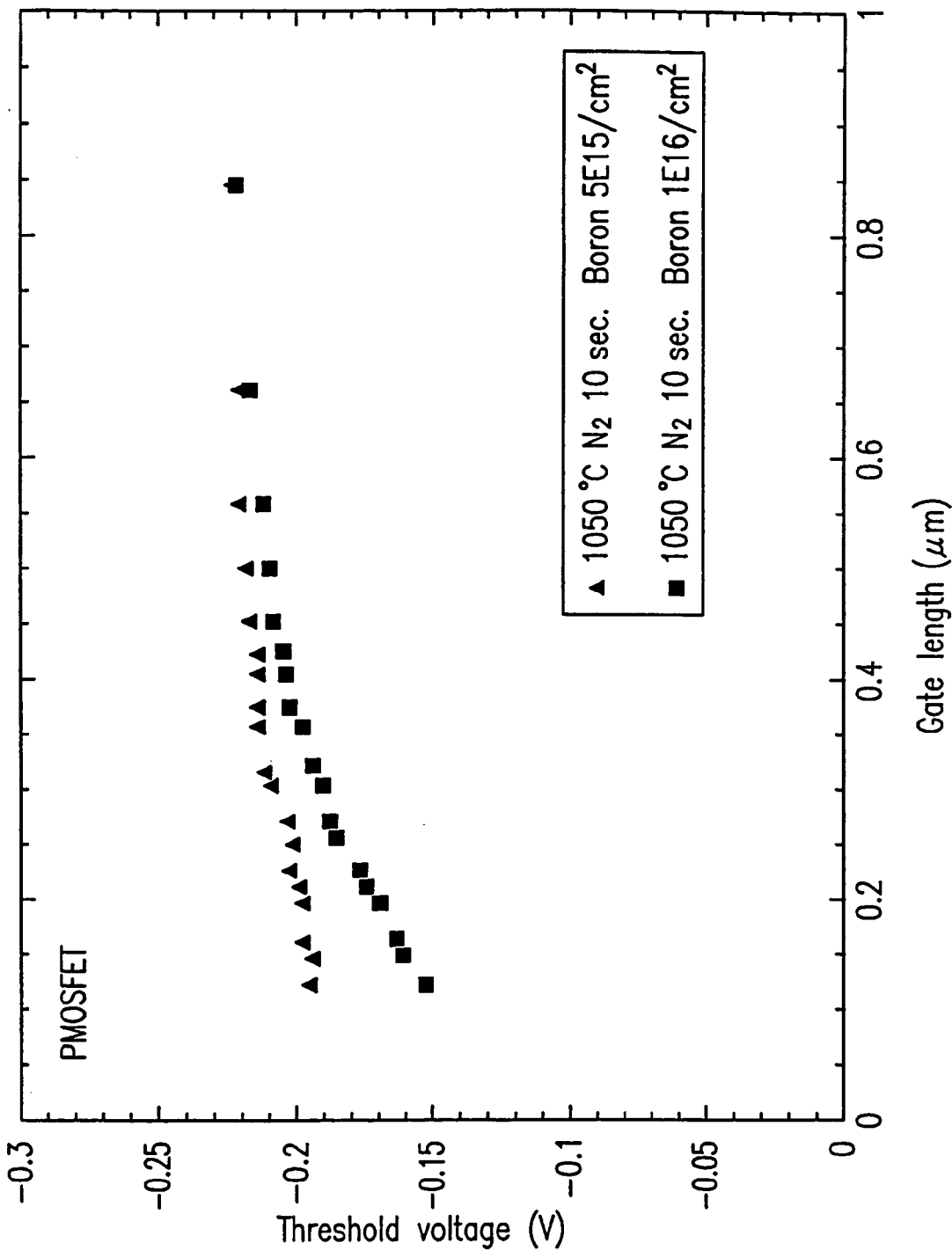
FIG. 21 is a diagram showing a relationship between a gate length and a threshold voltage of a P-channel transistor.

FIG. 21 shows a relationship between a gate length and a threshold voltage of a P-channel transistor. In an example shown in FIG. 21, boron ions for providing the source and drain regions are implanted at an implantation energy of 15 KeV at a dose of $5\times10^{15}/cm^2$ and $1\times10^{16}/cm^2$, respectively. A rapid thermal processing is conducted in an atmosphere of nitrogen gas at a temperature of 1050° C. for 10 seconds.

As can be seen from a result shown in FIG. 21, when the dose is changed from $5\times10^{15}/cm^2$ to $1\times10^{16}/cm^2$, the boron diffusion is insufficient, thereby resulting in an undesirable offset transistor.

According to the above-described results, the inventors have found that for a gate electrode side wall insulating film having a thickness of 0.06 μm, when a single thermal processing is conducted for impurity diffusion in an N-channel transistor and a P-channel transistor, optimal conditions are as follows: an atmosphere is nitrogen gas, a temperature is 850° C., and a time is about 30 minutes; or an atmosphere is nitrogen gas, a temperature is 900° C., and a time is about 10 minutes.

In this example, the doping of a gate electrode and the doping of a source/drain region are simultaneously conducted. Therefore, it is important to design conditions which improve the performance of a transistor (the short channel effect is unlikely to occur and a driving current is large) in addition to satisfaction of conditions under which depletion of a gate electrode is prevented in the vicinity of a gate insulating film and impurities are prevented from penetrating into a channel region (these conditions are dependent on the thickness TG of a gate polycrystalline silicon film).

Thus, some parameters are closely related with each other, and therefore it seems to be difficult to obtain optimal conditions. However, the inventors have successfully obtained a considerably large margin for processing conditions by designing a large diffusion coefficient of the accumulated layer 308 (FIG. 9(*c*)) with respect to a diffusion coefficient in a silicon substrate (single crystalline silicon). Specifically, if $\tfrac{2}{3}\times F \leq LSW+LA \leq \tfrac{4}{3}\times F \cong LG+LSW$, $LSD \geq LG+LSW$, $TSDmax > TG$, $TSW > LA$, and $LSW+LA > TG$ are satisfied while a driving current is increased, a short channel effect is suppressed, the occupied areas of elements are minimized as much as the elements can be processed, processing conditions of the ion implantation and the thermal processing can be designed while maintaining large margins. Note that for the two source/drain regions 308 provided on opposite sides of the gate electrode 304, one of the two functions as a source region and the other functions as a drain region. At least one of the source and drain regions is designed in such a manner as to satisfy the above-described conditions.

In this example, impurities which will be donors or acceptors are simultaneously implanted into a layer which will be a gate electrode, a layer which will be a source region, and a layer which will be a drain region. Therefore, a photolithography step or an implantation step for introducing impurities into a gate electrode is not additionally required. The procedure can thus be simplified, thereby reducing manufacturing cost.

Hereinafter, it will be described that the method of this example is superior to a conventional method in which an accumulated diffusion layer (accumulated layer) is made of an epitaxial silicon layer.

As described above, the structure of this example as well as a conventional structure in which an accumulated layer is made of an epitaxial silicon layer are such that the impurities are diffused from an accumulated layer into a solid layer so as to provide shallow source and drain junctions. In such a structure, the conditions of the ion implantation and the thermal processing are changed depending on a height of a gate electrode, a height of an accumulated region, a thickness of a gate electrode side wall insulating film, and the like. In this example, the accumulated layer is made of a polycrystalline silicon film. Polycrystalline silicon can have a diffusion coefficient of impurities about 10 to about 100 times that of silicon single crystal (a diffusion coefficient is dependent on a grain size of a polycrystalline silicon film. The smaller the grain size, the larger the diffusion coefficient). The diffusion coefficient is preferably as large as possible, compared with the diffusion coefficient of a semiconductor substrate. If the diffusion coefficient is sufficiently large, compared with the diffusion coefficient of a semiconductor substrate, an impurity concentration becomes uniform over a polycrystalline silicon film in a sufficiently short time as compared to a time which it takes for impurities to be introduced from a polycrystalline silicon film to a single crystalline silicon film until a junction depth reaches a predetermined value. Therefore, even if there are somehow variations in a height of the polycrystalline silicon film of the accumulated layer, a time which it takes for impurities to be introduced from the polycrystalline silicon film to the silicon substrate so as not to produce an offset with respect to a channel region is sufficiently short compared with a time which it takes for the concentration of impurities in the silicon film to become uniform (a time which it takes for the concentration of the polycrystalline silicon film to be sufficiently increased in the vicinity of the silicon substrate). Therefore, variations in a height of a polycrystalline silicon film have a negligible influence on junction depth. Further, margins in ion implantation and a thermal processing can be increased.

Diffusing impurities from a polycrystalline silicon film into a silicon substrate so as not to produce an offset with respect to a gate electrode, means that the impurities are horizontally diffused in the silicon substrate by at least an amount corresponding to a thickness of a gate electrode side wall insulating film. This is because the gate electrode side wall insulating film exists between the gate electrode and the polycrystalline silicon film. Specifically, impurities may be introduced into only a polycrystalline silicon film using a technique of introducing impurities by an ion implantation step. In this case, impurities are distributed in the polycrystalline silicon film in accordance with a Gaussian distribution of ion implantation energy. The ion implantation energy is designed so that an impurity concentration of the vicinity of the gate electrode at an interface between the polycrystalline silicon film and a single crystalline semiconductor substrate is $10^{-2}$ to $10^{-5}$ times a peak impurity concentration. The reason the conditions of the ion implantation is determined in accordance with the impurity concentration of the vicinity of the gate electrode, is that the junction depth of a source/drain region in that vicinity has the largest influence on a short channel effect.

In a conventional method of providing an accumulated layer made of an epitaxial silicon film, there is a large difference in diffusion coefficient between a gate polycrystalline silicon film and the accumulated layer. Therefore, it is substantially impossible to design conditions which improve the performance of a transistor (the short channel effect is unlikely to occur and a driving current is large) in addition to satisfaction of conditions under which depletion of a gate electrode is prevented in the vicinity of a gate insulating film and the impurities are prevented from penetrating into a channel region. The reason is as follows. Impurities in a gate polycrystalline silicon film are much easily diffused as compared with impurities in an accumulated layer and a semiconductor single crystalline substrate. Therefore, if the impurities are diffused under conditions where an offset does not occur in a transistor, the impurities (e.g., boron) penetrate through a gate oxide film. If diffusion is conducted under conditions where boron does not penetrate through a gate oxide film, an offset occurs in a transistor.

In the method of providing a source/drain region by diffusing impurities, by thermal diffusion, from a polycrystalline silicon film (an accumulated layer) having a large diffusion coefficient to a single crystalline silicon (a semiconductor substrate) having a small diffusion coefficient, the impurities are instantaneously diffused up to an interface between a surface of an active region of the semiconductor substrate and the polycrystalline silicon film accumulated, but the impurities are slowly diffused from the interface into the silicon substrate. Therefore, even when the accumulated layer and a gate electrode are not simultaneously doped, variations in a height of the accumulated layer, variations in a projected range (Rp) upon impurity ion implantation, and the like are relaxed, thereby obtaining a uniform source/drain junction depth. When a single crystalline epitaxial silicon film is grown on an active region, since the diffusion coefficient of impurities in the single crystalline epitaxial silicon film accumulated is substantially equal to the diffusion coefficient of the semiconductor substrate, variations in a height of the accumulated layer and variations in a projected range (Rp) upon impurity ion implantation lead to variations in a source/drain junction depth, resulting in variations in the transistor characteristics.

When an accumulated layer and a gate electrode are not simultaneously doped, a method described later in Example 5, a method including doping impurities having the same conductivity into all gates by diffusion of phosphorous, and the like are used, for example. In this case, a P-channel transistor is a buried-channel type transistor.

Further, in the present invention, ions are not implanted directly into an active region, so that the active region is not likely to be damaged.

Hereinafter, it will be described with reference to FIGS. 22(a) and 22(b) that the occupied area of a transistor can be reduced in a semiconductor device in this example.

Figure 22A:
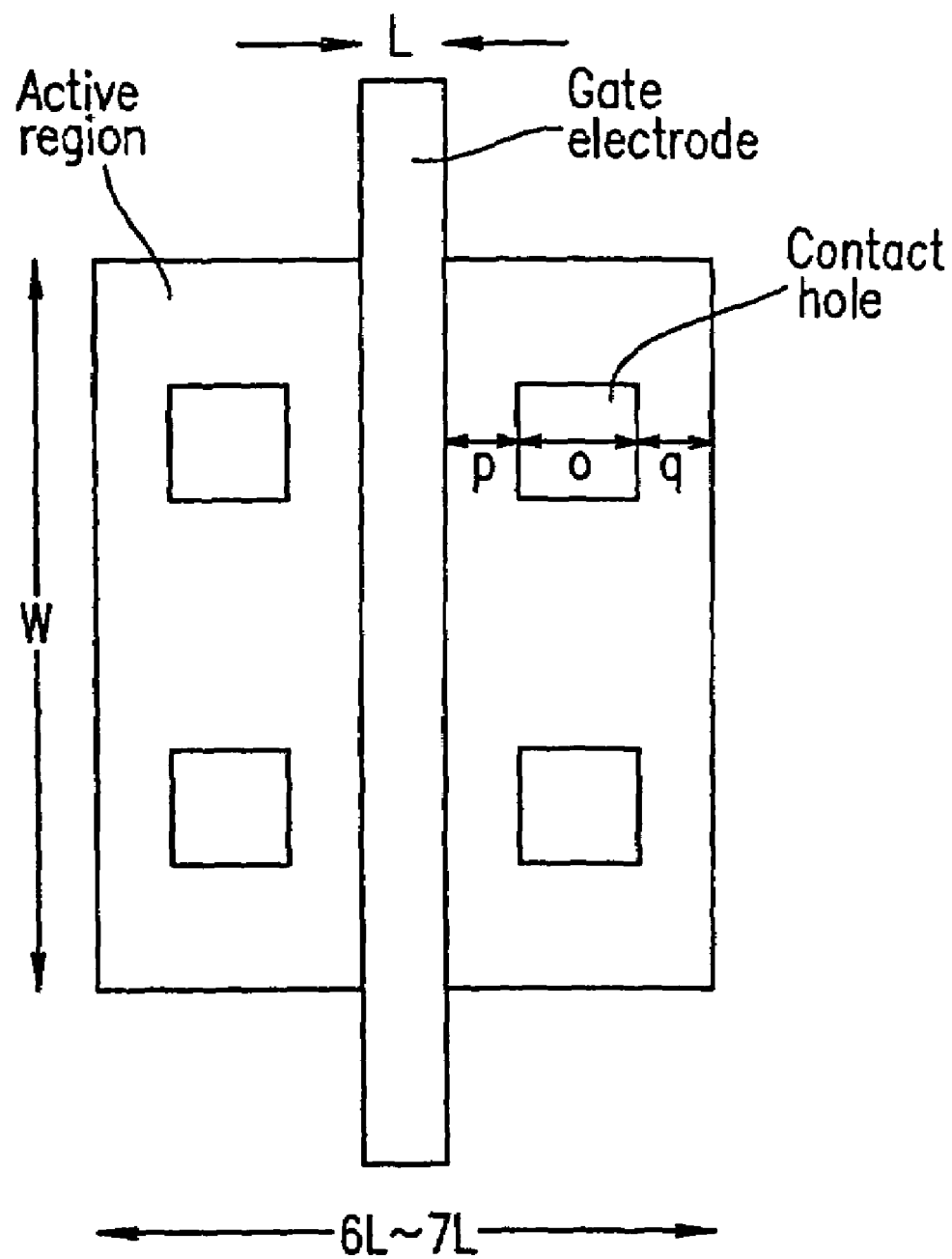
FIG. 22(*a*) is a top plan view showing a semiconductor substrate of a conventional semiconductor device shown in FIG. 43(*c*).
Figure 43A:
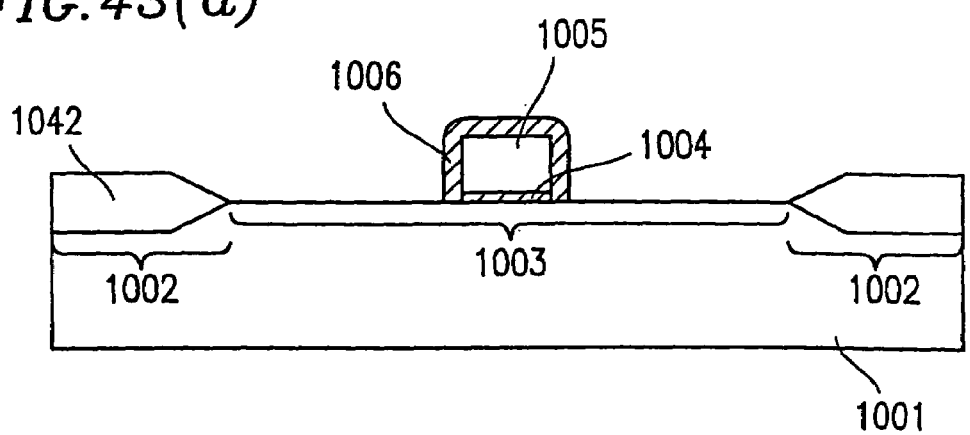
FIGS. 43(*a*) through (*c*) are diagrams showing the steps of producing a conventional accumulated diffusion layer.
Figure 43B:
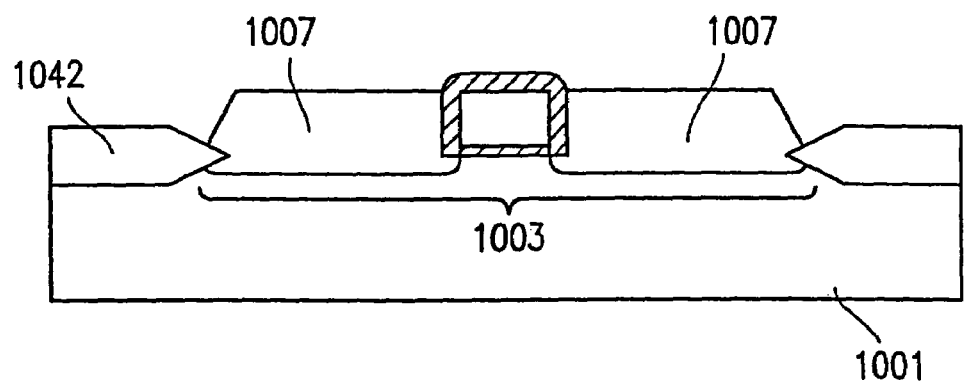
Figure 43C:
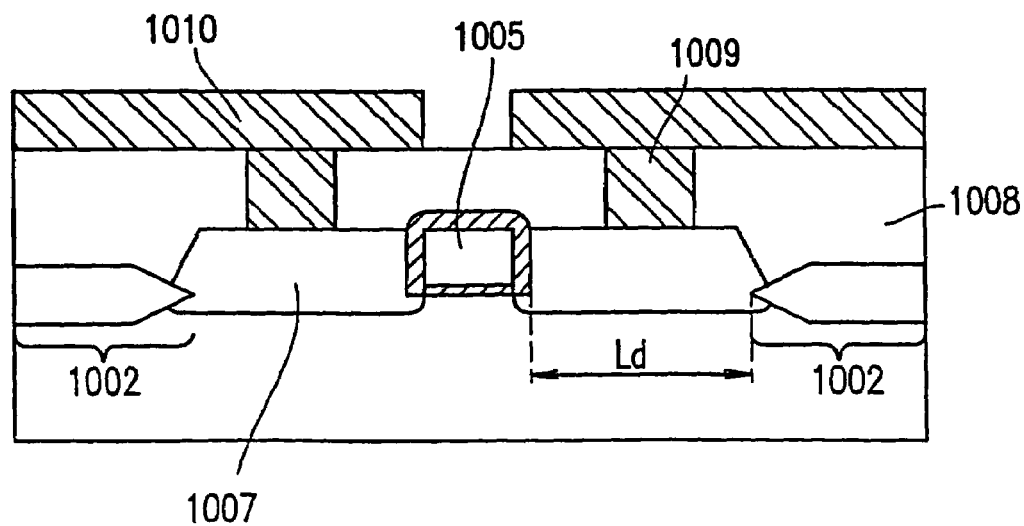

FIG. 22(a) is a top plan view of a semiconductor substrate of a conventional semiconductor device shown in FIG. 43(c). FIG. 22(b) is a top plan view of a semiconductor substrate of a semiconductor device according to this example.

In a transistor element shown in FIG. 22(a), a gate length is represented by L and a gate width is represented by W. The gate length L is typically designed to be equal to a minimum processable size F. A margin between a gate electrode and an isolation region (a region outside the active region) needs to be about 2.5L to about 3L. The margin is the sum of the opening diameter of a contact and an alignment margin p for avoiding a short circuit between the contact and the gate electrode and an alignment margin q for preventing the contact from contacting the isolation region. The occupied area of the active region shown in FIG. 22(a) is equal to (2.5L×2+L to 3L×2+L)×W, i.e., 6LW to 7LW.

Figure 22B:
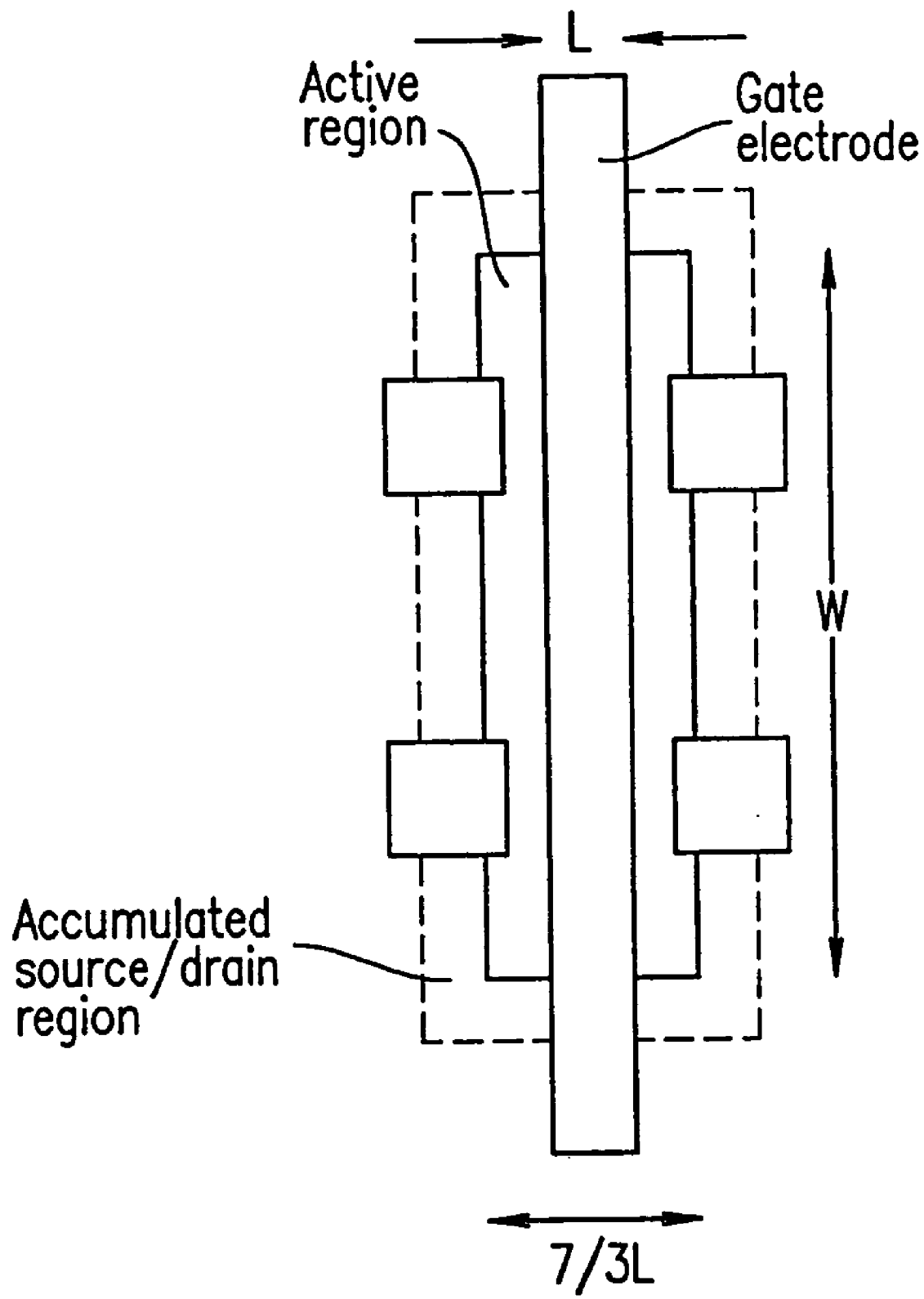

The margin between the gate electrode and the isolation region shown in FIG. 22(b) fluctuates depending on a gate electrode side wall insulating film width LSW, but may be about ⅔L as described above (specifically, LA=0.16 μm to 0.18 μm where F=0.24 μm). The occupied area of the active region of the semiconductor device of the present invention is (⅔L×2+L)×W, i.e., 7/3LW. The occupied area of the active region of the semiconductor device of the present invention is 7/18 to ⅓ of the occupied area of the active region shown in FIG. 22(a), i.e. the active region of the present invention can be reduced. Note that the entire LSI is constrained by a conductor pitch, a contact pitch, and the like. Therefore, the chip area of the actually produced LSI of the present invention is not necessarily about 7/18 to about 1/3 of the chip area of a conventional LSI.

Further, in this example, a junction parasitic capacitance can be reduced to about 4/15 to about 2/9 of that of a conventional semiconductor element.

Example 4

In Example 3, a cutting step for obtaining separate source and drain region is conducted after processing a gate electrode. When the pad portions of adjacent gate electrodes are separated by the minimum processable size F from each other, an actual gap between the pad portions of adjacent gate electrodes (a distance between the gate electrode sidewall insulating films of the pad portions of adjacent gate electrodes) is F−2×LSW where LSW is a width of the gate electrode side wall insulating film. For example, if LSW is about 1/4×F, the actual gap between the pad portions of adjacent gate electrodes is considerably small, i.e., about 1/2×F. In this gap, a conductive film which will be a source/drain region is buried. If there is a demand for further miniaturization in the future, it will be considerably difficult to remove the buried conductive film by etching in a cutting step. For example, when a device is designed in accordance with the 0.25 μm rule, a gap between the pad portions of adjacent gate electrodes is about 0.13 μm, so that the conductive film can be removed by etching. In contrast, when a device is designed in accordance with the F=0.1 μm rule, a gap between the pad portions of adjacent gate electrodes is about 0.05 μm or less. This is because when F is small, it is difficult to obtain a gate electrode side wall insulating film width LSW as thin as about 1/4×F. Therefore, it is difficult to completely remove the conductive film from the gap. An experiment conducted by the inventors has demonstrated that when the distance between the pad portions of adjacent gate electrodes is set to the minimum processable size in accordance with the F=0.1 μm rule, it was difficult to obtain a high yield of separate source and drain regions. Therefore, an increased margin between the pad portions of adjacent gate electrodes is required to improve the yield.

Figure 23:
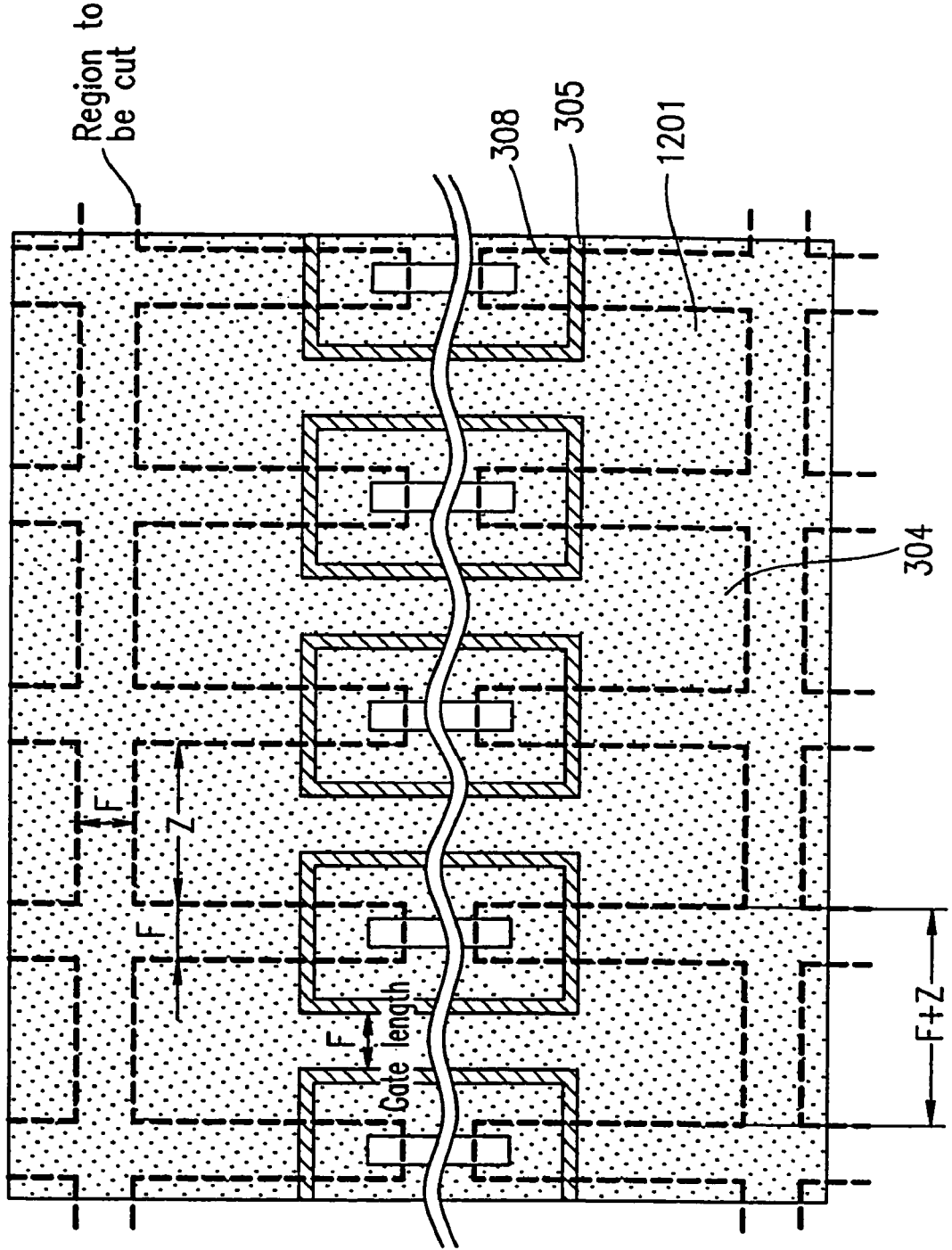
FIG. 23 is a diagram showing that a polycrystalline silicon film 308 remains around gate electrodes 304, which are arranged in arrays, via a gate electrode side wall insulating film 305.

FIG. 23 shows that a polycrystalline silicon film 308 remains around gate electrodes 304, which are arranged in arrays, via a gate electrode side wall insulating film 305. A cutting step is conducted along a thick broken line shown in FIG. 23.

A method of this example is the same as that described above in Example 3, except a difference in a mask pattern used upon formation of a gate electrode pattern. In this example, only regions constituting a gate length are etched upon formation of a gate electrode pattern.

Specifically, in a step of providing a first non-insulating film (which will be a gate electrode) with a desired pattern by patterning, the pad of a first gate electrode is not yet separated from the pad of a second gate electrode. Note that the term "non-insulating film" means a conductor or semiconductor film.

A first non-insulating film and a second non-insulating film (which will be a source/drain region) are patterned by selectively etching with respect to a side wall insulating film to provide a layer which will be a gate electrode, a layer which will be a source region, and a layer which will be a drain region. In such a step, the pad of the first gate electrode and the pad of the second gate electrode are first separated from each other, and a sidewall (the second non-insulating film) is divided into separate source and drain regions.

In this example, before the cutting step (FIG. 12) in Example 3, the oxide film 306 (first insulating pattern) on the gate electrode (first non-insulating pattern) is removed. Thereafter, in the cutting step, part of the gate electrode 304 is also etched to separate the pad portions of adjacent gate electrodes. Therefore, it is possible to provide a gap having a width equal to the minimum processable size between the pad portions of adjacent gate electrodes.

When an insulating film (the oxide film 306 shown in FIG. 9(c)) is provided on a gate electrode, a height of the gate electrode can be lower than that of a gate electrode side wall insulating film. Further, in this example, it is possible to reduce a pitch of the gate electrodes arranged in the highest density up to F+Z while a height TSDmax of a region where a side wall (polycrystalline silicon film) which will be a source/drain region contacts a gate electrode side wall insulating film is higher than that of the gate electrode.

In other words, in this example, the pads of adjacent gate electrodes are first separated from each other by selectively etching with respect to a side wall insulating film (cutting step). Therefore, it is possible to provide a gap having a width (minimum separation width) equal to the minimum processable size F between the pad portions of adjacent gate electrodes. A pitch of gate electrodes arranged in the highest density can be set to F+Z as described above. Even when an insulating film (oxide film 306) is provided on a gate electrode in the step of providing a gate electrode side wall insulating film at an upper portion of the gate electrode, it is possible to provide a gap having a width equal to the minimum processable size between the pad portions of adjacent gate electrodes. In further miniaturization, it is possible to provide a gap, which has a width equal to the minimum processable size in an adopted rule, between the pad portions of adjacent gate electrodes.

In this example, a gate electrode side wall insulating film is provided at a gate electrode side wall in a region of a gate electrode which constitutes a gate length of a transistor. A gate electrode side wall insulating film is not provided at a gate electrode sidewall in part of a region of the gate electrode which does not constitute the gate length of the transistor.

Figure 24:
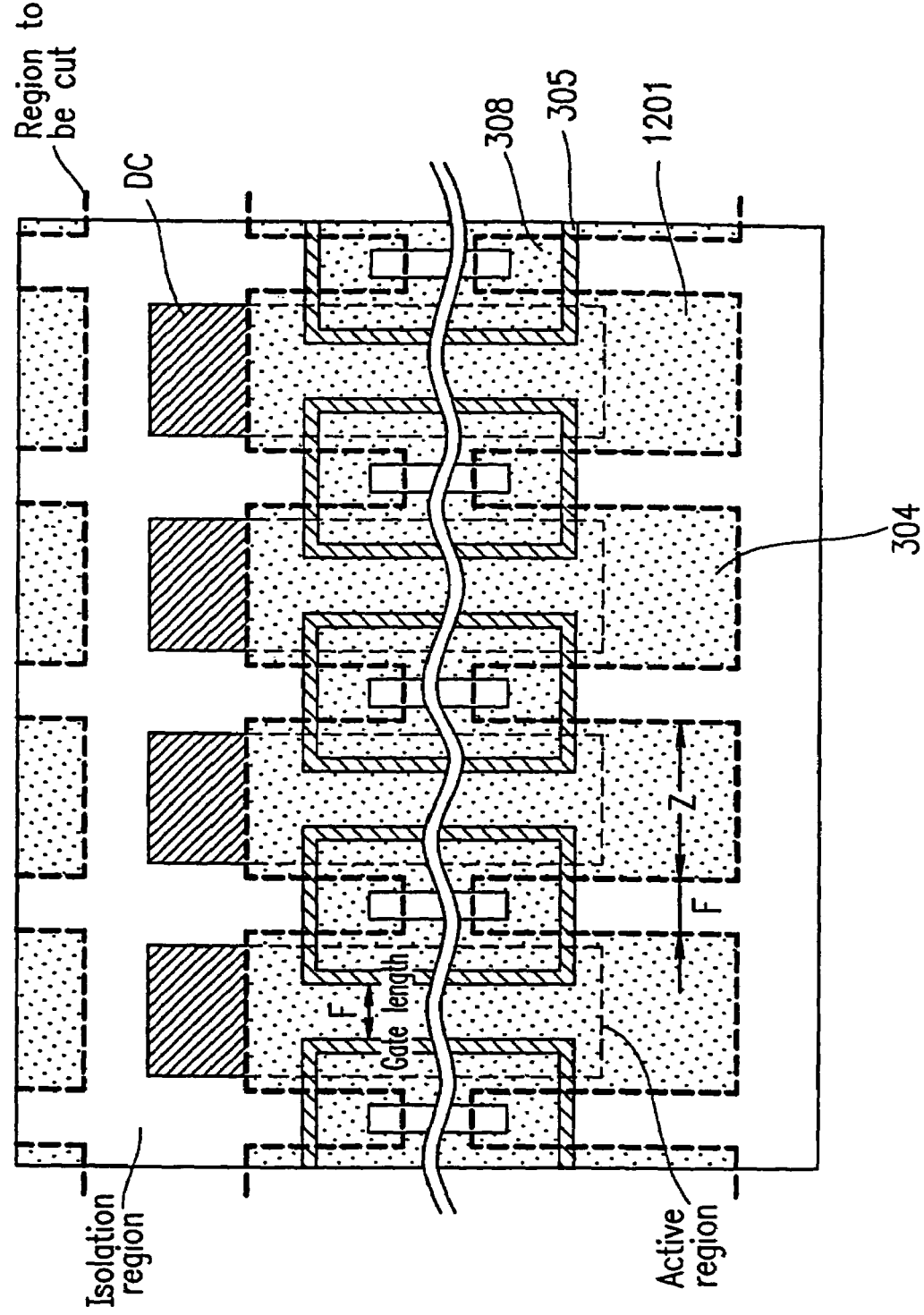
FIG. 24 is a diagram showing a state of a semiconductor substrate according to Example 4 of the present invention after a cutting step.

FIG. 24 shows a state of the semiconductor substrate of Example 4 after the cutting step. As described in FIG. 24, when a self-aligned silicide step (salicide step) is adopted for a gate region, a source region, and a drain region, if a cutting step is conducted before the silicide step, a film having a desired pattern which will be a gate electrode pad on an active region can be obtained.

A region on an active region from which a conductive film (first conductive film) is removed in a cutting step is called a region DC. The region DC is hatched in FIG. 24. In this example, a gate insulating film within the region DC is removed by washing before the salicide step.

Figure 25:
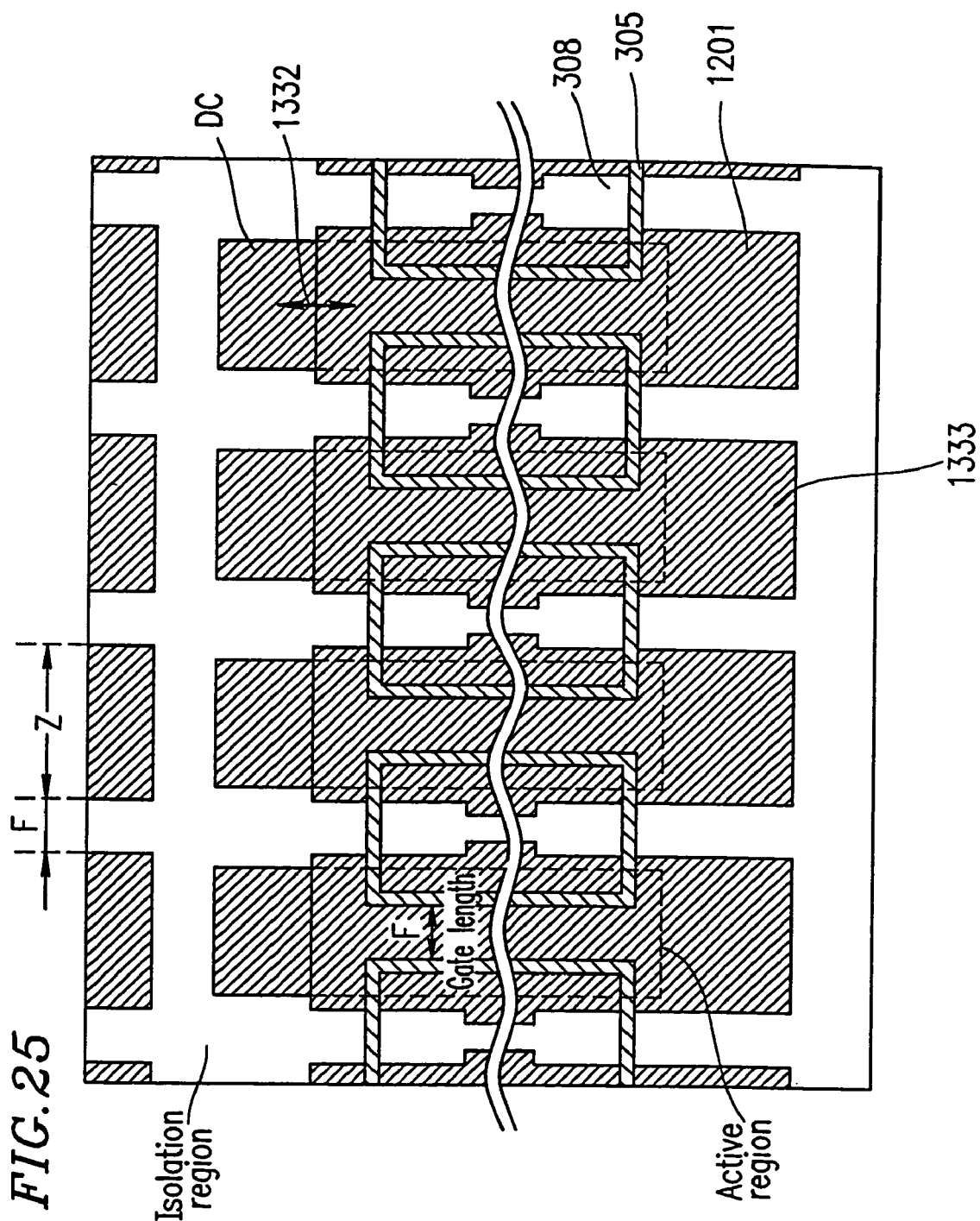
FIG. 25 is a diagram showing a state of the semiconductor substrate of Example 4 after a salicide step.

FIG. 25 shows a state of the semiconductor substrate of Example 4 after a silicide step. As shown in FIG. 25, a self-aligned silicide film is provided on a region DC as well as a gate region, a source region, and a drain region. Thereby, a short circuit is established, in a self-aligned manner, between the region DC and a film which will be the pad portion of a gate electrode via a silicide film 1333 (arrow 1332).

As described above, in this example, a short circuit is established between a gate electrode and a semiconductor substrate (typically, a well region having a conductivity opposite to that of the source and drain regions, provided on a semiconductor substrate). As a result, the procedure can be simplified, resulting in a reduction in cost and an improvement in the yield.

Example 5

Hereinafter, a method for producing a semiconductor device according to Example 5 of the present invention will be described.

FIGS. 26(a) through 26(g) are diagrams showing steps of producing the semiconductor device 1401 of Example 5 of the present invention. In this example, a gate electrode is made of a refractory metal or a polycrystalline silicon film. Hereinafter, each step shown in respective FIGS. 26(a) through 26(g) will be described.

Figure 26A:
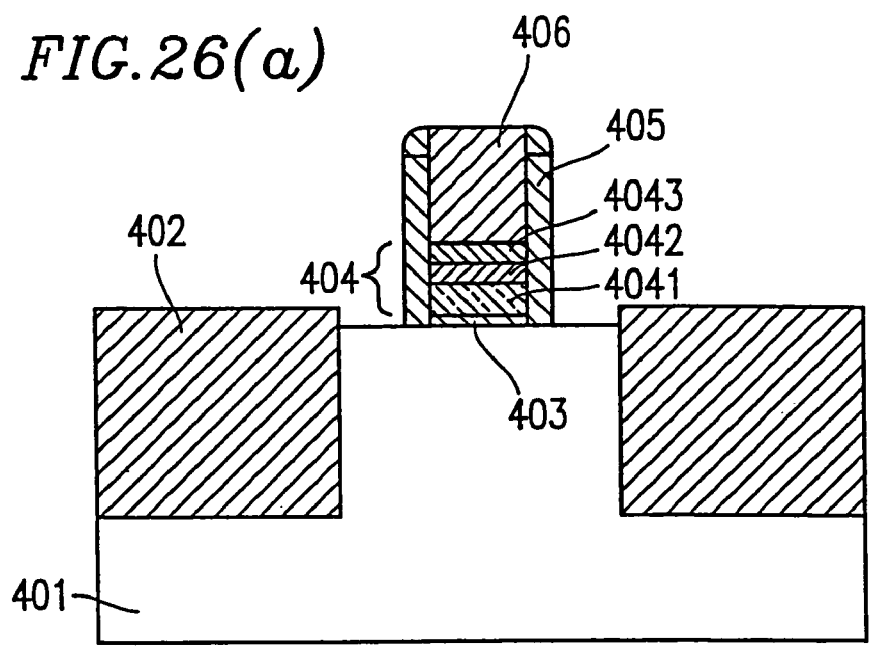
FIGS. 26(*a*) through 26(*g*) are diagrams showing steps of producing a semiconductor device 1401 of Example 5 of the present invention.

As shown in FIG. 26(a), an isolation region 402, a gate oxide film 403, a gate electrode 404, and a gate electrode side wall insulating film 405 are formed on a semiconductor substrate 401 (or a well region provided on the semiconductor substrate 401), using a well-known method. In this case, the gate electrode 404 has a three-layer structure in which a nitride titanium film 4042 is disposed between a polycrystalline silicon film 4041 and a tungsten film 4043.

The nitride titanium film 4042 prevents reaction between the polycrystalline silicon film 4041 and the tungsten film 4043 in a subsequent thermal processing. If the polycrystalline silicon film 4041 reacts with the tungsten film 4043, a tungsten silicide film is produced, which adversely increases the resistance of the gate electrode 404.

For a P-channel transistor, the polycrystalline silicon film 4041 of the gate electrode 404 is previously doped with boron ions. For an N-channel transistor, the polycrystalline silicon film 4041 of the gate electrode 404 is previously doped with phosphorous ions.

An insulating film 406 made of a silicon oxide film or a silicon nitride film is formed on the gate electrode 404. The gate electrode side wall insulating film 405 is formed at a side of the gate electrode 404. The gate electrode side wall insulating film 405 consists of a silicon oxide film and a silicon nitride film.

In this example, a semiconductor device is designed in accordance with F=0.18 μm where TG=120 nm, TSW=250 nm, TSDmax=200 nm, XjSD=40 nm, LG=180 nm, LSW=40 nm, LSD=250 nm, LA=100 nm, LM=200 nm, and MC=90 nm. The meanings of these variables are as described with reference to FIG. 8.

Figure 26B:
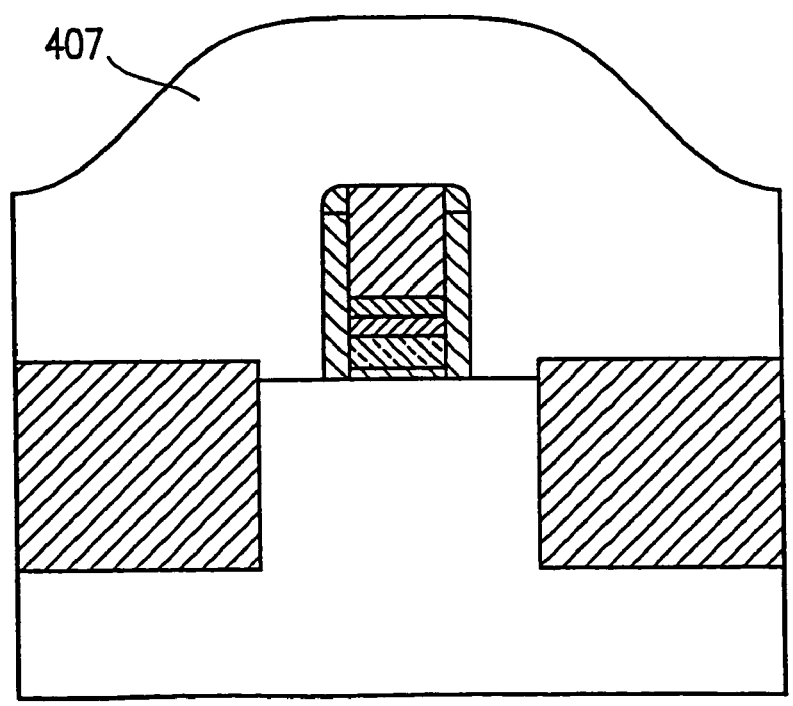

Similar to Example 3, a polycrystalline silicon film 407 is deposited by chemical vapor deposition (CVD) (FIG. 26(b)). In this example, the polycrystalline silicon film 407 has a thickness of about 300 to about 400 nm.

Figure 26C:
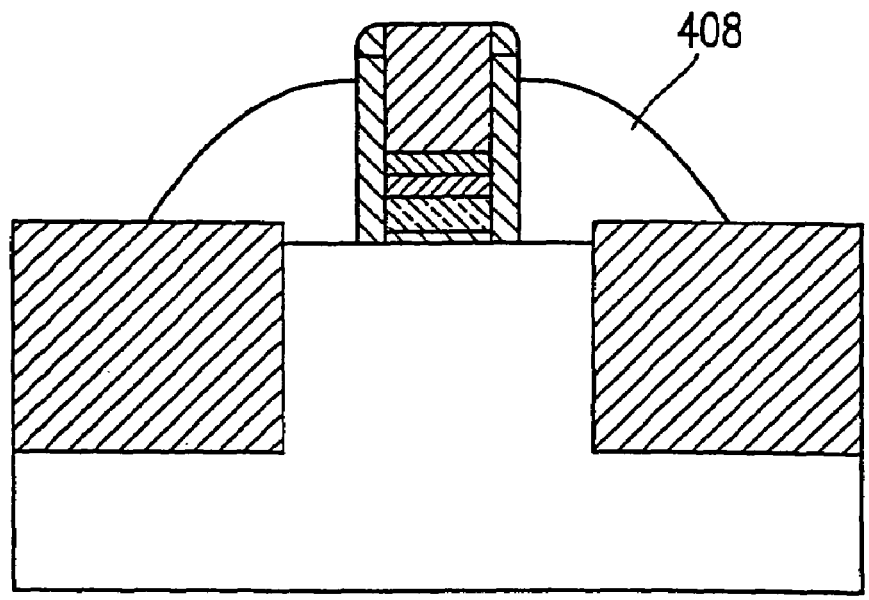
Figure 26D:
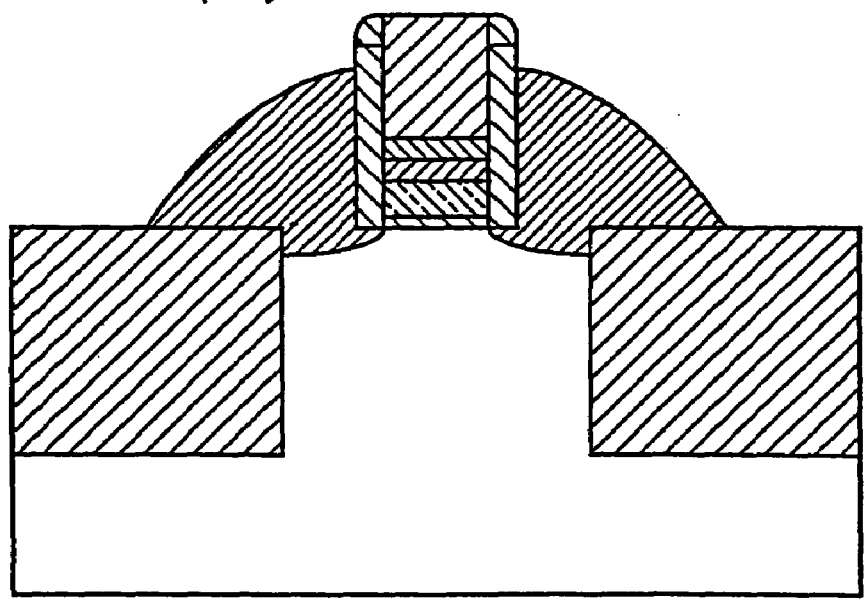
Figure 26E:
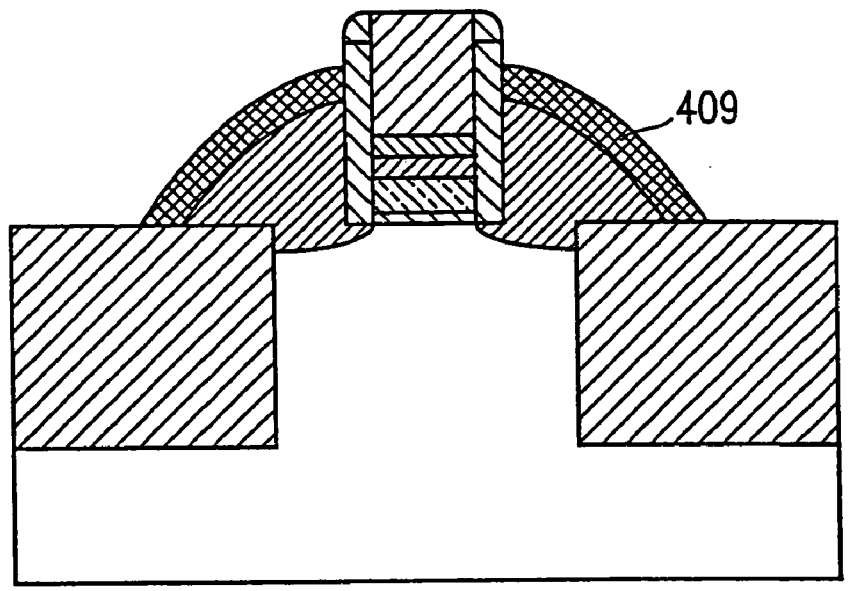

Thereafter, the polycrystalline silicon film 407 is etched back (FIG. 26(c)). The etching back is conducted under the same conditions as described in Example 3. When only etching back is conducted, a polycrystalline silicon film 408 is formed around the gate electrode 404 via the gate electrode side wall insulating film 405. In order that the polycrystalline silicon film 408 works as accumulated source and drain regions, the polycrystalline silicon film 408 needs to be divided into separate source and drain regions (cutting step). In this example, even when a gate electrode side wall is not perpendicular to the substrate surface, a source region and a drain region are reliably separated from each other. To this end, etching includes somehow side-etching, similar to Example 3.

After the cutting step, impurity ions are implanted (doped) into regions which will be the source and drain regions as shown in FIG. 34(d). In this example, unlike Example 3, the doping is applied only to the regions which will be the source and drain regions (the gate electrode 404 is not doped) In this manner, the source and drain regions are provided, and an implantation and a thermal processing are conducted under the same conditions as described in Example 3.

After the doping, a refractory metal silicide film 409 (refractory metal film) is selectively formed on the source/drain regions by a well-known salicide step. In this example, titanium is used as a material for the refractory metal film. A material for the refractory metal film is not limited to titanium, but may be cobalt, nickel, platinum, or the like.

In this example, the gate electrode 404 is made of tungsten metal having a resistance lower than that of a metal silicide film. Since a silicon oxide film or a silicon nitride film exists on an upper portion of the gate electrode 404, only the source/drain region is converted to silicide.

Figure 26F:
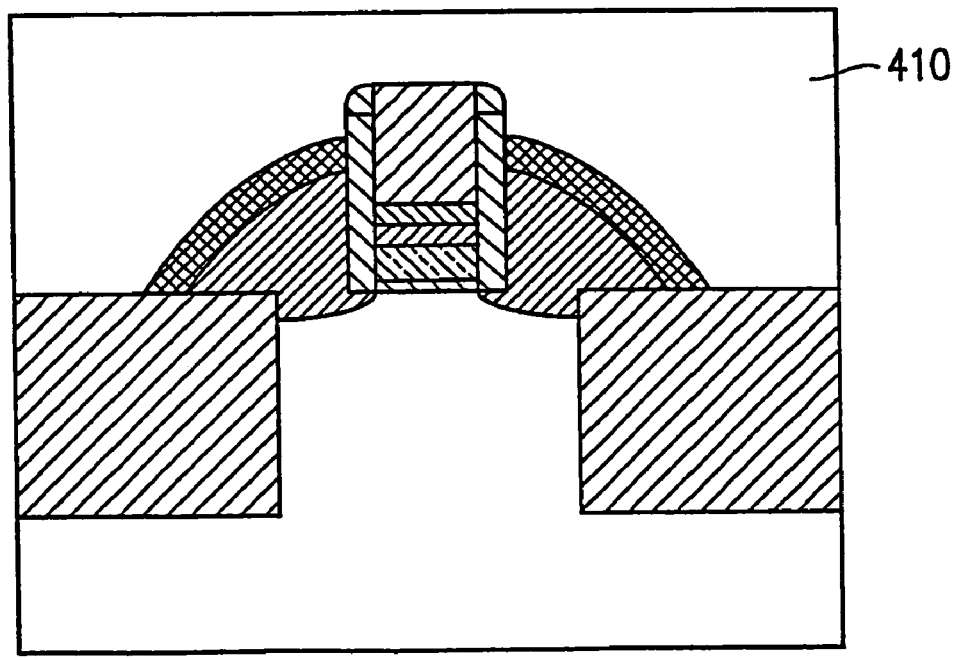

After the conversion of the source/drain region to silicide, an interlayer insulating film 410 is formed using a well-known technique, as shown in FIG. 26(f).

Figure 26G:
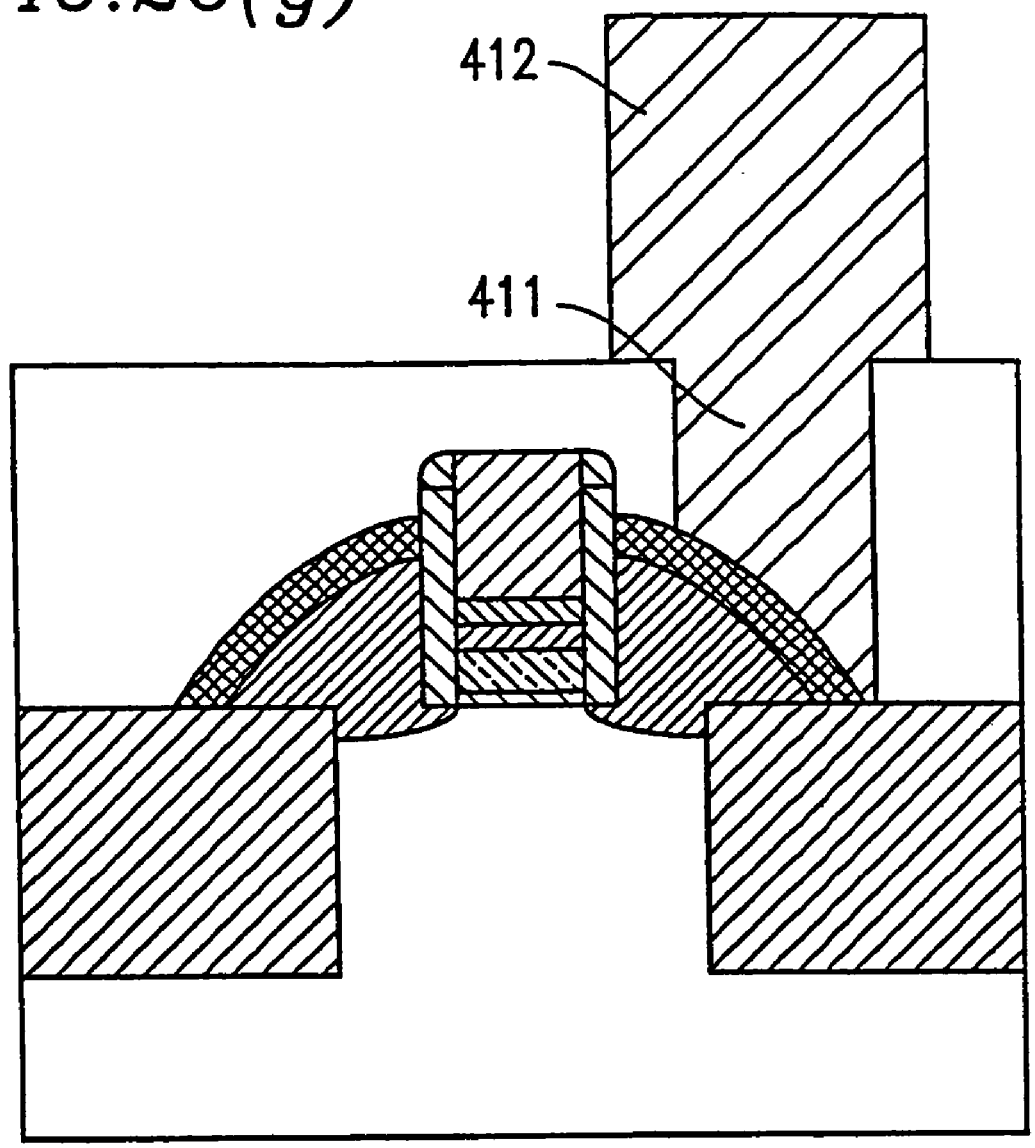

After the formation of an interlayer insulating film 410, the interlayer insulating film 410 is bored to form a contact hole 411 at a desired position. As shown in FIG. 26(g), an upper conductor 412 (contact conductor) is formed on the interlayer insulating film 410 and/or in the contact hole 411. In this example, when part of the contact hole 411 overlaps with the source/drain region, a contact area between the source/drain region and the contact conductor 412 can be increased. With such a structure, the occupied area of a device can be considerably reduced.

In this example, the insulating film 406 exists on the upper portion of the gate electrode 404. Therefore, if part of the contact hole 411 overlaps with the gate electrode 404, a short circuit is not established between the source/drain region and the gate electrode 404 via the contact conductor 412. In this example, a margin for avoiding a short circuit is not required between the contact hole 411 and the gate electrode 404. As compared with Example 3, the degree of freedom is further increased for a position at which the contact hole 411 is provided.

Specifically, the interlayer insulating film 410 and the insulating film 406 on the upper portion of the gate electrode 404 are made of different materials. When etching is conducted to bore the contact hole 411, the interlayer insulating film 410 is selectively etched using an etching technique in which the selectivity of the interlayer insulating film 410 relative to the insulating film 406 on the upper portion of the gate electrode 404 is sufficient. For example, when the insulating film 406 on the gate electrode 404 is made of a silicon nitride film and the interlayer insulating film 410 is made of silicate glass containing boron and phosphorous, or the like, contact etching is conducted using a fluorocarbon-based gas. Therefore, an etching selectivity of the silicon nitride film to the silicate glass film containing boron and phosphorous can be 1:10–100 or more. When the etching is conducted to provide the contact hole 411 under such conditions, the insulating film 406 can be prevented from being etched to expose the gate electrode 404.

Similarly, a material for the isolation region and a material for the interlayer insulating film may be selected so that the selectivity upon the contact etching is sufficient. In Example 3 and this example, part of the contact hole contacts the isolation region. If the etching selectivity of an insulating film material for the interlayer insulating film to an insulating film material for the isolation region is not sufficient (i.e., there is not a difference therebetween in an etching rate of contact etching), the isolation region is adversely bored upon contact etching. To address such a problem, at least a surface of an insulating film constituting the isolation region may have a sufficient etching selectivity to the interlayer insulating film. The surface of the isolation region may be made of a silicon nitride film or the like, for example.

Preferably, the grain size of the accumulated layer made of a polycrystalline silicon film in this example and Example 3 is sufficiently small compared with the occupied area of the source/drain region. As described in this example and Example 3, in order to increase a process margin (margins as conditions for impurity ion implantation, a thermal processing, and the like upon formation of the source/drain region) and to prevent variations in the transistor characteristics, the diffusion coefficient of the accumulated layer made of a polycrystalline silicon film is preferably large compared with the diffusion coefficient of a silicon substrate. Preferably, the diffusion coefficient of the accumulated layer made of a polycrystalline silicon film is ten or more times the diffusion coefficient of a single crystal of silicon.

When impurities are diffused in the polycrystalline silicon film, the more the grain boundary in the film, the further the diffusion is promoted. Therefore, the grain size needs to be sufficiently small for the occupied area of the source/drain region. In the case of a relatively large F=0.24 µm rule, the above-described margin between a gate electrode and an isolation region is about 0.16 µm to about 0.18 µm. The grain size of the polycrystalline silicon film is preferably smaller than or equal to a distance of the active region of a transistor along a gate length direction between the edge of the gate electrode side wall insulating film to the closest portion of an isolation region (i.e., LA in FIG. 8), and more preferably smaller than or equal to 50 nm. The diffusion of impurities in the polycrystalline silicon film is fast in the grain boundary and slow within the grain. When a source/drain region below the first surface where an active region contacts a gate oxide film is produced by diffusing impurities from the polycrystalline silicon film, a number of grain boundaries of polycrystalline silicon are preferably present at a surface where the polycrystalline silicon film contacts the active region (silicon substrate surface). This is because impurities are more uniformly diffused from the polycrystalline silicon film to the silicon substrate. Thereby, variations injunction depth and variations in a short channel effect among a plurality of transistors can be reduced.

The decreased grain size leads to a reduction in a diffusion distance from a grain boundary to a matrix (the inside of a grain), thereby effectively increasing the impurity concentration in the matrix. Therefore, the proportion of activated impurities in the polycrystalline silicon film can be increased, thereby reducing the parasitic resistance of a transistor and increasing the driving current of the transistor.

Further, when the grain size is decreased, variations in a width of a side wall made of polycrystalline silicon upon etching back can be suppressed. This is because the grain of polycrystalline silicon is responsible for such variations.

More preferably, the grain is a columnar crystal. When the grain is a columnar crystal, impurity diffusion downward into the silicon substrate is considerably fast.

In the above-described example and Example 3, a polycrystalline silicon film is used as a material for the accumulated source/drain region. A polycrystalline silicon film is often used in the manufacture of a semiconductor device. Therefore, when a polycrystalline silicon film is used as a material for the accumulated source/drain region, it is not necessary to introduce an additional apparatus and adjust conditions. Further, it is not necessary to use a vast amount of hydrogen as in a selective epitaxial growing apparatus.

The occupied area of an apparatus for manufacture is considerably small compared with the selective epitaxial growing apparatus (the occupied area of a hydrogen removal apparatus is considerably large).

A silicon germanium film (polycrystal) may be used as a material for the accumulated source/drain region. Alternatively, an amorphous mono-layer film of silicon or silicon-germanium ($Si_xGe_y$), a two-layer (amorphous and polycrystalline) film, or the like may be used for the accumulated source/drain region. When a silicon-germanium film is used, the proportion of activated impurities is increased compared with when silicon is used. Therefore, the parasitic resistance of a transistor can be considerably reduced.

It is preferable that the grain size of the polycrystalline silicon-germanium film satisfies conditions similar to those for the grain size of the above-described polycrystalline silicon film. This is because the grain of the polycrystalline silicon-germanium film has a function similar to that of the grain of the above-described polycrystalline silicon film.

Example 6

An SOI (Silicon On Insulator) substrate is used as a substrate of a semiconductor substrate according to Example 6 of the present invention.

Figure 27:
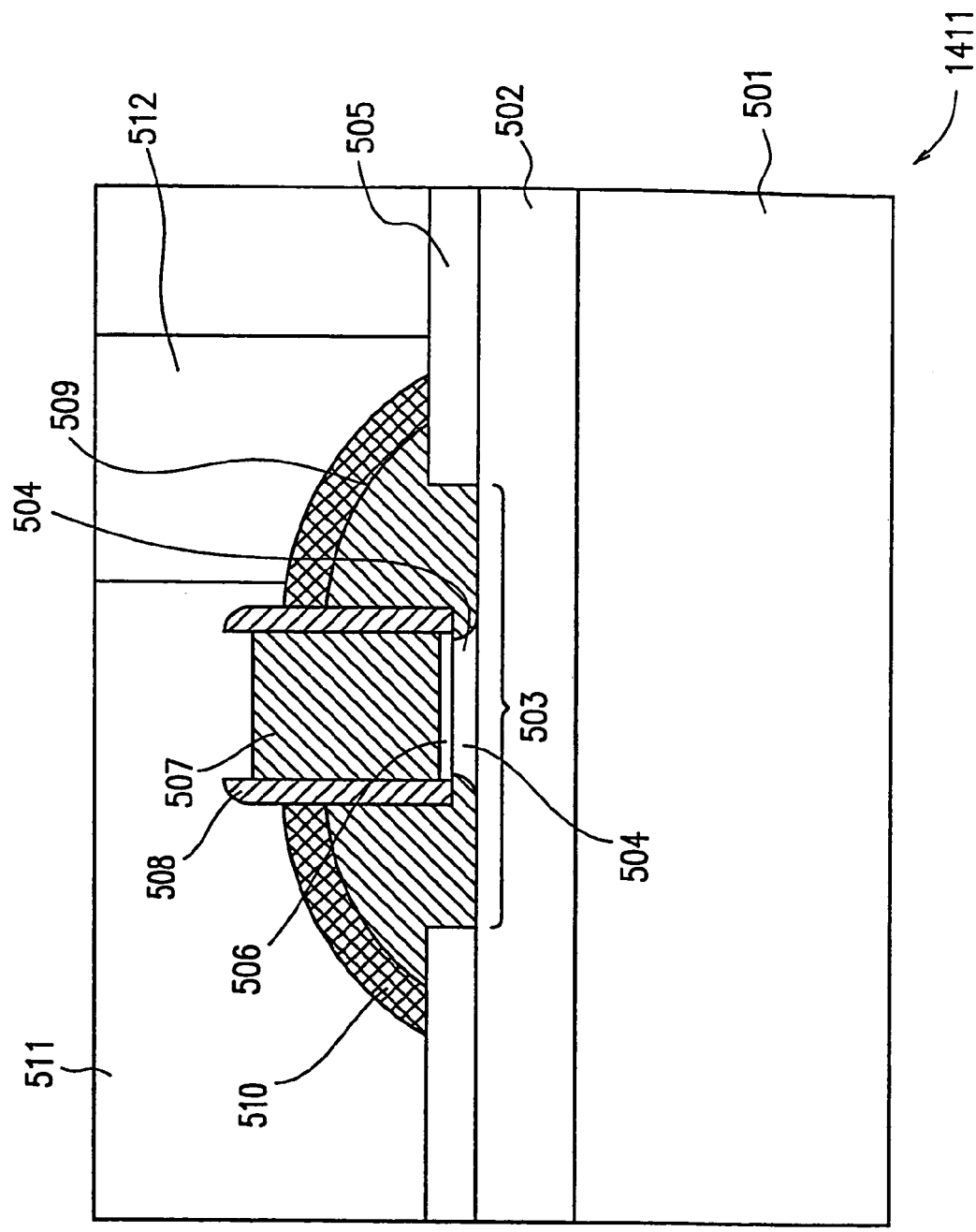
FIG. 27 is a vertical cross-sectional view showing a semiconductor device 1411 of Example 6, taken along a plane in a gate length direction.

FIG. 27 is a vertical cross-sectional view of a semiconductor device 1411 of Example 6, taken along a plane in a gate length direction.

The semiconductor device 1411 includes an SOI substrate 501, and an oxide film 502, an active region 503, a body region 504, an isolation region 505, a gate oxide film 506, a gate electrode 507, a gate electrode side wall insulating film 508, a source/drain region 509, a refractory metal silicide film 510, an interlayer insulating film 511, and a contact hole 512 which are provided on the semiconductor substrate 501.

A surface of the source/drain region 509 (a surface contacting a contact conductor and/or a surface contacting the interlayer insulating film 511) is tilted similarly to the semiconductor devices of Examples 1 to 4. In the semiconductor device 1411, a silicon film (polycrystalline silicon film) accumulated above a channel region is provided on the SOI substrate 501. Therefore, in a salicide step, a surface of the silicon film accumulated above the channel region reacts with a refractory metal to form a silicide film. This leads to prevention of the silicide film from reaching the oxide film 502 in the SOI substrate 501.

In a conventional semiconductor device including an SOI substrate, a silicon film on an oxide film is rendered to be considerably thin for the purpose of complete depletion in a body region. In this case, the thin silicon film leads to an adverse increase in the resistance of a source/drain region. To solve such a problem, it is considered that a surface of the source/drain region is converted to silicide to form a refractory metal silicide film. However, since the silicon film is thin, the silicide film reaches an underlying silicon oxide film in a silicide reaction. In this case, the transistor characteristics are likely to be deteriorated.

In this example, the silicide film does not reach the oxide film 502 in the SOI substrate 501 as described above, a deterioration in transistor characteristics due to the silicide does not occur.

Example 7

In the above-described Examples 1 to 6, a relationship between a gap between adjacent gate electrodes and the width d of the side wall is not particularly mentioned. In Example 7, the gap between adjacent gate electrodes is set to less than two times the width d of the side wall.

Hereinafter, Example 7 will be described with reference to FIGS. 28 through 31.

Figure 28:
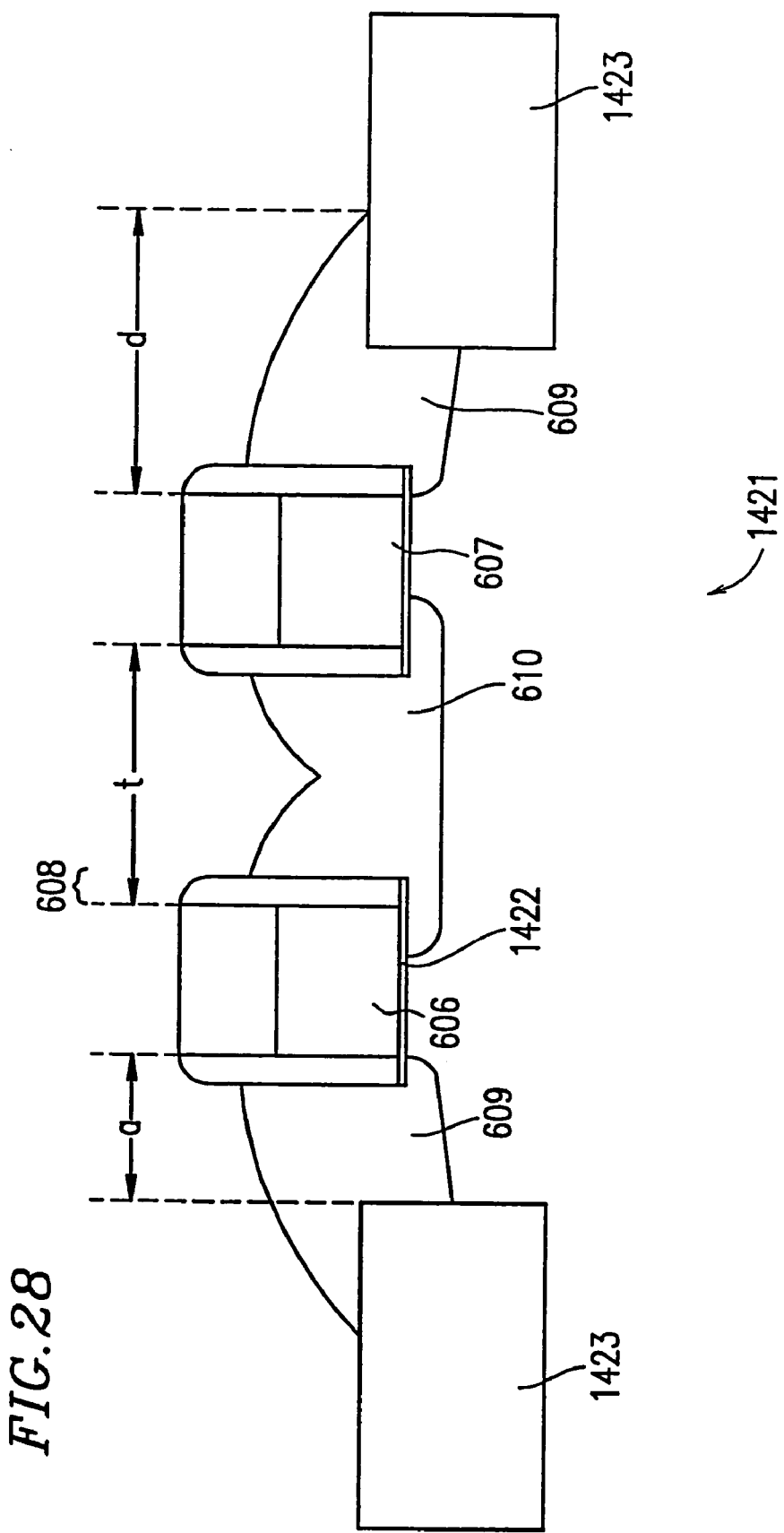
FIG. 28 is a diagram showing a semiconductor device 1421 according to Example 7 of the present invention where a gap between adjacent gate electrodes is set to less than two times a width d of a side wall.

FIG. 28 shows a semiconductor device 1421 where a gap between adjacent gate electrodes is set to less than two times a width d of a side wall. FIG. 28 is a vertical cross-sectional view of a semiconductor device 1421 of Example 7, taken along a plane in a gate length direction.

The semiconductor device 1421 will be produced as follows.

An isolation region 1423 is formed on a semiconductor substrate (or a well region provided on the semiconductor substrate). The isolation region 1423 is made of a material resistant to silicon etching. Thereafter, a gate oxide film 1422, gate electrodes 606 and 607, and a gate electrode side wall insulating film 608 are formed. A gap t between the adjacent gate electrodes 606 and 607 is less than two times a width d of a side wall. That is, 2×d>t is satisfied. Therefore, the occupied area of a transistor is reduced.

The side wall is a portion consisting of the gate electrode side wall insulating film 608 and a source/drain region 609 which will be provided later. The side wall is, for example, made of a polycrystalline silicon film. The gate oxide film 1422, the gate electrode 606, and the gate electrode side wall insulating film 608 are formed in this order. A distance between the gate electrode and the isolation region in a direction perpendicular to a longitudinal direction of the gate electrode (gate length direction) is a.

Thereafter, a polycrystalline silicon film is deposited by chemical vapor deposition (CVD). The resultant polycrystalline silicon film is thicker than a.

After the deposition of the polycrystalline silicon film, anisotropic etching is conducted until the polycrystalline silicon film is removed from an upper portion of the gate electrode 606. As a result, the polycrystalline silicon film remains in the shape of a side wall on a side of the gate electrode side wall insulating film 608. A region 610 where a source/drain region overlaps with another source/drain region is formed between the adjacent gate electrodes 606 and 607.

Figure 29:
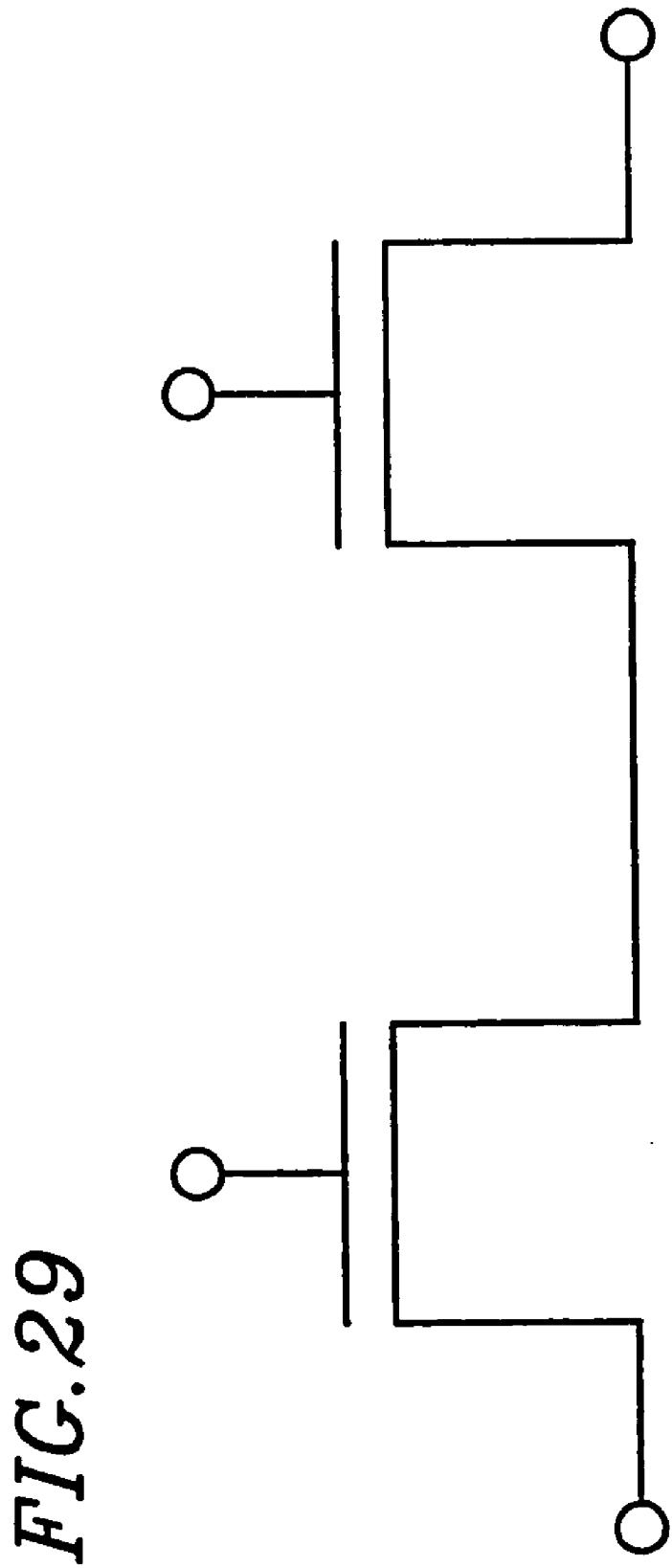
FIG. 29 is a diagram showing an equivalent circuit of the semiconductor device 1421 of Example 7.

FIG. 29 shows an equivalent circuit of the semiconductor device 1421 of FIG. 28. As shown in FIG. 29, the semiconductor device 1421 is represented by an equivalent circuit in which transistors are connected to each other in series.

Figure 30:
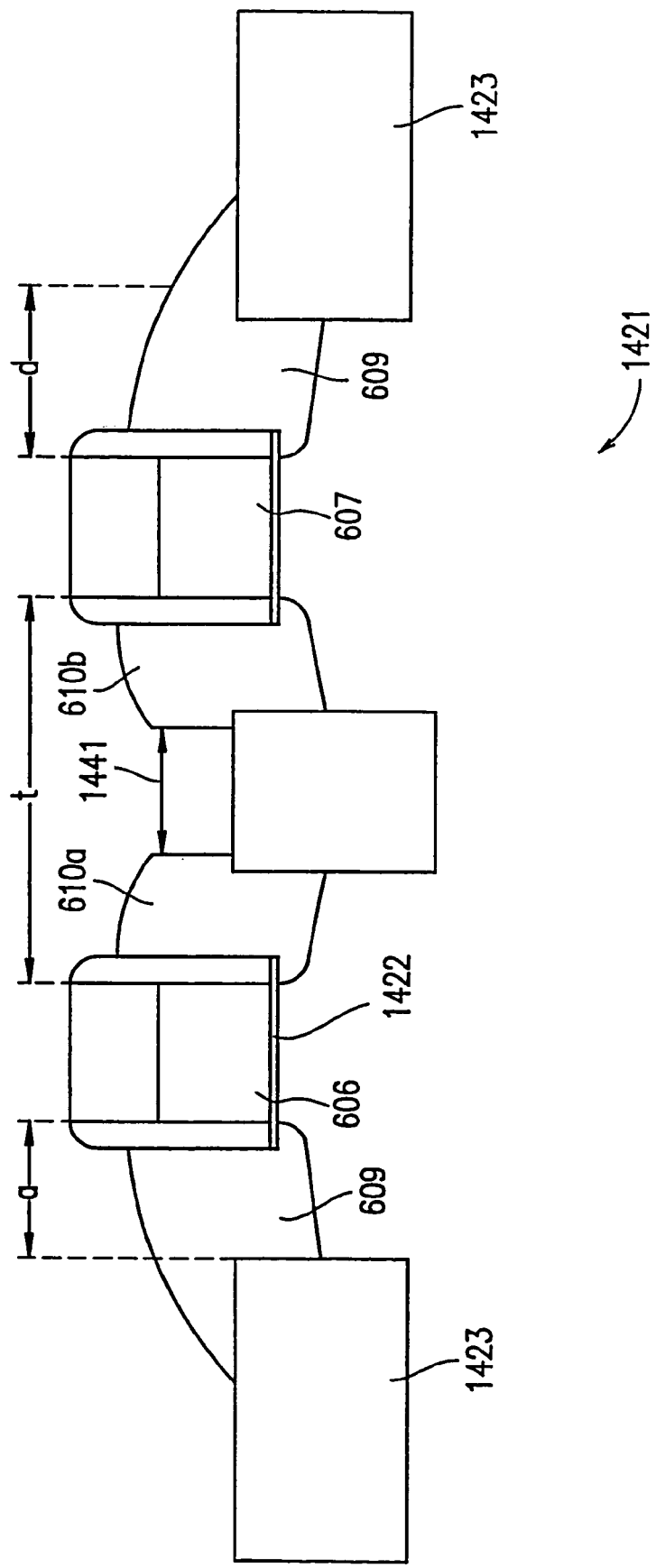
FIG. 30 is a diagram showing a state in which the source/drain regions between the adjacent gate electrodes 606 and 607 are separated from each other in the semiconductor device 1421 of Example 7.

In order to separate individual transistors from each other (i.e., source/drain regions of adjacent transistors are separated from each other) while 2×d>t is satisfied (i.e., a condition for reducing the occupied area is satisfied), a structure shown in FIG. 30 may be adopted, for example.

FIG. 30 shows a state where the source/drain regions between the adjacent gate electrodes 606 and 607 are separated from each other in the semiconductor device 1421 of Example 7.

The source/drain region 610 (FIG. 28) between adjacent transistors is divided into separate regions 610a and 610b by removing the polycrystalline silicon film from a region 1441 by etching. The etching for dividing the source/drain region 610 is conducted along with the etching in the cutting step described above with reference to FIGS. 11 through 14. In this case, the number of etching steps required in this example is not increased as compared with Example 3. Alternatively, a dummy gate electrode may be used to divide the source/drain region 610.

Figure 31:
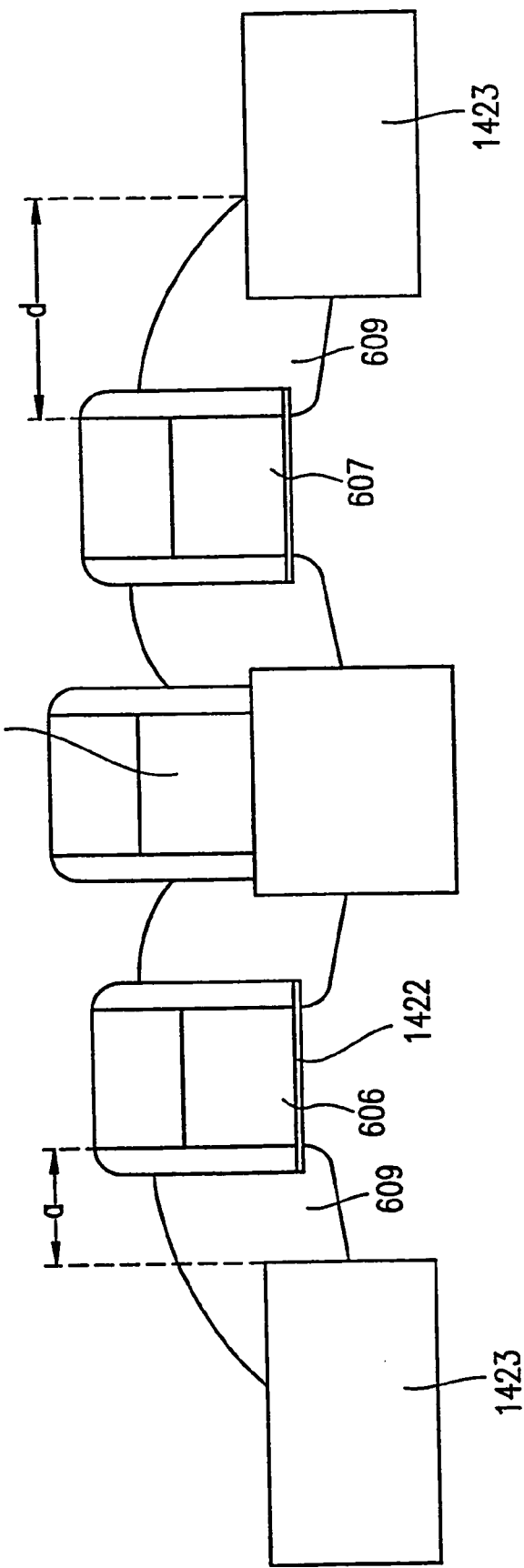
FIG. 31 is a diagram showing an example in which a dummy gate electrode 1451 is provided between the gate electrodes 606 and 607.

FIG. 31 shows an example in which a dummy gate electrode 1451 is provided between gate electrodes 606 and 607.

Other steps of producing the semiconductor device 1421 are similar to those described in Example 3, and therefore a description thereof is omitted.

In the above-described Examples 1 through 5, and 7, a bulk silicon substrate is basically used as a substrate of a semiconductor device. The substrate of the semiconductor device of the present invention is not limited to a bulk silicon substrate. Even when a SiC substrate, a sapphire substrate, or the like is used as the substrate of the semiconductor device, the present invention can be achieved.

Example 8

Figure 32A:
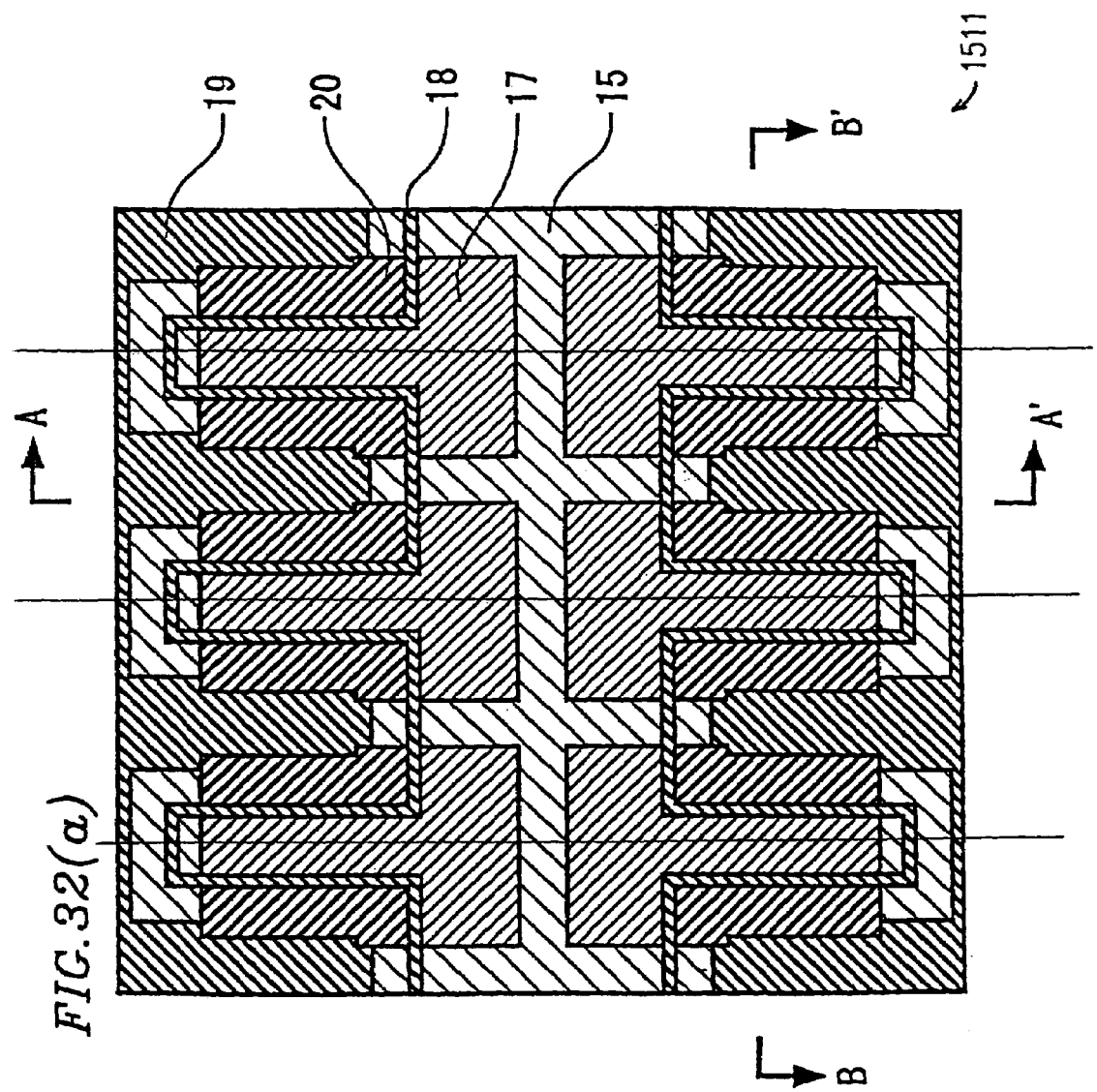
FIGS. 32(*a*) through (*c*) are diagrams showing a semiconductor device 1511 according to Example 8 of the present invention.

Hereinafter, Example 8 of the present invention will be described with reference to FIGS. 32(a), (b), (c) through 36(a), (b), (c). FIGS. 32(a), (b), (c) through 35(a), (b), (c) show a semiconductor device having an N-type transistor. Alternatively, the semiconductor device of the present invention may be a P-type transistor, or a combination of N-type and P-type transistors. In an exemplary production method described later, N-type and P-type transistors coexist.

Figure 32C:
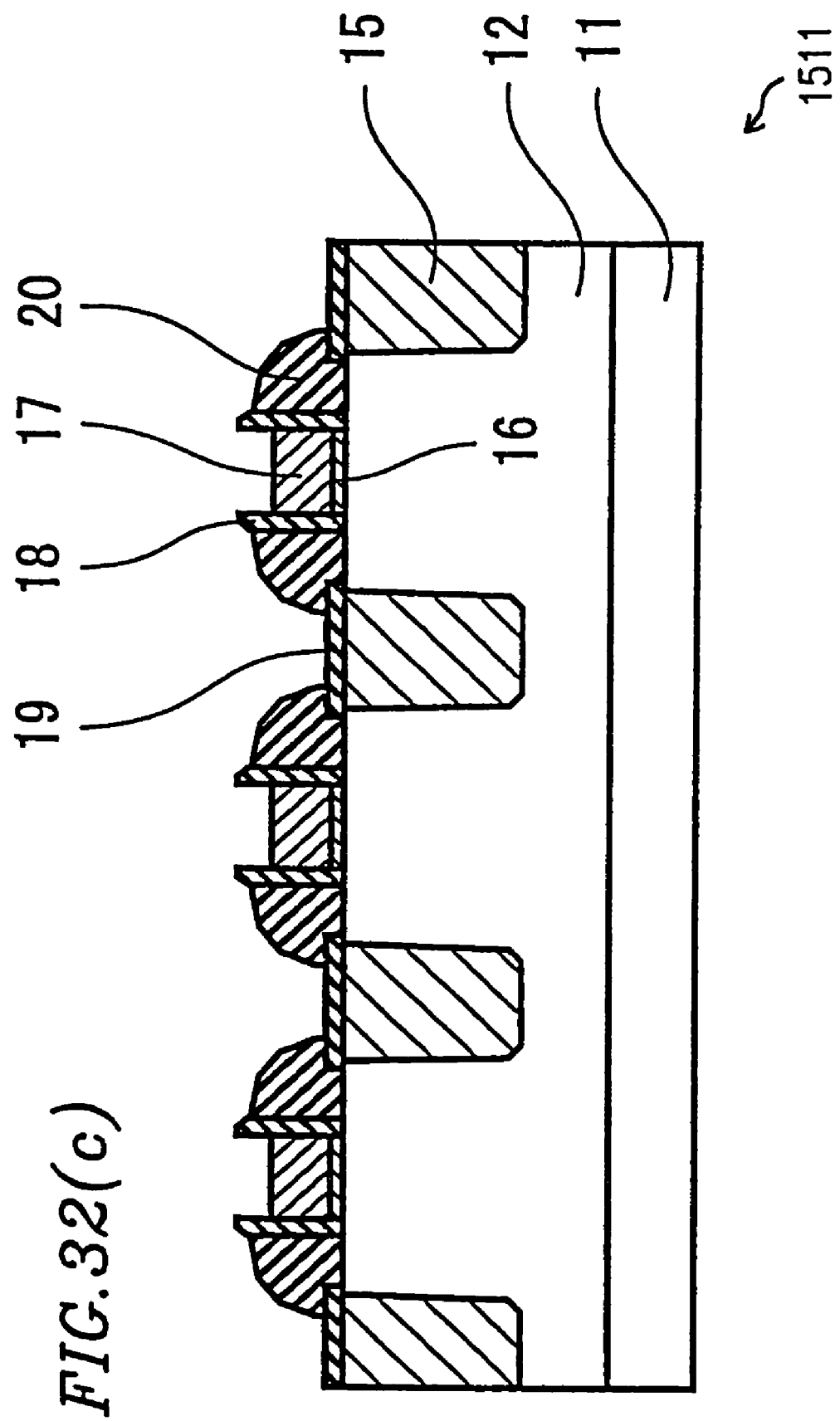

FIGS. 32(a) through 32(c) show a semiconductor device 1511 of Example 8.

FIG. 32(a) is a plan view of the semiconductor device 1511. FIG. 32(b) is a cross-sectional view of the semiconductor device 1511, taken along line A–A' in FIG. 32(a). FIG. 32(c) is a cross-sectional view of the semiconductor device 1511, taken along line B–B' in FIG. 32(a). For the sake of simplicity, a silicide region, an interlayer insulating film, and an upper metal conductor (contact conductor) are not shown in FIGS. 32(a) through (c). Although a bulk type semiconductor substrate is used in this example, an SOI (Silicon On Insulator) substrate may be used, for example.

As shown in FIG. 32(c), a P-type well region 12 is provided in a semiconductor substrate 11. A gate electrode 17 is provided on the p-type well region 12 via a gate insulating film 16. A side wall 18 is provided on a side of the gate electrode 17. A side wall 20 of polycrystalline silicon is provided at a side of the side wall 18. The side wall 20 is divided by etching into source and drain regions. Specifically, N-type impurities are implanted into the separate polycrystalline silicon side wall 20, and the implanted N-type impurities penetrate into the well region 12 by thermal diffusion. A region of the well region 12 containing the diffused impurities and the polycrystalline silicon side wall 20 constitute a source or drain region. The gate electrode 17 is divided into a plurality of regions in the etching step of dividing the polycrystalline silicon sidewall 20. The above-described P-type well region 12, the gate electrode 17, and the divided polycrystalline silicon side wall 20 (source and drain regions) constitute an N-type field effect transistor. Adjacent N-type field effect transistors are separated from each other via an isolation region 15. A silicon nitride film 19 is provided so as to protect the silicon substrate and the isolation region 15 from various etching. Note that a P-type field effect transistor may be obtained when the conductivity of the impurities is reversed from the above-described example.

Next, the steps of producing the semiconductor device 1511 will be described with reference to FIGS. 33(a), (b), (c) through 36(a), (b), (c).

Figure 33A:
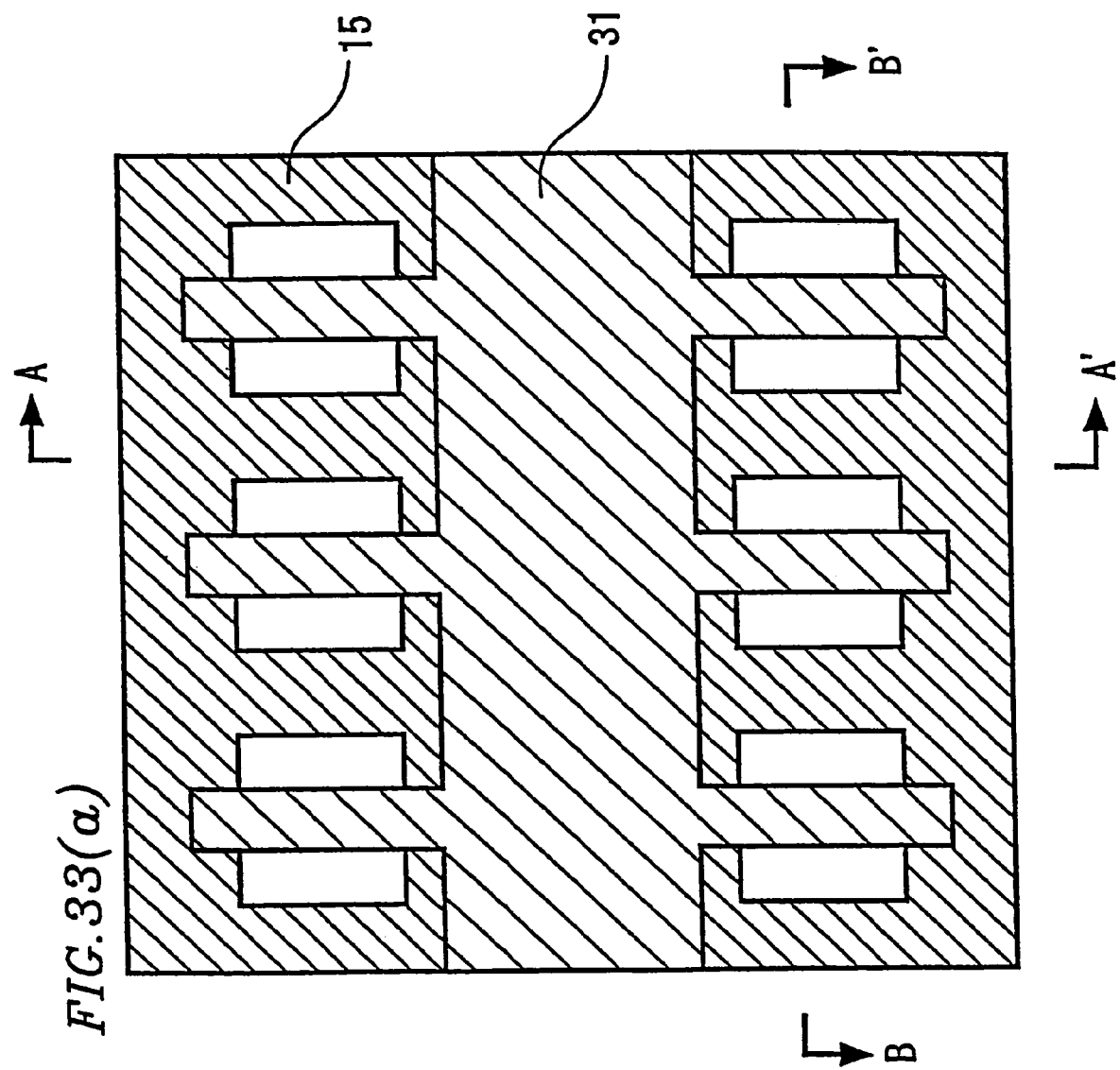
FIGS. 33(*a*) through (*c*) are diagrams showing the steps of producing a semiconductor device 1511 according to Example 8 of the present invention.
Figure 33B:
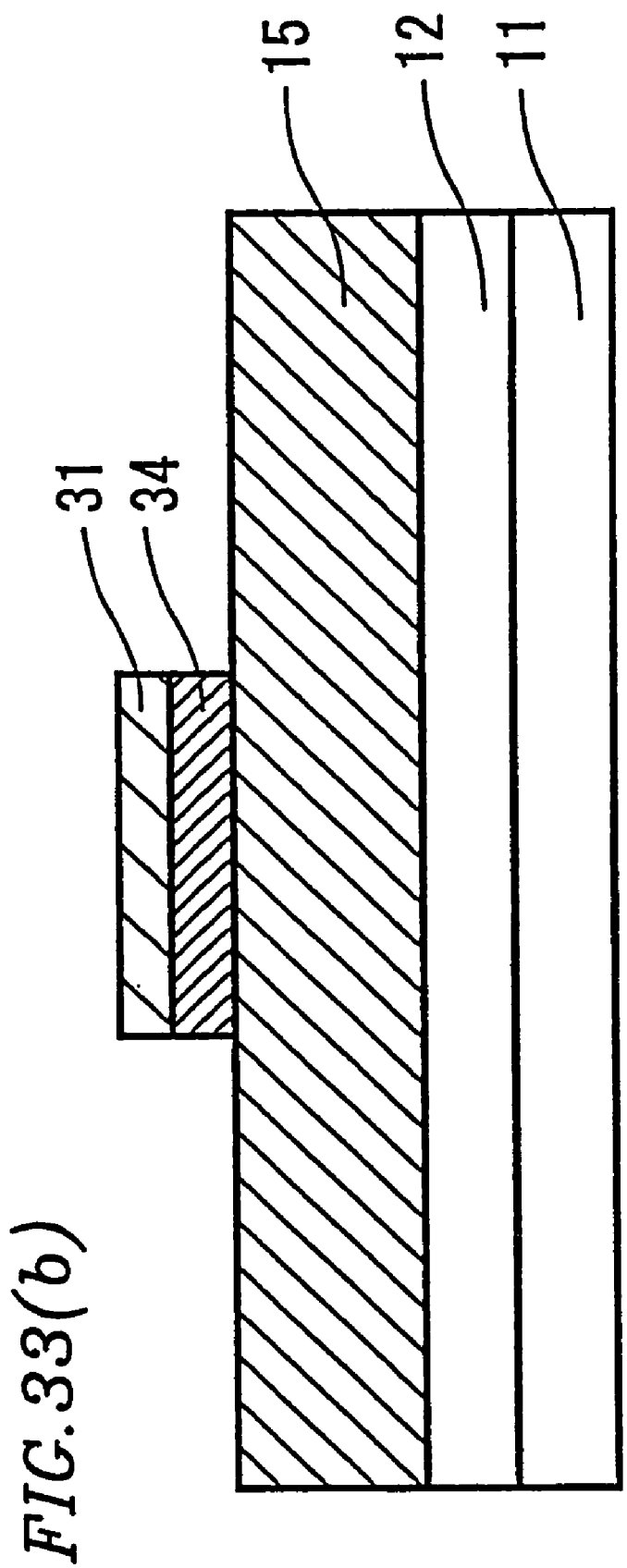
Figure 34A:
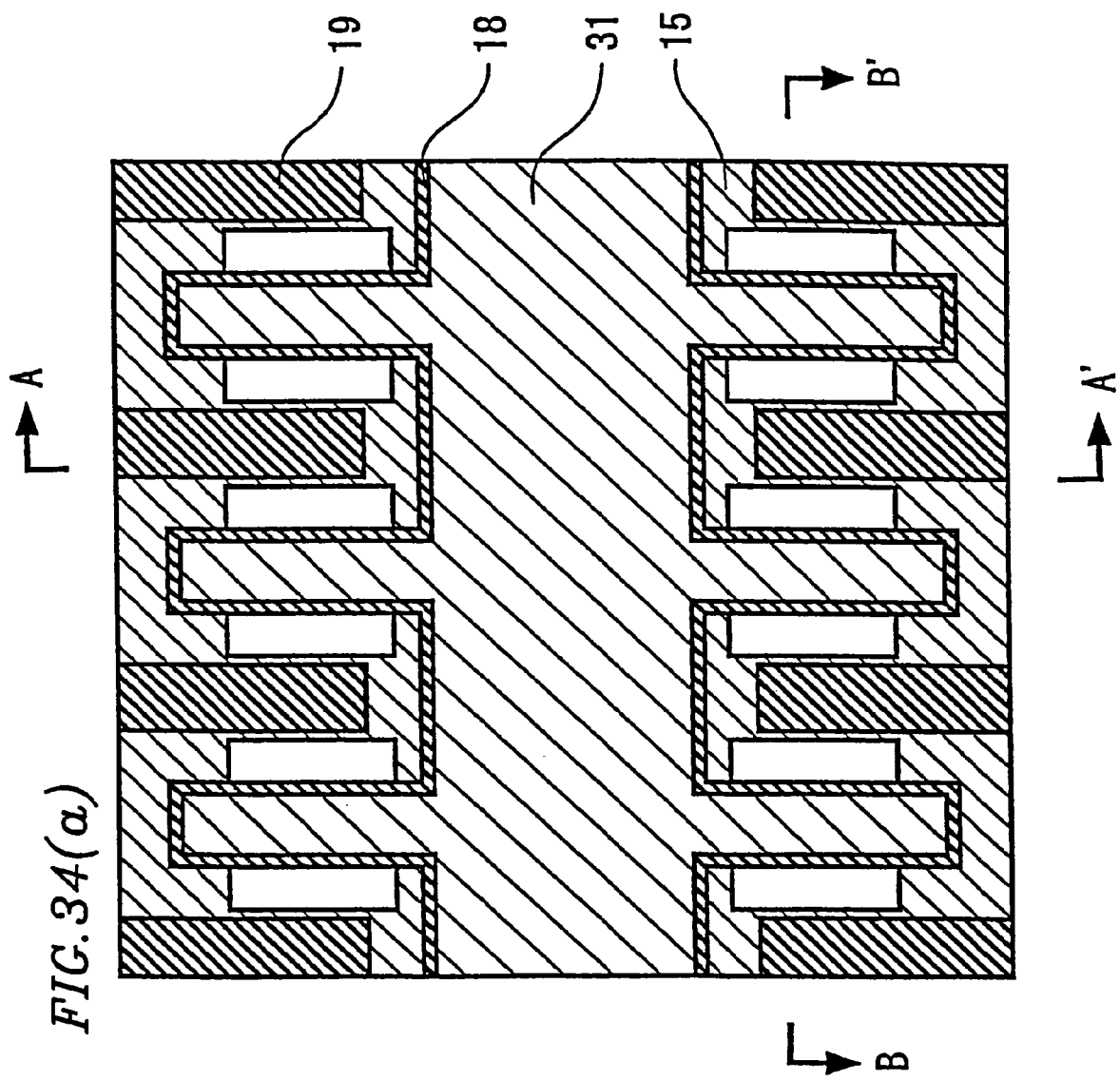
FIGS. 34(*a*) through (*c*) are diagrams showing the steps of producing a semiconductor device 1511 according to Example 8 of the present invention.
Figure 34C:
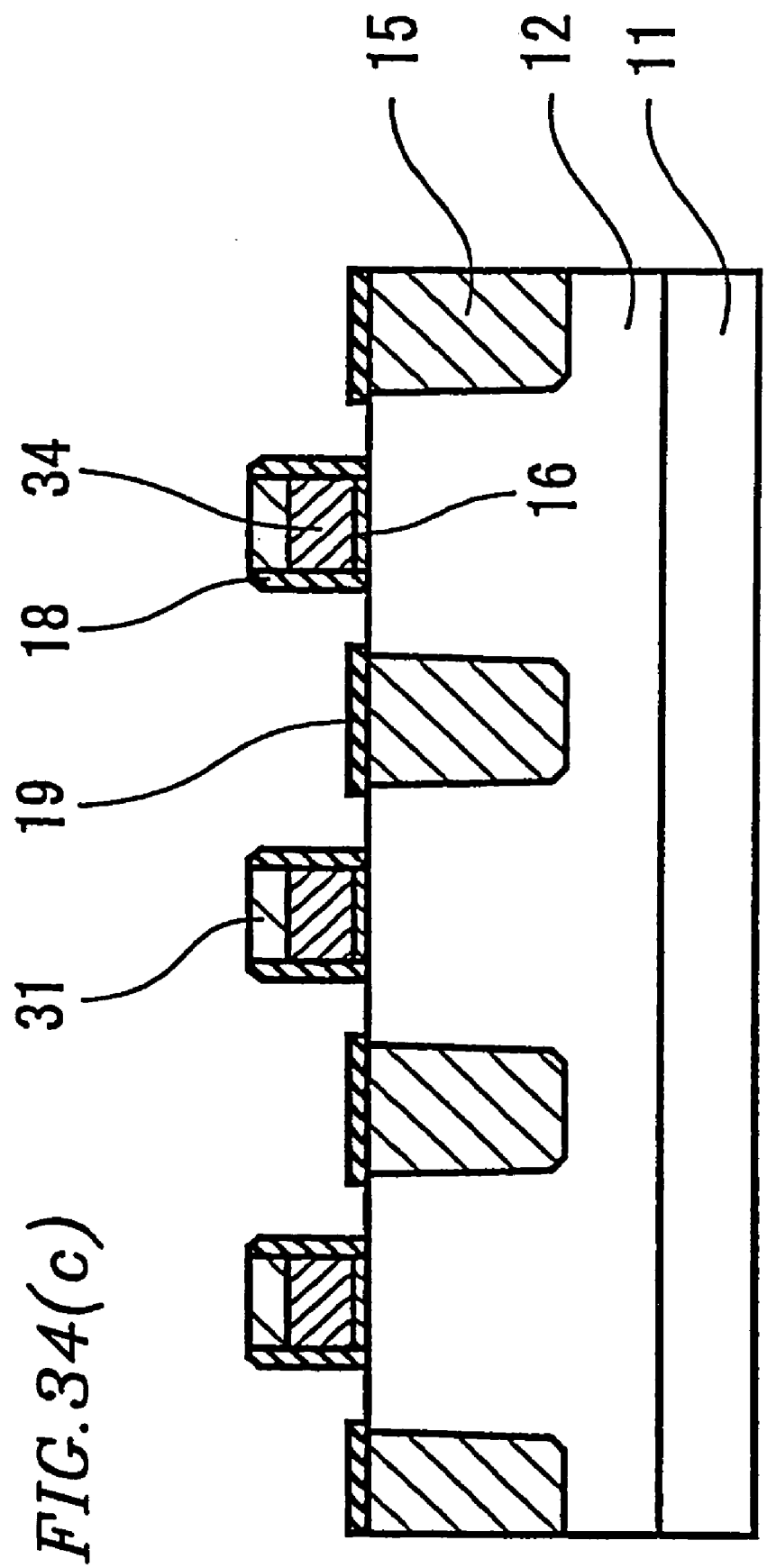
Figure 35A:
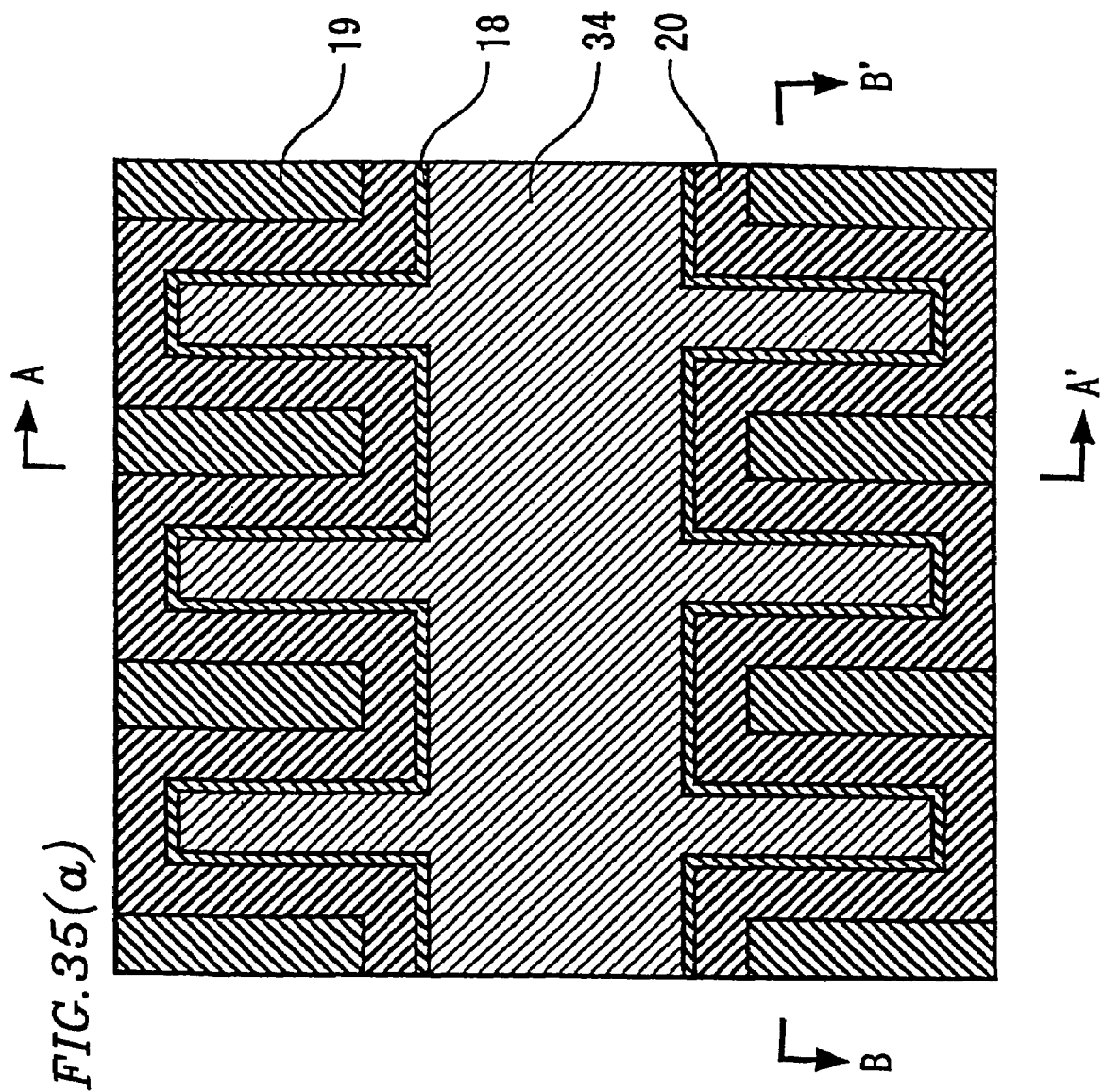
FIGS. 35(*a*) through (*c*) are diagrams showing the steps of producing a semiconductor device 1511 according to Example 8 of the present invention.
Figure 35C:
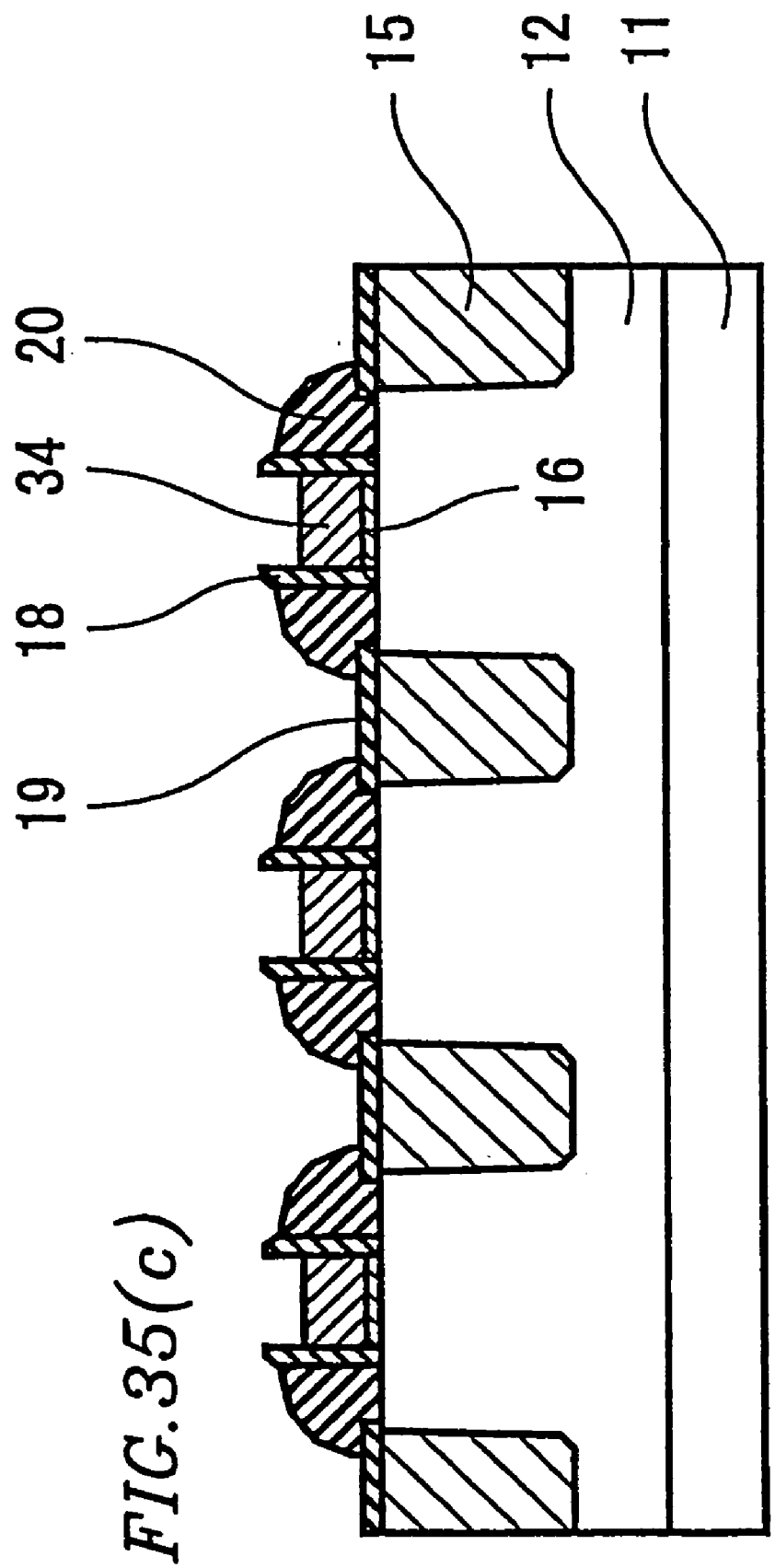

FIGS. 33(a), 34(a), and 35(a) are plan views showing the steps of producing the semiconductor device 1511 where the steps proceed in this order. FIGS. 33(b), 34(b), and 35(b) are cross-sectional views of the semiconductor device 1511, taken along lines A–A' of FIGS. 33(a), 34(a), and 35(a), respectively. FIGS. 33(c), 34(c), and 35(c) are cross-sectional views of the semiconductor device 1511, taken along lines B–B' of FIGS. 33(a), 34(a), and 35(a), respectively.

As shown in FIG. 33(c), an isolation region 15 is formed on a semiconductor substrate 11. The isolation region 15 maybe formed by STI, for example. A formation method of the isolation region 15 is not limited to STI. A material which is buried in the isolation region 15 may be a conductive substance such as polycrystalline silicon or amorphous silicon, as well as a silicon oxide film or a silicon nitride film. When a conductive substance such as polycrystalline silicon or amorphous silicon is buried in the isolation region 15, the isolation region 15 needs to be insulated, for example, by oxidizing a side of the isolation region 15.

Thereafter, a well region 12 is formed in the semiconductor substrate 11. A P-type well region 12 is formed in an NMOS portion of the semiconductor substrate 11. An N-type well region 12 is formed in a PMOS portion of the semiconductor substrate 11.

Thereafter, a gate insulating film 16 is formed. A material for the gate insulating film 16 is not limited to a particular substance as long as the substance is insulative. When the semiconductor substrate 11 is a silicon substrate, a silicon oxide film, a silicon nitride film, or a multilayer structure thereof may be used as the gate insulating film 16. Further, a high-dielectric film such as an aluminum oxide film, a titanium oxide film, or a tantalum oxide film, or a multilayer thereof may be used as the gate insulating film 16. When a silicon oxide film is used as the gate insulating film 16, a thickness of the gate insulating film 16 is preferably 1 to 10 nm. The gate insulating film 16 may be produced by CVD, sputtering, thermal oxidization, or the like.

Thereafter, a polycrystalline silicon film 34 is formed, which will be a gate electrode. The polycrystalline silicon film 34 may be replaced with any other material film as long as it is conductive. When the semiconductor substrate 11 is a silicon substrate, single crystal silicon, aluminum, copper, or the like may be substituted for the polycrystalline silicon film 34. The conductive film is preferably 0.1 to 0.4 μm thick. The conductive film may be formed by CVD, deposition, or the like.

Thereafter, an insulating film 31 is formed on the polycrystalline silicon film 34. The insulating film 31 is preferably a silicon oxide film, and is preferably 0.05 to 0.25 μm thick. The insulating film 31 may be produced by CVD, sputtering, thermal oxidization, or the like.

Thereafter, the polycrystalline silicon film 34 and the insulating film 31 are subjected to patterning (FIGS. 33(a) through (c)). In the patterning, the insulating film 31 and the polycrystalline silicon film 34 are etched using a patterned photoresist as a mask. Alternatively, only the insulating film 31 may be etched using a photoresist as a mask, and after removal of the photoresist, the polycrystalline silicon film 34 may be etched using the insulating film 31 as a mask.

Thereafter, a side wall 18 made of a silicon nitride film and a silicon nitride film 19 are formed (FIGS. 34(a) through (c)). The side wall 18 made of a silicon nitride film and the silicon nitride film 19 can be simultaneously formed in accordance with the steps shown in FIGS. 36(a) through (c).

Figure 36:
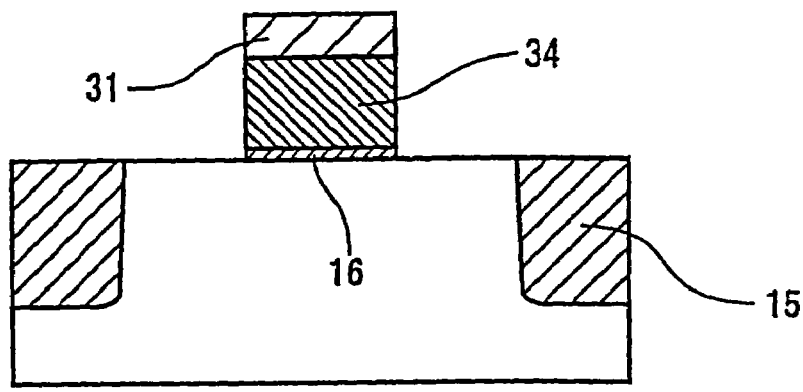
FIGS. 36(*a*) through (*c*) are diagrams showing the steps of producing a side wall 18 made of a silicon nitride film 19.
Figure 36:
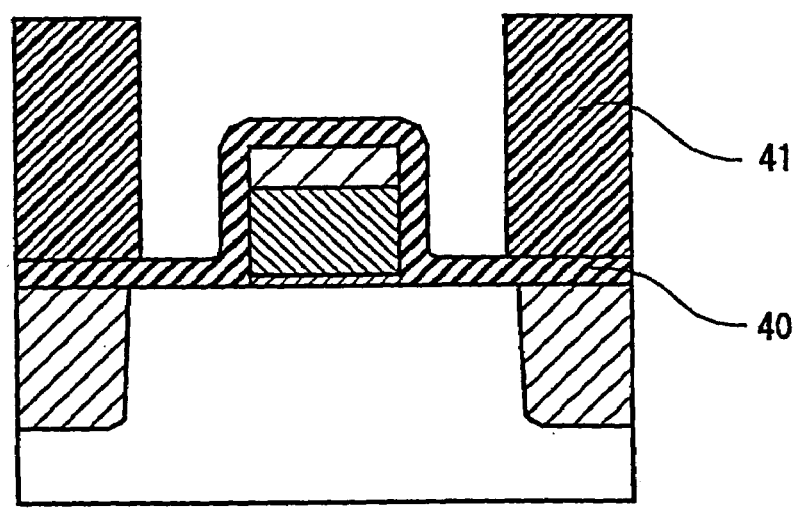
Figure 36:
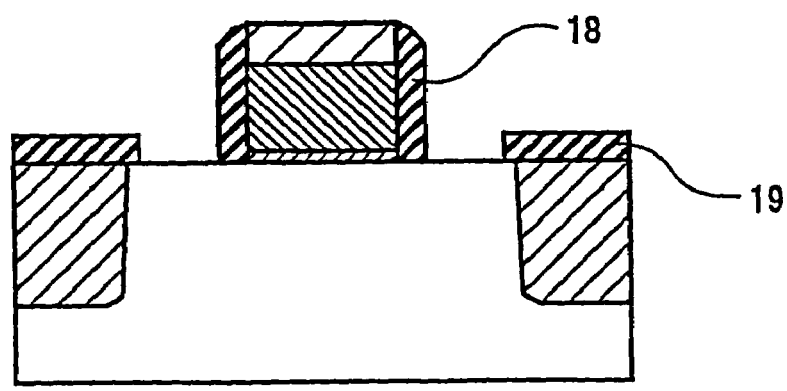

FIGS. 36(a) through (c) shows the steps of producing the side wall 18 made of a silicon nitride film and the silicon nitride film 19. After the patterning of the polycrystalline silicon film 34 and the insulating film 31 (FIG. 36(a)), a silicon nitride film 40 is deposited and part of the silicon nitride film 40 is masked with a photoresist 41 (FIG. 36(b)). The silicon nitride film 40 is preferably 0.02 μm to 0.1 μm thick, for example. Thereafter, etching back is conducted to form the side wall 18 of a silicon nitride film at sides of the polycrystalline silicon film 34 and the insulating film 31, leaving the silicon nitride film 19 at a region masked with the photoresist 41 (FIG. 36(c)). The silicon nitride film 19 is used to protect the silicon substrate and the isolation region 15 from various etching steps. In particular, the silicon nitride film 19 plays a key role in an etching back step to form a sidewall 20 of polycrystalline silicon, an etching step to remove the insulating film 31, and an etching step to form a contact hole in a source or drain region.

After the formation of the side wall 18 of a silicon nitride film and the silicon nitride film 19, the side wall 20 of polycrystalline silicon is formed. To form the side wall 20 of polycrystalline silicon, polycrystalline silicon is entirely deposited and then etched back. In this case, a semiconductor material such as amorphous silicon or a conductive material can be used other than polycrystalline silicon, but polycrystalline silicon is most preferable. The reason is as follows: the impurity diffusion rate of polycrystalline silicon is considerably great compared with that of the well region; therefore, shallow junctions between the source and drain regions and the well region can be easily obtained; and a short channel effect is suppressed. In the etching back step, the silicon nitride film 19 functions as a stopper to prevent the silicon substrate from being bored.

Thereafter, the insulating film 31 is removed by etching (FIGS. 35(a) through 35(c)). The etching may be isotropic etching. In the etching, if a surface of the isolation region 15 is exposed, the isolation region 15 is also etched. Therefore, preferably, the isolation region 15 is fully covered with the silicon nitride film 19 and the side wall 20 of polycrystalline silicon.

Thereafter, part of the polycrystalline silicon film 34 and the side wall 20 of polycrystalline silicon is removed by etching using the photoresist as a mask. The polycrystalline silicon film 34 surrounded by the side wall 18 made of a silicon nitride film is divided into a plurality of separate regions, each of which will be a gate electrode 17. The side wall 20 of polycrystalline silicon is also divided into a plurality of separate regions, each of which will be a source or drain region after impurity implantation and diffusion.

As described above, a plurality of gate electrodes in a plurality of field effect transistors are obtained by the steps of dividing the polycrystalline silicon film 34 (first non-insulating film) into a plurality of separate regions. A plurality of conductive films (which will be the source and drain regions) in a plurality of field effect transistors are obtained by the steps of dividing the second non-insulating film (side wall 20) into a plurality of separate regions.

Thereafter, impurity ions are implanted into the gate electrode and the side wall 20 of polycrystalline silicon, and annealing is conducted for activation of the impurities. In this manner, source and drain regions are formed. Ion implantation for the source and drain regions are conducted as follows. When $^{75}As^+$ is used as the impurity ions, $1\times10^{15}$ to $2\times10^{16}/cm^2$ of the impurity ions are implanted at an implantation energy of 10 KeV to 180 KeV. When $^{31}P^+$ is used as the impurity ions, $1\times10^{15}$ to $2\times10^{16}/cm^2$ of the impurity ions are implanted at an implantation energy of 5 KeV to 100 KeV. When $^{11}B^+$ is used as the impurity ions, $1\times10^{15}$ to $2\times10^{16}/cm^2$ of the impurity ions are implanted at an implantation energy of 5 KeV to 40 KeV.

Thereafter, silicide, a conductor, and the like are formed using known techniques to obtain the semiconductor device 1511.

In this example, the side wall insulating film and the conductive film (side wall) around the side wall insulating film do not exist between the separate gate electrodes. Therefore, F (the minimum processable width for etching) is sufficient for a distance D between each gate electrode. For example, in the case of fine processing technology in accordance with 0.25 μm, about 0.25 μm is sufficient for D and F. Therefore, the device area is reduced, thereby making it possible to obtain a large-scale integrated semiconductor device.

According to the above-described production method of the semiconductor device, the separation of the gate electrodes and the separation of the side walls of polycrystalline silicon can be simultaneously conducted. Therefore, the separate gate electrodes can be obtained by etching without increasing the number of steps. A large-scale integrated device can be obtained without increasing the number of steps, thereby making it possible to reduce manufacturing cost.

Note that the semiconductor device 1511 may include a terminal for fixing the potential of the well region.

Example 9

Example 9 of the present invention will be described with reference to FIG. 37.

Figure 37:
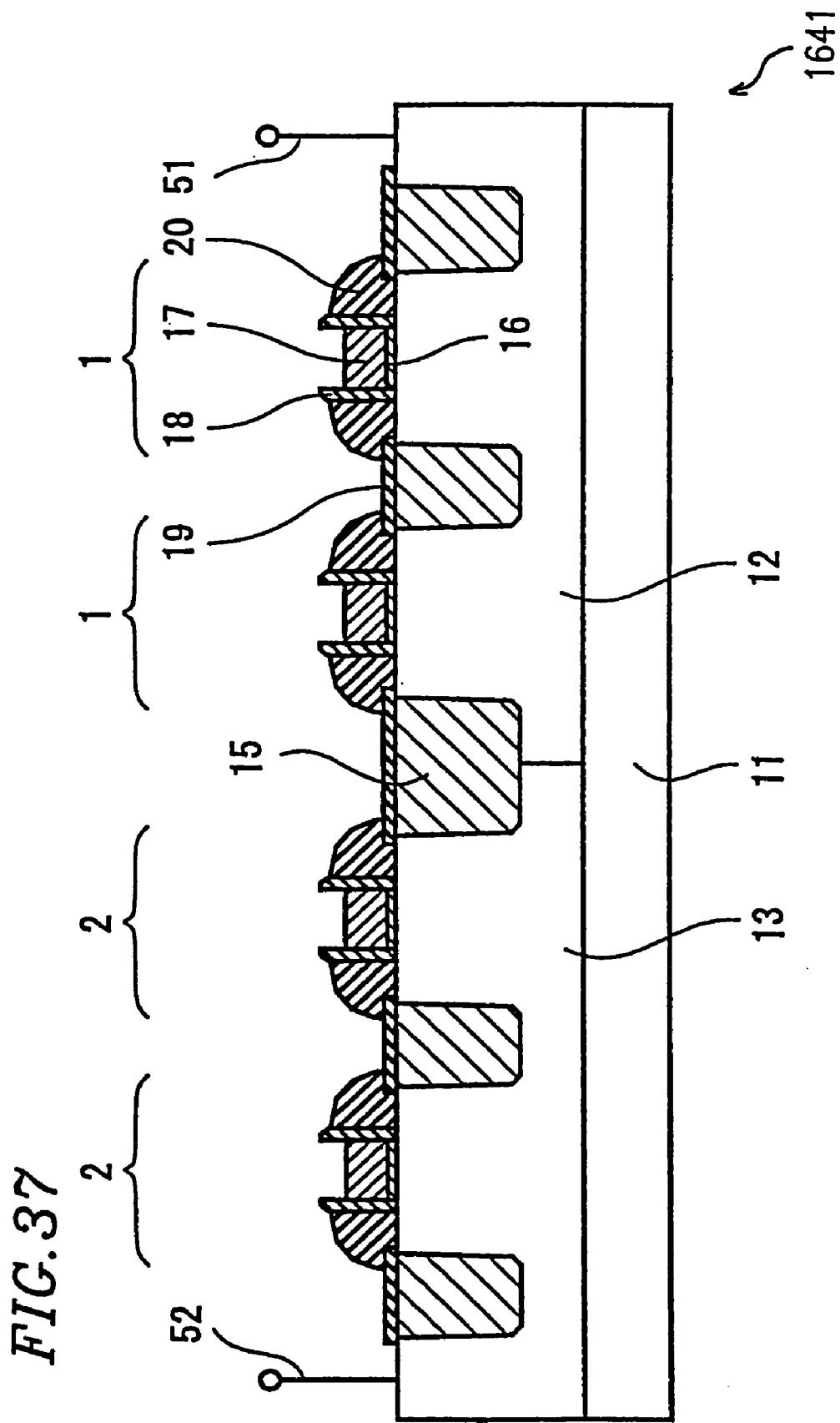
FIG. 37 is a cross-sectional view showing a semiconductor device 1641 according to Example 9 of the present invention.

FIG. 37 is a cross-sectional view of a semiconductor device 1641 according to Example 9 of the present invention.

The semiconductor device 1641 is different from the semiconductor device 1511 of Example 8 in that the semiconductor device 1641 includes terminals 51 and 52 for changing the potential of a well region. An N-type field effect transistor 1 and the terminal 51 via which a voltage is applied to a P-type well region 12 are provided on the P-type well region 12. These elements constitute an N-type element circuit block. Similarly, a P-type field effect transistor 2 and the terminal 52 via which a voltage is applied to an N-type well region 13 are provided on the N-type well region 13. These elements constitute a P-type element circuit block.

When the N-type element circuit block is in an active state (i.e., the circuit is operating), a zero or positive voltage is applied to the terminal 51 to set the potential of the P-type well region 12. When the N-type element circuit block is in a standby state (i.e., the circuit is at rest), a negative voltage is applied to the terminal 51 to set the potential of the P-type well region 12. Thereby, when the circuit is in the standby state, the substantial threshold value of a transistor is increased, thereby reducing an off current. When the circuit is in the active state, if the potential of the P-type well region 12 is positive, the substantial threshold value of a transistor is decreased, thereby increasing a driving current.

When the P-type element circuit block is in the active state (i.e., the circuit is operating), a power source voltage (or a voltage less than the power source voltage) is applied to the terminal 52 to set the potential of the N-type well region 13. When the P-type element circuit block is in a standby state (i.e., the circuit is at rest), a voltage higher than the power source voltage is applied to the terminal 52 to set the potential of the N-type well region 13, thereby obtaining effects similar to those in the circuit block including an N-type element.

According to the above-described operation, when a circuit is in a standby state, an off current of an element can be reduced, thereby reducing the power consumption of the semiconductor device 1641. When the circuit is in an active state, if a bias is applied to a well region so as to lower the threshold value of a device, a semiconductor device can be operated at a high speed.

The steps of the semiconductor device 1641 of this example are the same as those in Example 8. A voltage generation circuit may be connected to each of the terminal 51, via which a voltage is applied to the P-type well region 12, and the terminal 52, via which a voltage is applied to the N-type well region 13.

The semiconductor device 1641 can have low power consumption or high-speed operation compared with the semiconductor device 1511 of Example 8.

Example 10

Example 10 of the present invention will be described with reference to FIGS. 38(*a*) and (*b*). Although FIGS. 38(*a*) and (*b*) show only an N-type transistor, a semiconductor device of this example may include a P-type transistor, or a combination of N-type and P-type transistors. In a production method described later, both N-type and P-type transistors are present.

Figure 38A:
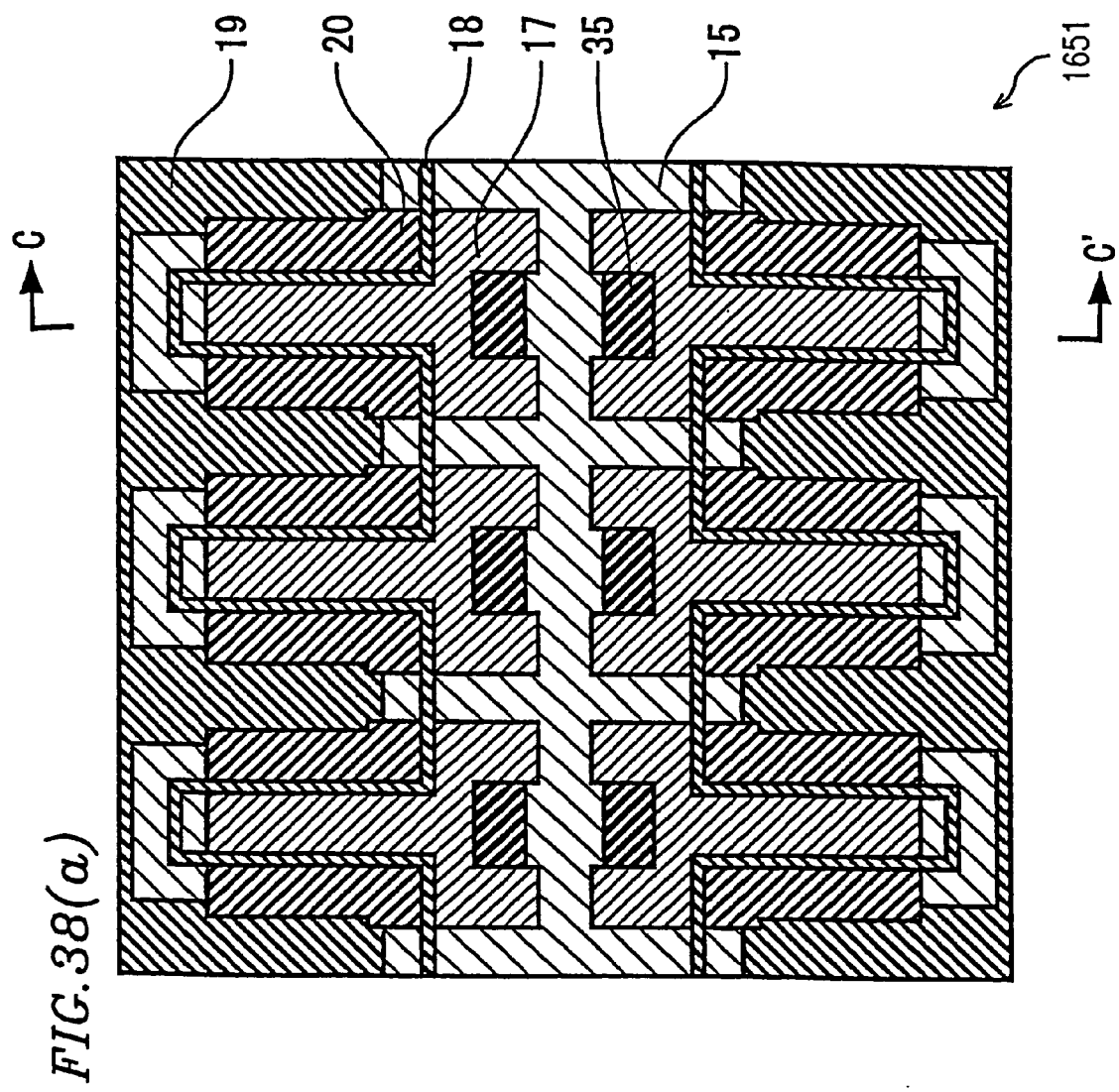
FIGS. 38(*a*) and (*b*) are plan views showing a semiconductor device 1651 according to Example 10 of the present invention.
Figure 38B:
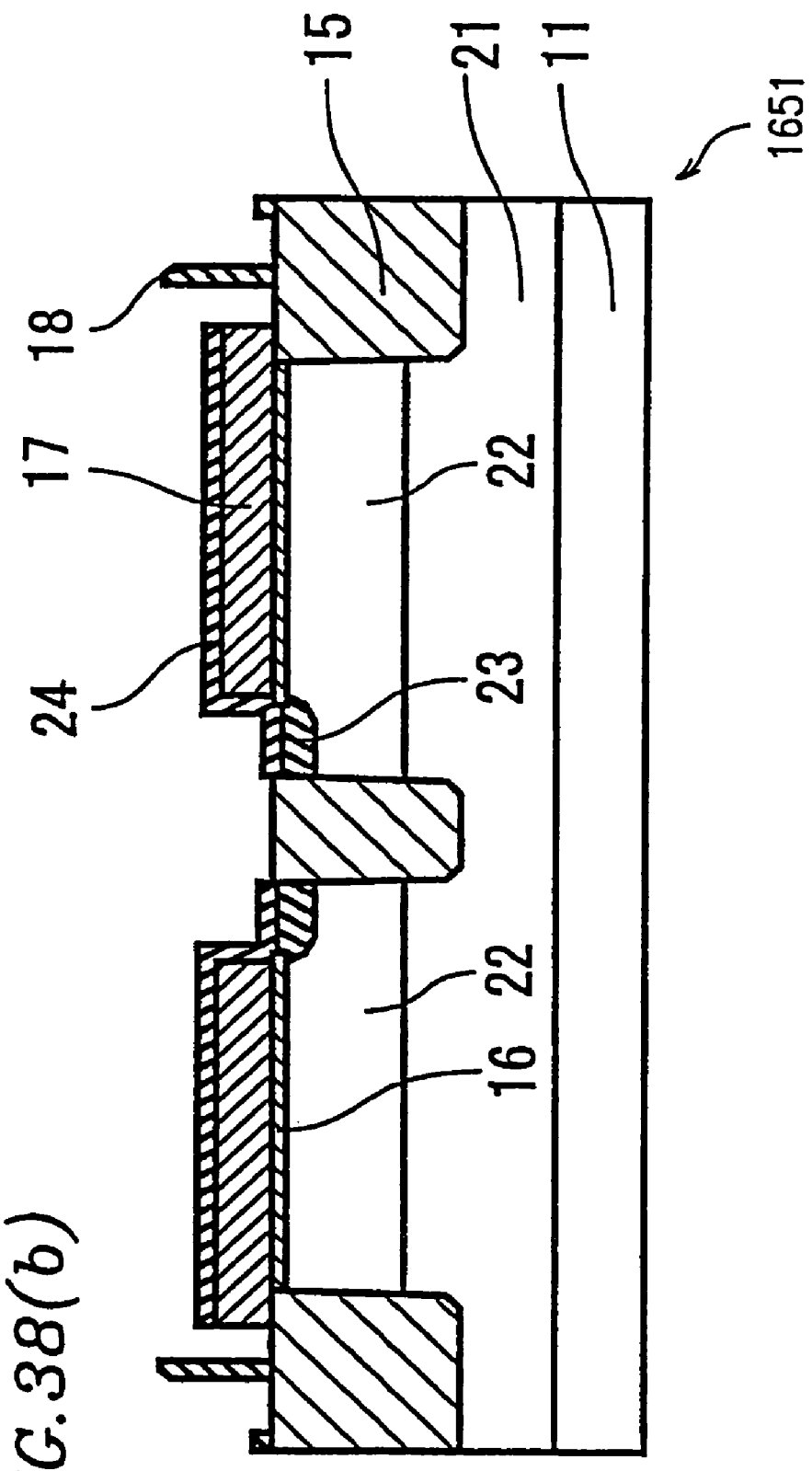

FIGS. 38(*a*) and (*b*) show a semiconductor device 1651 according to Example 10 of the present invention. FIG. 38(*a*) is a plan view of the semiconductor device 1651. FIG. 38(*b*) is a cross-sectional view of the semiconductor device 1651, taken along line C–C' shown in FIG. 38(*a*). For the sake of simplicity, FIG. 38(*a*) does not show a silicide region, an interlayer insulating film, and an upper metal conductor (contact conductor), and FIG. 38(*b*) does not show an interlayer insulating film and an upper metal conductor.

The semiconductor device 1651 of Example 10 differs from the semiconductor device 1511 of Example 8 in that a field effect transistor is a dynamic threshold transistor in which a gate electrode is electrically connected to a well region. Therefore, the semiconductor device 1651 is provided with a gate-well connection region 35. A region 23 (FIG. 38(*b*)) having a high P-type impurity concentration is provided in a shallow well region 22 within the gate-well connection region 35. The region 23 is connected to the gate electrode via the silicide region 24. The well region has a two-layer structure consisting of a deep N-type well region 21 and a shallow P-type well region 22. The shallow P-type well regions 22 are separated from each other by the isolation region 15 between each element in order to prevent a voltage change in the shallow well region 22 conducted from the gate electrode from having an influence on another device. In this case, the well region has a two-layer structure consisting of a deep well region of a first conductivity and a shallow well region of a second conductivity. Further, the shallow well regions of a second conductivity can be separated from each other by the isolation region 15 between each element. Therefore, part or all of field effect transistors function as dynamic threshold transistors in which a shallow well region is electrically connected to a gate electrode.

In the dynamic threshold transistor, only when an ON voltage is applied to the gate electrode, the potential of the well region is lowered and the substantial threshold value of the element is lowered. Therefore, a driving current can be increased without an increase in an OFF current of the element, thereby reducing a power source voltage. Therefore, power consumption can be greatly reduced.

The steps of producing the semiconductor device 1651 of this example differ from those of Example 8 in the step of forming a well region. Although the shape of the isolation region 15 is changed so that the gate-well connection region 35 can be provided, an additional step is not particularly required.

As for the well region, a deep N-type (P-type) well region 21 and a shallow P-type (N-type) well region 22 are required. When N-type and P-type elements coexist, implantations are conducted a total of four times. The isolation region 15 is designed to be deeper than a junction between the deep well region 21 and the shallow well region 22. Therefore, the shallow well regions are electrically separated from each other, thereby preventing interference between each element.

A step of providing a short circuit between the gate electrode 17 and the shallow well region 22 will be described. The isolation region 15 is not provided in a region which will be the gate-well connection region 35 (FIG. 38(*a*)). When part of a polycrystalline silicon film and a side wall of polycrystalline silicon are etched, the polycrystalline silicon film on the region which will be the gate-well connection region 35 is removed to expose a shallow well region. A region having a high impurity concentration is provided in the exposed shallow well region (this step can be conducted simultaneously with an implantation for the source and drain in an element having opposite conductivity), and a silicide step is conducted so that the region having a high impurity concentration in the shallow well region is connected to the gate electrode.

The semiconductor device 1651 has power consumption lower than that of semiconductor device 1511 of Example 8. In the production of the semiconductor device 1651, the step of forming a well region is the only additional step.

Since the semiconductor device 1651 includes a dynamic threshold transistor, power source voltage can be lowered. Therefore, the semiconductor device 1651 can have power consumption much lower than that of the semiconductor device 1511 of Example 8.

Example 11

In the production steps of the semiconductor devices of Examples 8 through 10, when part of the polycrystalline silicon film 34 and the side wall 20 of polycrystalline silicon is etched, a polycrystalline silicon residue occurs.

Figure 39:
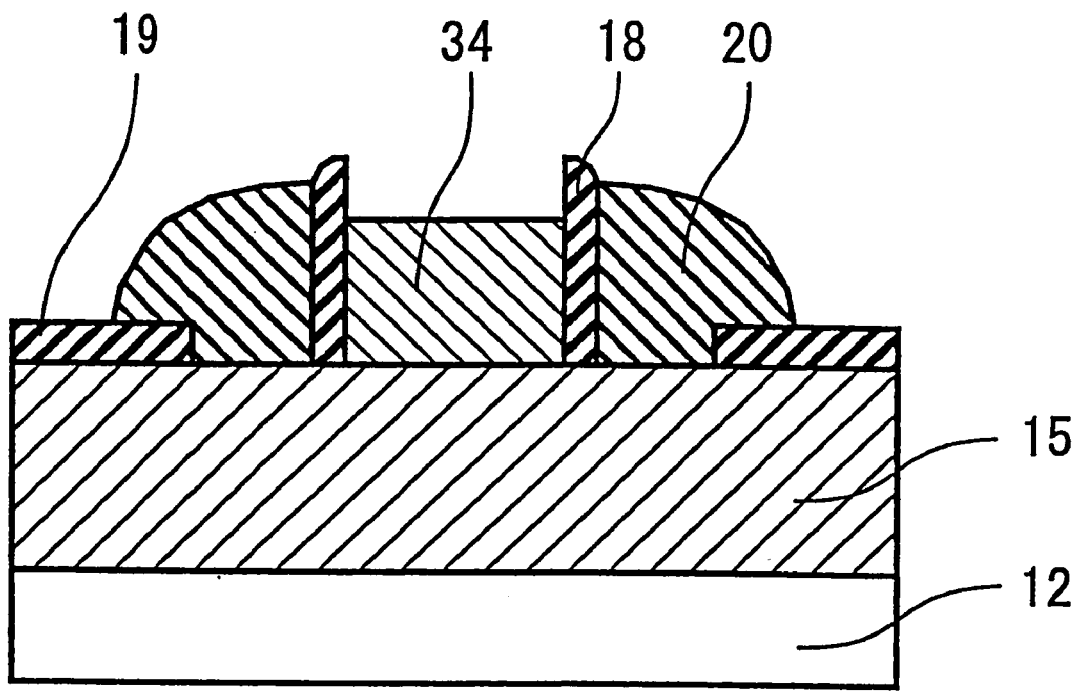
FIGS. 39(*a*) and (*b*) are diagrams showing a polycrystalline silicon residue occurring in etching a part of a polycrystalline silicon film and a side wall of polycrystalline silicon.
Figure 39:
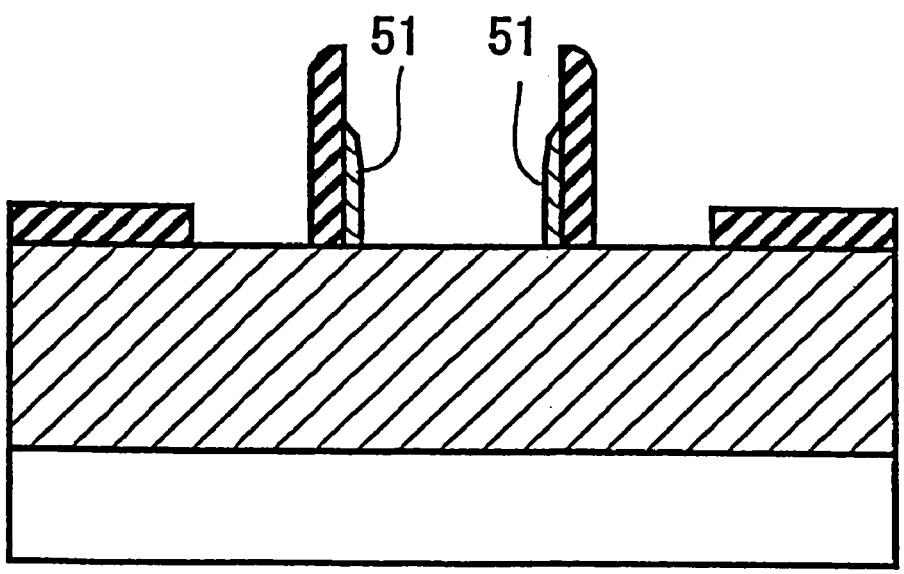

FIGS. 39(*a*) and (*b*) show the step of etching part of a polycrystalline silicon film 34 and a side wall 20 of the polycrystalline silicon. An insulting film 31 on the polycrystalline silicon film 34 is removed (FIG. 39(*a*)), and part of the polycrystalline silicon film 34 and the side wall 20 of polycrystalline silicon are etched (FIG. 39(*b*)). In this case, a polycrystalline silicon residue 51 may occur as shown in FIG. 39(*b*). The polycrystalline silicon residue 51 tends to occur at an inner side of a side wall 18 made of a silicon nitride film. If the polycrystalline silicon residue 51 occurs, a division of the polycrystalline silicon film 34 is not complete, so that a short circuit is established between gate electrodes.

To remove the polycrystalline silicon residue 51, isotropic etching for polycrystalline silicon may be conducted, starting from the state shown in FIG. 39(*b*), for example. In this case, when an isotropic etching amount is represented by S, the distance D between the separate gate electrodes is increased by 2S to be F+2S.

In this example, a method for preventing occurrence of the polycrystalline silicon residue 51 and suppressing an increase in the margin between each gate electrode will be described.

A semiconductor device according to Example 11 of the present invention will be described with reference to FIG. 40.

Figure 40:
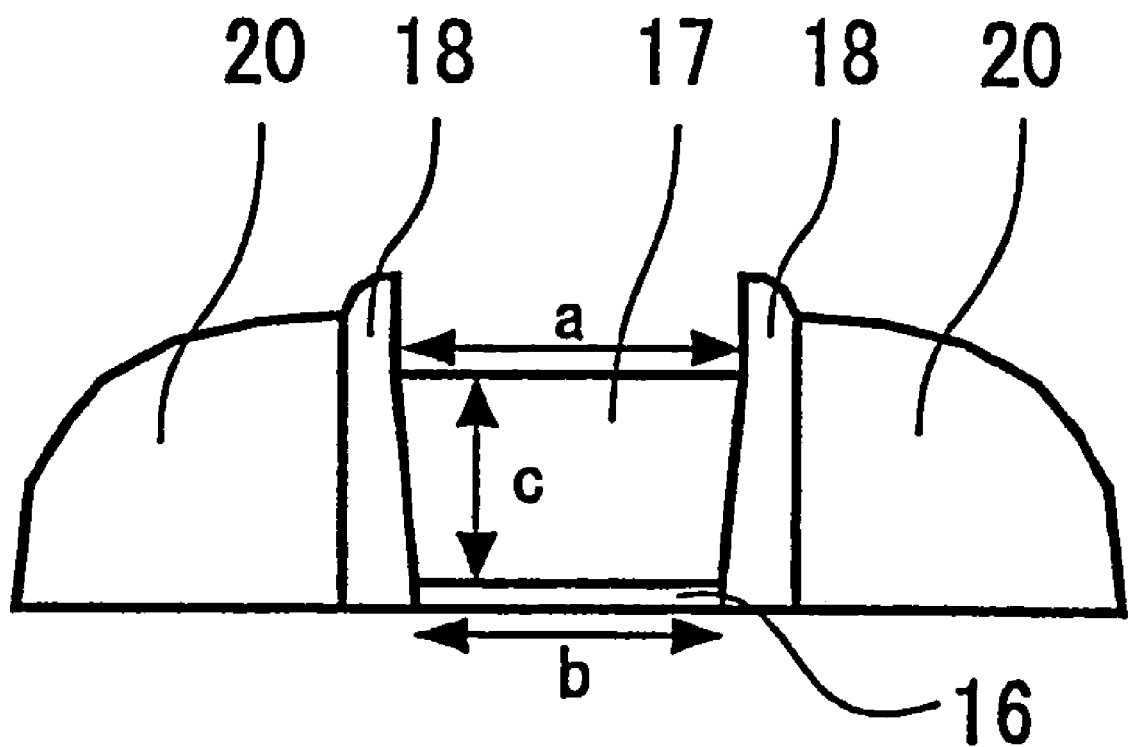
FIG. 40 is a cross-sectional view showing a gate electrode portion and a side wall portion of a semiconductor device according to Example 11 of the present invention.

FIG. 40 is a cross-sectional view showing a gate electrode portion and a side wall portion of the semiconductor device of Example 11. In this example, the shape of a gate electrode 17 is such that an upper portion thereof has a width greater than a lower portion thereof. A width of the upper portion of the gate electrode 17 is represented by a, a width of the lower portion is represented by b, and a thickness of the gate electrode 17 is represented by c. In this case, a relationship $0<(a-b)/2c<0.15$ is satisfied. For example, if $a=0.25$ μm and $c=0.20$ μm, a relationship $0.19$ μm$<b<0.25$ μm is satisfied.

When the gate electrode 17 (polycrystalline silicon film) has the above-described shape, the side wall 18 made of a silicon nitride film has a tilted side surface at the gate electrode side, whereby the side wall 18 tapers upward. Therefore, occurrence of a polycrystalline silicon residue can be suppressed in anisotropic etching for a polycrystalline silicon film. An outer side surface of the silicon nitride film side wall 18 (at the polycrystalline silicon side wall side) is vertical due to a property of anisotropic etching. Therefore, a polycrystalline silicon residue is unlikely to occur. However, if $(a-b)/2c>0.15$, the outer side surface of the silicon nitride film side wall 18 is no longer vertical, whereby the side wall 18 tapers downward. In this case, when the side wall 20 of polycrystalline silicon is etched, a polycrystalline silicon residue occurs. Therefore, $0<(a-b)/2c<0.15$ is preferable.

According to the semiconductor device of this example, when part of the polycrystalline silicon film 34 and the side wall 20 of polycrystalline silicon is etched, occurrence of a polycrystalline silicon residue can be suppressed. Therefore, the amount of isotropic etching for removing a polycrystalline silicon residue can be reduced, thereby making it possible to decrease the margin between each gate electrode. Therefore, a large-scale integrated semiconductor device can be obtained.

Example 12

In Example 12, another method for suppressing the occurrence of a polycrystalline silicon residue to avoid an increase in the margin between each gate electrode, will be described.

A semiconductor device according to Example 12 of the present invention will be described with reference to FIG. 41.

Figure 41:
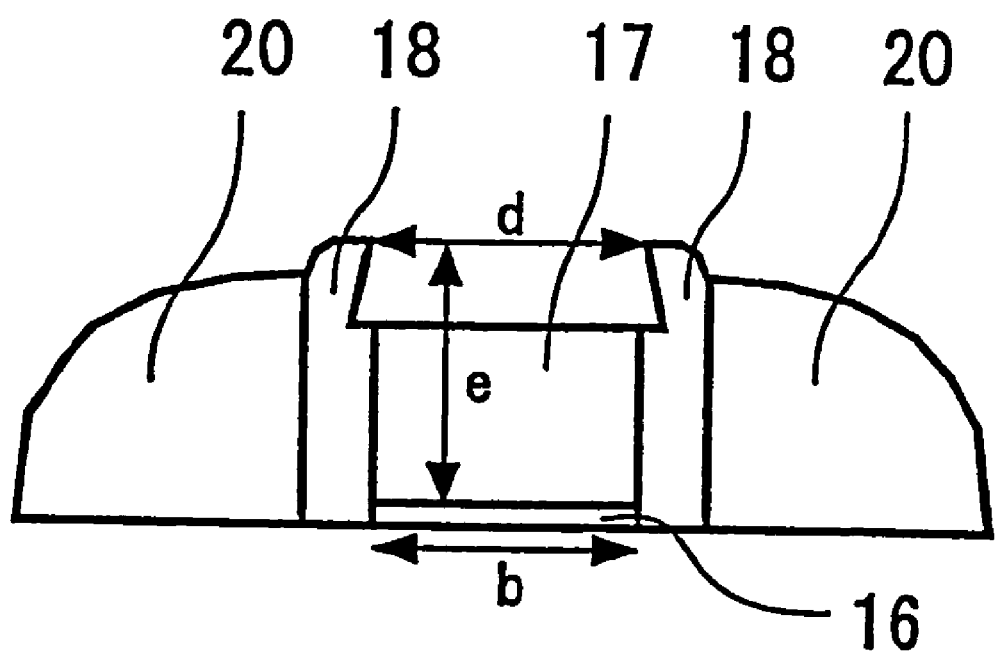
FIG. 41 is a cross-sectional view showing a gate electrode portion and a side wall portion of a semiconductor device according to Example 12 of the present invention.

FIG. 41 is a cross-sectional view showing a gate electrode portion and a side wall portion of the semiconductor device of Example 12. As shown in FIG. 41, an opening of a tip of a silicon nitride film side wall 18 has a width greater than a lower side of the gate electrode 17. A width of the opening of a tip of a silicon nitride film side wall 18 is represented by d, a width of the lower side of the gate electrode 17 is represented by b, and a height of the silicon nitride film side wall 18 is represented by e. In this case, a relationship $0<(d-b)/2e<0.15$ is satisfied. For example, if $d=0.25$ μm and $e=0.20$ μm, a relationship $0.19$ μm$<b<0.25$ μm is satisfied.

When the silicon nitride film side wall 18 has a shape as shown in FIG. 41, the opening does not interrupt ions or radicals in etching. Therefore, occurrence of a polycrystalline silicon residue can be prevented. An outer side surface of the silicon nitride film side wall 18 (at the polycrystalline silicon side wall 20 side) is vertical due to a property of anisotropic etching. Therefore, a polycrystalline silicon residue is unlikely to occur. However, if $(d-b)/2e>0.15$, the outer side surface of the silicon nitride film sidewall 18 is no longer vertical, whereby the sidewall 18 tapers downward. In this case, when the side wall 20 of polycrystalline silicon is etched, a polycrystalline silicon residue occurs. Therefore, 0<(d−2e<0.15 is preferable.

Next, the steps of producing the semiconductor device shown of FIG. 41 will be described with reference to FIGS. 42(a) through (f).

FIGS. 42(a) through (f) show the steps of producing the semiconductor device of Example 12. Note that FIGS. 42(a) through (f) are cross-sectional views of the semiconductor device of Example 12.

Figure 42:
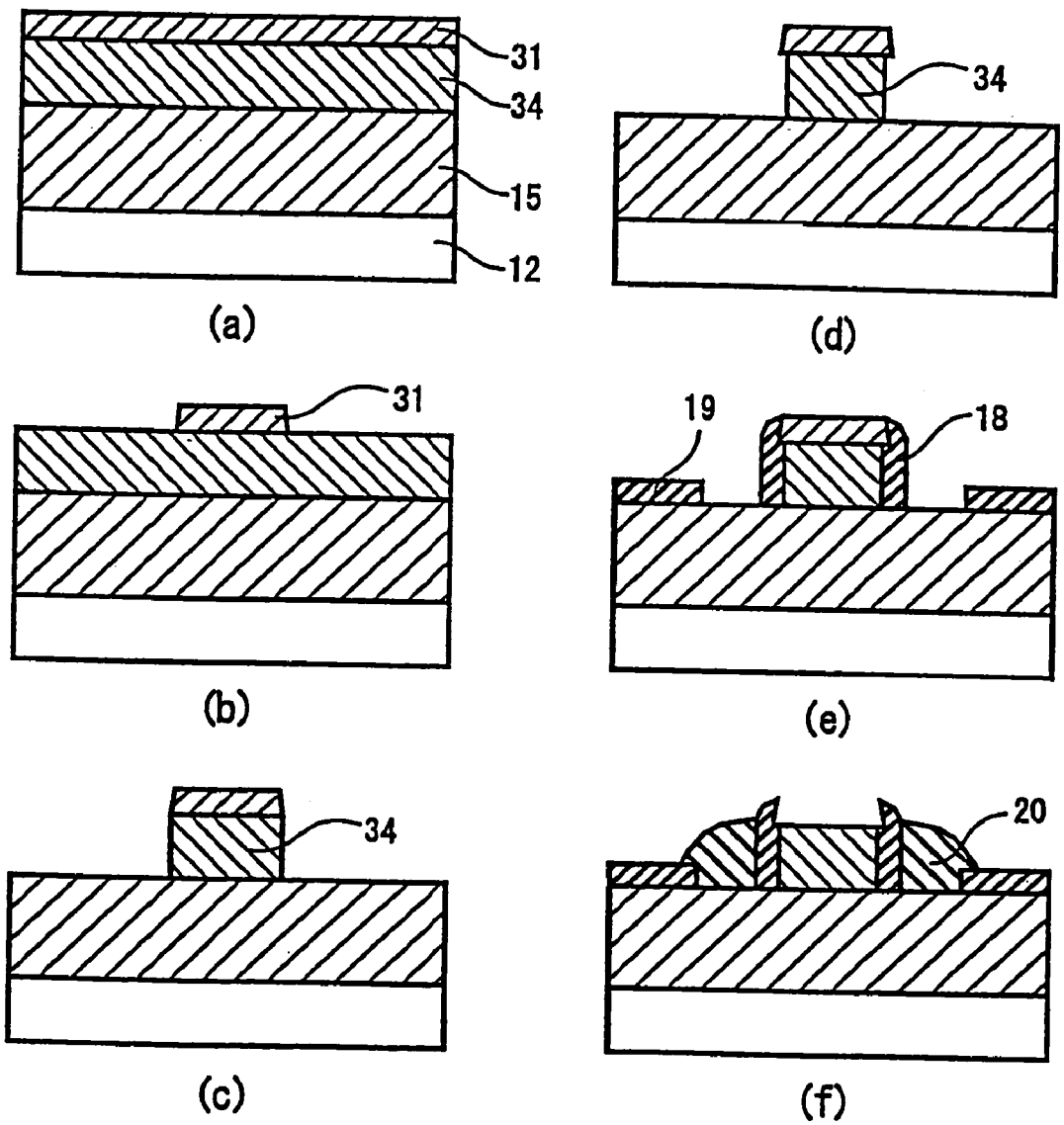
FIGS. 42(*a*) through (*f*) are diagrams showing the steps of producing a semiconductor device according to Example 12 of the present invention.

After gate oxidization, a polycrystalline silicon film 34 and an insulating film 31 are formed (FIG. 42(a)). Thereafter, part of the insulating film 31 is patterned by etching using photoresist (FIG. 42(b)). Thereafter, the insulting film 31 is used as a mask to conduct anisotropic etching in which the polycrystalline silicon film 34 is patterned (FIG. 42(c)). Thereafter, isotropic etching (or etching including a large amount of isotropic component) is conducted to reduce a width of the polycrystalline silicon film 34 (FIG. 42(d)). Thereafter, in accordance with the steps described above with reference to FIGS. 36(a) through (c), a sidewall 18 of a silicon nitride film is formed (FIG. 42(e)). Thereafter, a sidewall 20 of polycrystalline silicon is formed (FIG. 42(f)).

According to the semiconductor device of this example, when part of the polycrystalline silicon film 34 and the side wall 20 of polycrystalline silicon is etched, occurrence of a polycrystalline silicon residue can be suppressed. Therefore, the amount of isotropic etching for removing a polycrystalline silicon residue can be reduced, thereby making it possible to decrease the margin between each gate electrode. Therefore, a large-scale integrated semiconductor device can be obtained.

Example 13

In accordance with the principle of the present invention, a W-CDMA (wide-band CDMA) device was produced under F=0.18 μm rule. To achieve low power consumption and a high driving force, a DT-MOS (Dynamic Threshold-MOS) transistor (FIG. 25), in which a short circuit is established between a semiconductor substrate (well region) and a gate electrode, was used to produce a W-CDMA circuit. An operating voltage was 0.5 V inside the circuit and 3.3 V at an I/O portion. This circuit was compared with another W-CDMA circuit produced using a MOS device having a conventional structure under a 0.18 μm rule (an operating voltage was 1.8 V inside the circuit). The circuit produced in accordance with the principle of the present invention consumed about 1/52 of the power consumption of the conventional circuit. The operating speed was the same. The matched filter solely had 3/234 of the power consumption. A W-CDMA chip including a device of the present invention, a memory (FLASH, SRAM, DRAM, ROM, or the like), a liquid crystal panel having a liquid crystal driver including a device of the present invention as a display device, and a communication device including a device of the present invention were combined to achieve a power-saving cellular phone (information processing device). This power-saving cellular phone was compared with another cellular phone including a MOS device having a conventional structure under the 0.18 μm rule (an operating voltage was 1.8 V inside the circuit). The battery in the cellular phone of the present invention lasted about ten times longer than the conventional cellular phone.

The features of the above-described examples may be combined, which is within the scope of the present invention.

INDUSTRIAL APPLICABILITY

In the semiconductor device according to the present invention and the semiconductor device produced by the method for producing a semiconductor device according to the present invention: the source region comprises the first source region above the first surface where the active region contacts the gate oxide film and the second source region below the first surface; the drain region comprises the first drain region above the first surface and the second drain region below the first surface; and at least one of the source region and the drain region has the second surface which contacts the contact conductor, and the second surface is tilted with respect to the first surface. Further, the angle between the second surface and the surface of the isolation region is 80 degrees or less. Therefore, the occupied area of the source/drain region is reduced, thereby reducing the parasitic capacitance and the parasitic resistance of the source/drain region. Further, the yield of the contact connecting the source/drain region with the upper conductor is improved.

In the present invention, the surface area of the source/drain region can be increased as compared with the occupied area of the source/drain region on the active region. Therefore, the contact area of the contact region where the source/drain region contacts the upper conductor (contact conductor) is increased, thereby reducing the contact resistance.

The junction depth of the source/drain region is determined not by ion implantation but by solid phase diffusion. Therefore, a considerably shallow junction can be obtained, thereby making it possible to suppress a short channel effect of a transistor.

Further, the distance between the channel region and the contact hole is significantly short, so that the length of the high-resistance impurity diffusion layer region through which a current flows is considerably short, resulting in a considerably small parasitic resistance.

Further, the impurity diffusion layer region has a concentration of $1 \times 10^{20}/cm^3$ or higher up to the vicinity of the channel, so that the resistance of the impurity diffusion layer region is considerably low, resulting in a further reduction in the parasitic resistance. Therefore, the driving current of a transistor is increased.

Further, the occupied area of a device, particularly the occupied area of the source/drain region, can be reduced without changing the size of a contact, so that the junction area between the source/drain region and the semiconductor substrate (in a typical CMOS, for example, the well region of a conductivity opposite to the conductivity of the source/drain region) can be reduced without sacrificing the contact resistance. Therefore, the junction capacitance is effectively reduced. A reduction in occupied area, a reduction in parasitic capacitance (junction capacitance), and a reduction in parasitic resistance can be achieved without sacrificing the contact resistance, thereby obtaining a considerably large transconductance. Further, capacitance is reduced, thereby improving the speed of a circuit including the semiconductor device of the present invention.

In the present invention, the proportion of a high resistance region occupying the passage of current is considerably small. As compared with a typical semiconductor device, the parasitic resistance of the source/drain region is reduced. Further, a current path is broader from the source/drain region in the vicinity of the channel region toward the contact, resulting in a considerably small parasitic resistance. These effects lead to an enhancement in the current driving performance of a device, thereby improving a transconductance.

The invention claimed is:

1. A semiconductor device comprising a semiconductor substrate and a plurality of field effect transistors provided on the semiconductor substrate, wherein:
   each of the plurality of field effect transistors comprises:
      a gate electrode provided on the semiconductor substrate;
      a gate electrode side wall insulating film provided at a side of the gate electrode; and
      a conductive film to be a source region or a drain region, provided at a side of the gate electrode via the gate electrode side wall insulating film; wherein
   the gate electrode of each of the plurality of field effect transistors is produced by the step of dividing a first non-insulating film into a plurality of regions;
   the conductive film of each of the plurality of field effect transistors is produced by the step of dividing a second non-insulating film into a plurality of regions; and
   in a region extending from the gate electrode of each of the plurality of field effect transistors to the respective gate electrode of a neighboring field effect transistor the gate electrode side wall insulating film is not formed.

2. An information processing apparatus comprising a display device and an operation device for controlling the display device, the apparatus being able to be driven by a battery, wherein the operation device comprises a circuit including a semiconductor device according to claim 1.

3. A semiconductor device comprising a semiconductor substrate and a plurality of field effect transistors provided on the semiconductor substrate, wherein:
   each of the plurality of field effect transistors comprises:
      a well region provided on the semiconductor substrate;
      a gate electrode provided on the well region via a gate insulating film;
      a gate electrode side wall insulating film provided at a side of the gate electrode; and
      a conductive film to be a source region or a drain region, provided at a side of the gate electrode via the gate electrode side wall insulating film; wherein
   the gate electrode of each of the plurality of field effect transistors is produced by the step of dividing a first non-insulating film into a plurality of regions; and
   the conductive film of each of the plurality of field effect transistors is produced by the step of dividing a second non-insulating film into a plurality of regions;
   in a region extending from the gate electrode of each of the plurality of field effect transistors to the respective gate electrode of a neighboring field effect transistor the gate electrode side wall insulating film is not formed.

4. A semiconductor device according to claim 3, wherein:
   at least one of the plurality of field effect transistors further comprises a terminal provided on the well region for setting the potential of the well region;
   the semiconductor device further comprises a voltage generation circuit connected to the terminal; and
   the voltage generator circuit changes the potential of the well region depending on whether the at least one of the plurality of field effect transistors is in an active state or a standby state.

5. A semiconductor device comprising a semiconductor substrate and a plurality of field effect transistors provided on the semiconductor substrate, wherein:
   each of the plurality of field effect transistors comprises:
      an isolation region;
      a deep well region of a first conductivity;
      a shallow well region of a second conductivity provided in the deep well region, the second conductivity being opposite to the first conductivity;
      a gate electrode provided on the shallow well region via a gate insulating film;
      a gate electrode side wall insulating film provided at a side of the gate electrode; and
      a conductive film to be a source region or a drain region, provided at a side of the gate electrode via the gate electrode side wall insulating film; wherein
   the gate electrode of each of the plurality of field effect transistors is produced by the step of dividing a first non-insulating film into a plurality of regions;
   the conductive film of each of the plurality of field effect transistors is produced by the step of dividing a second non-insulating film into a plurality of regions;
   at least one of the plurality of field effect transistors is a dynamic threshold transistor in which the shallow well region of the second conductivity is electrically connected to the gate electrode;
   the shallow well region of the dynamic threshold transistor is electrically isolated from the shallow well regions of the other field effect transistors via the isolation region and the deep well region; and
   in a region extending from the gate electrode of each of the plurality of field effect transistors to the respective gate electrode of a neighboring field effect transistor the gate electrode side wall insulating film is not formed.

6. A method for producing a semiconductor device, comprising the steps of:
   forming a first non-insulating film pattern by patterning a first non-insulating film to a desired pattern on a semiconductor substrate;
   forming a side wall insulting film at a side of the first non-insulting film pattern;
   depositing a second non-insulating film;
   forming a side wall consisting of the second non-insulating film at a side of the first non-insulting film via the side wall insulating film by an isotropic etching until the second non-insulating film is removed from an upper portion of the first non-insulating film pattern; and
   forming a layer to be a gate electrode, a layer to be a source region, and a layer to be a drain region by patterning the first non-insulating film pattern and the side wall by selectively etching with respect to the side wall insulating film,
wherein in a region extending from the gate electrode of each of the plurality of field effect transistors to the respective gate electrode of a neighboring field effect transistor the gate electrode side wall insulating film is not formed.

7. A method according to claim 6, further comprising the step of simultaneously implanting a donor or an acceptor into the layer to be a gate electrode, the layer to be a source region, and the layer to be a drain region.

8. A method according to claim 6, wherein the selective etching with respect to the side wall insulating film is an anisotropic etching including an isotropic component.

9. A method according to claim 6, wherein in the selective etching with respect to the side wall insulating film, an isotropic etching is conducted after an anisotropic etching.

10. A method according to claim 6, wherein a diffusion coefficient of at least one of the layer to be a source region and the layer to be a drain region is greater than a diffusion coefficient of the semiconductor substrate.

11. A method for producing a semiconductor device, comprising the steps of:
- attaching a first insulating film on a first non-insulating film provided on a semiconductor substrate;
- forming a first non-insulating film pattern and a first insulating film pattern by patterning a first non-insulating film and the first insulating film to a desired pattern;
- forming a side wall insulting film at a side of the first insulting film pattern;
- depositing a second non-insulating film;
- forming a side wall consisting of the second non-insulating film at the sides of the first non-insulting film pattern and the first insulating film pattern by an isotropic etching until the second non-insulating film is removed from an upper portion of the first insulating film pattern;
- exposing a surface of the first non-insulating film pattern by selectively removing the first insulting film pattern;
- forming a layer to be a gate electrode, a layer to be a source region, and a layer to be a drain region by patterning the first non-insulating film pattern and the side wall by selectively etching with respect to the side wall insulating films, wherein in a region extending from the gate electrode of each of the plurality of field effect transistors to the respective gate electrode of a neighboring field effect transistor the gate electrode side wall insulating film is not formed.

12. A method according to claim 11, further comprising the step of simultaneously implanting a donor or an acceptor into the layer to be a gate electrode, the layer to be a source region, and the layer to be a drain region.

13. A method according to claim 11, wherein the selective etching with respect to the side wall insulating film is an anisotropic etching including an isotropic component.

14. A method according to claim 11, wherein in the selective etching with respect to the side wall insulating film, an isotropic etching is conducted after an anisotropic etching.

15. A method according to claim 11, wherein a diffusion coefficient of at least one of the layer to be a source region and the layer to be a drain region is greater than a diffusion coefficient of the semiconductor substrate.

* * * * *